US 11,985,806 B2

(12) United States Patent
Karda et al.

(10) Patent No.: US 11,985,806 B2
(45) Date of Patent: *May 14, 2024

(54) VERTICAL 2-TRANSISTOR MEMORY CELL

(71) Applicant: Micron Technology, Inc., Boise, ID (US)

(72) Inventors: Kamal M. Karda, Boise, ID (US); Srinivas Pulugurtha, Boise, ID (US); Haitao Liu, Boise, ID (US); Karthik Sarpatwari, Boise, ID (US); Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 176 days.

This patent is subject to a terminal disclaimer.

(21) Appl. No.: 16/721,380

(22) Filed: Dec. 19, 2019

(65) Prior Publication Data

US 2020/0212045 A1    Jul. 2, 2020

Related U.S. Application Data

(60) Provisional application No. 62/785,119, filed on Dec. 26, 2018.

(51) Int. Cl.
*H01L 27/108* (2006.01)
*H10B 12/00* (2023.01)
*G11C 11/402* (2006.01)

(52) U.S. Cl.
CPC .......... *H10B 12/01* (2023.02); *G11C 11/4023* (2013.01)

(58) Field of Classification Search
None
See application file for complete search history.

(56) References Cited

U.S. PATENT DOCUMENTS 6,396,745 B1    5/2002  Hong et al.
10,892,264 B2 *  1/2021  Pulugurtha ............ H10B 12/00
    (Continued)

FOREIGN PATENT DOCUMENTS

CN    113272957    8/2021
WO    2020139710   7/2020

OTHER PUBLICATIONS

"International Application Serial No. PCT US2019 067554, International Preliminary Report on Patentability dated Jul. 8, 2021", 9 pgs.

(Continued)

*Primary Examiner* — Hrayr A Sayadian
(74) *Attorney, Agent, or Firm* — Schwegman Lundberg & Woessner, P.A.

(57) ABSTRACT

Some embodiments include apparatuses and methods of forming the apparatus. One of the apparatuses and methods includes a memory cell having a first transistor and a second transistor located over a substrate. The first transistor includes a channel region. The second transistor includes a channel region located over the channel region of the first transistor and electrically separated from the first channel region. The memory cell includes a memory element located on at least one side of the channel region of the first transistor. The memory element is electrically separated from the channel region of the first transistor, and electrically coupled to the channel of the second transistor.

35 Claims, 38 Drawing Sheets

(56) References Cited

U.S. PATENT DOCUMENTS

2010/0066440 A1  3/2010  Juengling
2012/0153371 A1  6/2012  Chen et al.
2016/0260775 A1  9/2016  Takaki
2017/0141230 A1  5/2017  Ikeda et al.

OTHER PUBLICATIONS

"International Application Serial No. PCT US2019 067554, International Search Report dated Apr. 21, 2020", 3 pgs.
"International Application Serial No. PCT US2019 067554, Written Opinion dated Apr. 21, 2020", 7 pgs.

* cited by examiner

VERTICAL 2-TRANSISTOR MEMORY CELL

PRIORITY APPLICATION

This application claims the benefit of priority to U.S. Provisional Application Ser. No. 62/785,119, filed Dec. 26, 2018, which is incorporated herein by reference in its entirety.

BACKGROUND

Memory devices are widely used in computers and many other electronic items to store information. Memory devices are generally categorized into two types: volatile memory device and non-volatile memory device. An example of a volatile memory device includes a dynamic random-access memory (DRAM) device. An example of a non-volatile memory device includes a flash memory device (e.g., a flash memory stick). A memory device usually has numerous memory cells to store information. In a volatile memory device, information stored in the memory cells is lost if supply power is disconnected from the memory device. In a non-volatile memory device, information stored in the memory cells is retained even if supply power is disconnected from the memory device.

The description herein involves volatile memory devices. Most conventional volatile memory devices store information in the form of charge in a capacitor structure included in the memory cell. As demand for device storage density increases, many conventional techniques provide ways to shrink the size of the memory cell in order to increase device storage density for a given device area. However, physical limitations and fabrication constraints may pose a challenge to such conventional techniques if the memory cell size is to be shrunk to a certain dimension. Unlike some conventional memory devices, the memory devices described herein include features that can overcome challenges faced by conventional techniques.

DETAILED DESCRIPTION

The memory device described herein includes volatile memory cells in which each of the memory cells can include two transistors (2T memory cell). One of the two transistors has a charge storage structure, which can form a memory element of the memory cell to store information. The memory device described herein can have a structure (e.g., a 4F2 cell footprint) that allows the size of the memory device to be relatively smaller than the size of similar conventional memory devices. Other improvements and benefits of the described memory device and its variation is discussed below with reference to FIG. 1 through FIG. 35.

Figure 1:
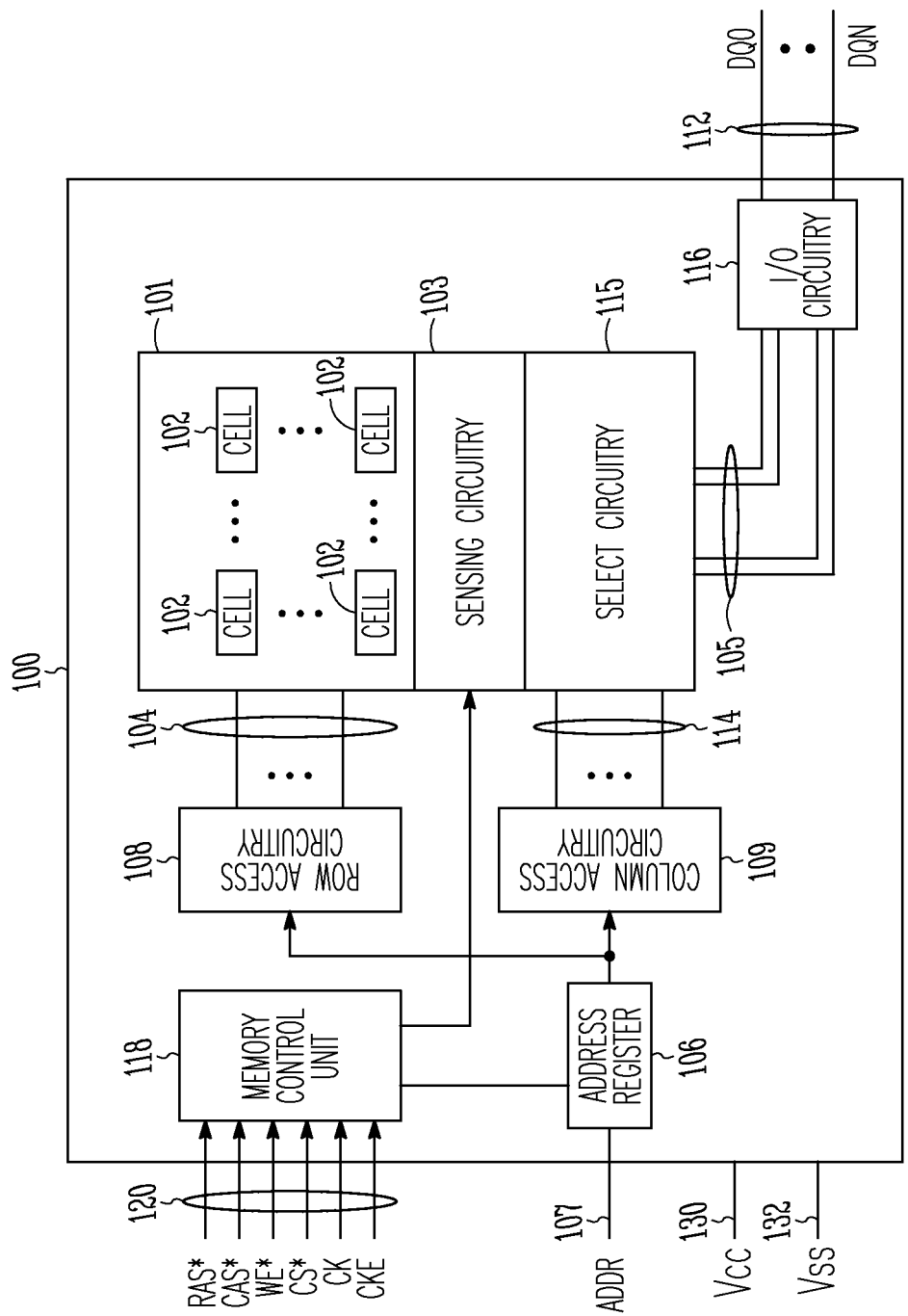
FIG. 1 shows a block diagram of an apparatus in the form of a memory device including volatile memory cells, according to some embodiments described herein.

FIG. 1 shows a block diagram of an apparatus in the form of a memory device 100 including volatile memory cells, according to some embodiments described herein. Memory device 100 includes a memory array 101, which can contain memory cells 102. Memory device 100 is volatile memory device (e.g., a DRAM device), such that memory cells 102 are volatile memory cells. Thus, information stored in memory cells 102 may be lost (e.g., invalid) if supply power (e.g., supply voltage Vcc) is disconnected from memory device 100. Hereinafter, Vcc is referred to represent some voltage levels, however, they are not limited to a supply voltage (e.g., Vcc) of the memory device (e.g., memory device 100). For example, if the memory device (e.g., memory device 100) has an internal voltage generator (not shown in FIG. 1) that generates an internal voltage based on Vcc, such an internal voltage may be used instead of Vcc.

In a physical structure of memory device 100, each of memory cells 102 can include transistors (e.g., two transistors) formed vertically (e.g., stacked over each other in different layers) in different levels over a substrate (e.g., semiconductor substrate) of memory device 100. The structure of memory array 101 including memory cells 102 can include the structure of memory arrays and memory cells described below with reference to FIG. 2 through FIG. 35.

As shown in FIG. 1, memory device 100 can include access lines 104 (e.g., "word lines") and data lines (e.g., bit lines) 105. Memory device 100 can use signals (e.g., word line signals) on access lines 104 to access memory cells 102 and data lines 105 to provide information (e.g., data) to be stored in (e.g., written) or read (e.g., sensed) from memory cells 102.

Memory device 100 can include an address register 106 to receive address information ADDR (e.g., row address signals and column address signals) on lines (e.g., address lines) 107. Memory device 100 can include row access circuitry (e.g., X-decoder) 108 and column access circuitry (e.g., Y-decoder) 109 that can operate to decode address information ADDR from address register 106. Based on decoded address information, memory device 100 can determine which memory cells 102 are to be accessed during a memory operation. Memory device 100 can perform a write operation to store information in memory cells 102, and a read operation to read (e.g., sense) information (e.g., previously stored information) in memory cells 102. Memory device 100 can also perform an operation (e.g., a refresh operation) to refresh (e.g., to keep valid) the value of information stored in memory cells 102. Each of memory cells 102 can be configured to store information that can represent at most one bit (e.g., a single bit having a binary 0 ("0") or a binary 1 ("1"), or more than one bit (e.g., multiple bits having a combination of at least two binary bits).

Memory device 100 can receive a supply voltage, including supply voltages Vcc and Vss, on lines 130 and 132, respectively. Supply voltage Vss can operate at a ground potential (e.g., having a value of approximately zero volts). Supply voltage Vcc can include an external voltage supplied to memory device 100 from an external power source such as a battery or an alternating current to direct current (AC-DC) converter circuitry.

As shown in FIG. 1, memory device 100 can include a memory control unit 118, which includes circuitry (e.g., hardware components), to control memory operations (e.g., read and write operations) of memory device 100 based on control signals on lines (e.g., control lines) 120. Examples of signals on lines 120 include a row access strobe signal RAS*, a column access strobe signal CAS*, a write-enable signal WE*, a chip select signal CS*, a clock signal CK, and a clock-enable signal CKE. These signals can be part of signals provided to a DRAM device.

As shown in FIG. 1, memory device 100 can include lines (e.g., global data lines) 112 that can carry signals DQ0 through DQN. In a read operation, the value (e.g., "0" or "1") of information (read from memory cells 102) provided to lines 112 (in the form signals DQ0 through DQN) can be based on the values of the signals on data lines 105. In a write operation, the value (e.g., "0" or "1") of the information provided to data lines 105 (to be stored in memory cells 102) can be based on the values of signals DQ0 through DQN on lines 112.

Memory device 100 can include sensing circuitry 103, select circuitry 115, and input/output (I/O) circuitry 116. Column access circuitry 109 can selectively activate signals on lines (e.g., select lines) based on address signals ADDR. Select circuitry 115 can respond to the signals on lines 114 to select signals on data lines 105. The signals on data lines 105 can represent the values of information to be stored in memory cells 102 (e.g., during a write operation) or the values of information read (e.g., sensed) from memory cells 102 (e.g., during a read operation).

I/O circuitry 116 can operate to provide information read from memory cells 102 to lines 112 (e.g., during a read operation) and to provide information from lines 112 (e.g., provided by an external device) to data lines 105 to be stored in memory cells 102 (e.g., during a write operation). Lines 112 can include nodes within memory device 100 or pins (or solder balls) on a package where memory device 100 can reside. Other devices external to memory device 100 (e.g., a hardware memory controller or a hardware processor) can communicate with memory device 100 through lines 107, 112, and 120.

Memory device 100 may include other components, which are not shown to help focus on the embodiments described herein. Memory device 100 can be configured to include at least a portion of the memory device with associated structures and operations described below with reference to FIG. 2 through FIG. 35.

One of ordinary skill in the art may recognize that memory device 100 may include other components, several of which are not shown in FIG. 1 so as not to obscure the example embodiments described herein. At least a portion of memory device 100 (e.g., a portion of memory array 101) can include structures and operations similar to or identical to any of the memory devices described below with reference to FIG. 35.

Figure 2:
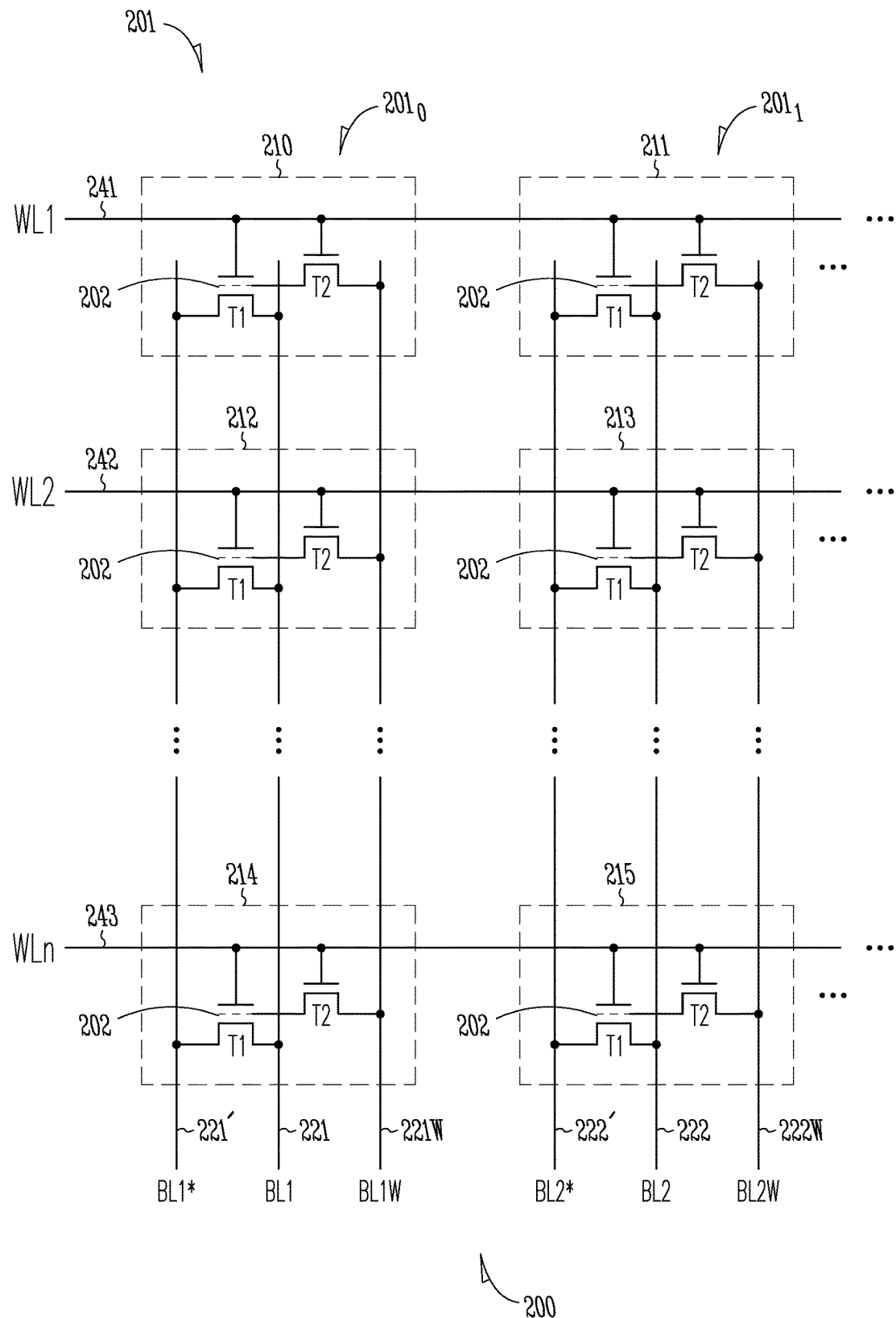
FIG. 2 shows a schematic diagram of a portion of a memory device including a memory array of 2-transistors (2T) memory cells, according to some embodiments described herein.

FIG. 2 shows a schematic diagram of a portion of a memory device 200 including a memory array 201, according to some embodiments described herein. Memory device 200 can correspond to memory device 100 of FIG. 1. For example, memory array 201 can form part of memory array 101 of FIG. 1. As shown in FIG. 2, memory device 200 can include memory cells 210 through 215, which are volatile memory cells (e.g., DRAM cells). For simplicity, similar or identical elements among memory cells 210 through 215 are given the same labels.

Each of memory cells 210 through 215 can include two transistors T1 and T2. Thus, each of memory cells 210 through 215 can be called a 2T memory cell (e.g. 2T gain cell). Each of transistors T1 and T2 can include a field-effect transistor (FET). Transistor T1 can include a charge-storage based structure (e.g., a floating-gate based). As shown in FIG. 2, each of memory cells 210 through 215 can include a charge storage structure 202, which can include the floating gate (e.g., floating gate 202) of transistor T1. Charge storage structure 202 can form the memory element of a respective memory cell among memory cells 210 through 215. Charge storage structure 202 can store charge. The value (e.g., "0" or "1") of information stored in a particular memory cell among memory cells 210 through 215 can be based on the amount of charge in charge storage structure 202 of that particular memory cell.

As shown in FIG. 2, transistor T2 (e.g., the channel region of transistor T2) of a particular memory cell among memory cells 210 through 215 can be electrically coupled to (e.g., directly coupled to) charge storage structure 202 of that particular memory cell. Thus, a circuit path (e.g., current path) can be formed directly between transistor T2 of a particular memory cell and charge storage structure 202 of that particular memory cell during an operation (e.g., a write operation) of memory device 200.

Memory cells 210 through 215 can be arranged in memory cell groups $201_0$ and $201_1$. FIG. 2 shows two memory cell groups (e.g., $201_0$ and $201_1$) as an example. However, memory device 200 can include more than two memory cell groups. Memory cell groups $201_0$ and $201_1$ can include the same number of memory cells. For example, memory cell group $201_0$ can include memory cells 210, 212, and 214, and memory cell group $201_1$ can include memory cells 211, 213, and 215. FIG. 2 shows three memory cells in each of memory cell groups $201_0$ and $201_1$ as an example. The number of memory cells in memory cell groups $201_0$ and $201_1$ can be different from three.

Memory device 200 can perform a write operation to store information in memory cells 210 through 215, and a read operation to read (e.g., sense) information from memory cells 210 through 215. Memory device 200 can be figured to operate as a DRAM device. However, unlike some conventional DRAM devices that store information in a structure such as a container for a capacitor, memory device 200 can store information in the form of charge in charge storage structure 202 (which can be a floating gate structure). As mentioned above, charge storage structure 202 can be the floating gate (e.g., floating gate 202) of transistor T1. Thus, memory device 200 can be called a floating-gate based DRAM device.

As shown in FIG. 2, memory device 200 can include access lines (e.g., word lines) 241, 242, and 243 that can carry respective signals (e.g., word line signals) WL1, WL2, and WL3. Access lines 241, 242, and 243 can be used to access both memory cell groups $201_0$ and $201_1$. Each of access lines 241, 242, and 243 can be structured as at least one conductive line (one conductive or multiple conductive lines that can be electrically coupled (e.g., shorted) to each other). Access lines 241, 242, and 243 can be selectively activated (e.g., activated one at a time) during an operation (e.g., read or write operation) of memory device 200 to access a selected memory cell (or selected memory cells) among memory cells 210 through 215. A selected cell can be referred to as a target cell. In a read operation, information can be read from a selected memory cell (or selected memory cells). In a write operation, information can be stored information in a selected memory cell (or selected memory cells).

In memory device 200, a single access line (e.g., a single word line) can be used to control (e.g., turn on or turn off) transistors T1 and T2 of a respective memory cell during either a read or write operation of memory device 200. Two separate access lines can be used to control respective transistors T1 and T2 during an access to a respective memory cell during read and write operations. However, using a single access line (e.g., shared access line) in memory device 200 to control both transistors T1 and T2 of a respective memory cell can save space and simplify operation of memory device 200.

In memory device 200, the gate of each of transistors T1 and T2 can be part of a respective access line (e.g., a respective word line). As shown in FIG. 2, the gate of each of transistors T1 and T2 of memory cell 210 can be part of access line 241. The gate of each of transistors T1 and T2 of memory cell 211 can be part of access line 241.

The gate of each of transistors T1 and T2 of memory cell 212 can be part of access line 242. The gate of each of transistors T1 and T2 of memory cells 213 can be part of access line 242.

The gate of each of transistors T1 and T2 of memory cell 214 can be part of access line 243. The gate of each of transistors T1 and T2 of memory cell 215 can be part of access line 243.

Memory device 200 can include data lines (e.g., read bit lines) 221, 221', 221, 222, and 222' that can carry respective signals (e.g., read bit line signals) BL1, BL1*, BL2, and BL2*, and data lines (e.g., write bit lines) 221W and 222W that can carry respective signals (e.g., write bit line signals) BL1W and BL2W. Each of data lines 221, 221', 222, 222', 221W, and 222W can structured as a conductive line. During a read operation, memory device 200 can use data lines 221 and 221' to obtain information read (e.g., sense) from a selected memory cell of memory cell group $201_0$, and data lines 222 and 222' to read information from a selected memory cell of memory cell group $201_1$. During a write operation, memory device 200 can use data line 221W to provide information to be stored in a selected memory cell of memory cell group $201_0$, and data line 222W to provide information to be stored in a selected memory cell of memory cell group $201_1$.

Memory device 200 can include read paths (e.g., circuit paths). Information read from a selected memory cell during a read operation can be obtained through a read path coupled to the selected memory cell. In memory cell group $201_0$, a read path of a particular memory cell (e.g., 210, 212, or 214) can include a current path (e.g., read current path) through a channel region of transistor T1 of that particular memory cell and data lines 221 and 221'. In memory cell group $201_1$, a read path of a particular memory cell (e.g., 221, 213, or 215) can include a current path (e.g., read current path) through a channel region of transistor T1 of that particular memory cell and data lines 222 and 222'. Since transistor T1 can be used in a read path to read information from the respective memory cell during a read operation, transistor T1 can be called a read transistor and the channel region of transistor T1 can be called a read channel region.

Memory device 200 can include write paths (e.g., circuit paths). Information to be stored in a selected memory cell during a write operation can be provided to the selected memory cell through a write path coupled to the selected memory cell. In memory cell group $201_0$, a write path of a particular memory cell can include a current path (e.g., write current path) through a channel region of transistor T2 of that particular memory cell and data line 221W. In memory cell group $201_1$, a write path of a particular memory cell (e.g., 221, 213, or 215) can include a current path (e.g., a write current path) through a channel region of transistor T2 of that particular memory cell and data line 222W. Since transistor T2 can be used in a write path to store information in a respective memory cell during a write operation, transistor T2 can be called a write transistor and the channel region of transistor T1 can be called a write channel region.

Each of transistors T1 and T2 can have a threshold voltage (Vt). Transistor T1 has a threshold voltage Vt1. Transistor T2 has a threshold voltage Vt2. The values of threshold voltages Vt1 and Vt2 can be different (unequal values). For example, the value of threshold voltage Vt2 can be greater than the value of threshold voltage Vt1. The difference in values of threshold voltages Vt1 and Vt2 allows reading (e.g., sensing) of information stored in charge storage structure 202 in transistor T1 on the read path without affecting (e.g., without turning on) transistor T2 on the write path (e.g., path through transistor T2). This can prevent leaking of charge from charge storage structure 202 through transistor T2 of the write path.

In a structure of memory device 200, transistors T1 and T2 can be formed (e.g., engineered) such that threshold voltage Vt1 of transistor T1 can be less than zero volts (e.g., Vt1<0V) regardless of the value (e.g., "0" or "1") of information stored charge storage structure 202 of transistor T1, and Vt1<Vt2. Charge storage structure 202 can be in state "0" when information having a value of "0" is stored in charge storage structure 202. Charge storage structure 202 can be in state "1" when information having a value of "1" is stored in charge storage structure 202. Thus, in this structure, the relationship between the values of threshold voltages Vt1 and Vt2 can be express as follows. Vt1 for state "0"<Vt1 for state "1"<0V, and Vt2=0V (or alternatively Vt2>0V).

In an alternative structure of memory device 200, transistors T1 and T2 can be formed (e.g., engineered) such that Vt1 for state "0"<Vt1 for state "1", where Vt1 for state "0"<0V (or alternatively Vt1 for state "0"=0V), Vt1 for state "1">0V, and Vt1<Vt2.

In another alternative structure, transistors T1 and T2 can be formed (e.g., engineered) such that Vt1 (for state "0") <Vt1 (for state "1"), where Vt1 for state "0"=0V (or alternatively Vt1 for state "0">0V, and Vt1<Vt2.

During read operation of memory device 200, only one memory cell of the same memory cell group can be selected one at a time to read information from the selected memory cell. For example, memory cells 210, 212, and 214 of memory cell groups $201_0$ can be selected one at a time during a read operation to read information from the selected memory cell (e.g., one of memory cells 210, 212, and 214 in this example). In another example, memory cell1 212, 213, and 215 of memory cell groups $201_1$ can be selected one at a time during a read operation to read information from the selected memory cell (e.g., one of memory cells 221, 213, and 215 in this example).

During a read operation, memory cells of different memory cell groups (e.g., memory cell groups $201_0$ and $201_1$) that share the same access line (e.g., access line 241, 242, or 243) can be concurrently selected (or alternatively can be sequentially selected). For example, memory cells 210 and 211 can be concurrently selected during a read operation to read (e.g., concurrently read) information from memory cells 210 and 211. Memory cells 212 and 213 can be concurrently selected during a read operation to read (e.g., concurrently read) information from memory cells 212 and 213. Memory cells 214 and 215 can be concurrently selected during a read operation to read (e.g., concurrently read) information from memory cells 214 and 215.

The value of information read from the selected memory cell of memory cell group $201_0$ during a read operation can be determined based on the value of a current detected (e.g. sensed) from a read path (described above) that includes transistor T1 of the selected memory cell (e.g., memory cell 210, 212, or 214) and data lines 221 and 221'. The value of information read from the selected memory cell of memory cell group $201_1$ during a read operation can be determined based on the value of a current detected (e.g. sensed) from a read path that includes transistor T1 of the selected memory cell (e.g., memory cell 211, 213, or 215) and data lines 222 and 222'.

Memory device 200 can include detection circuitry (not shown) that can operate during a read operation to detect (e.g., sense) a current (e.g., current I1, not shown) on a read path that includes data lines 221 and 221', and detect a current (e.g., current I2, not shown) on a read path that includes data lines 222 and 222'. The value of the detected current can be based on the value of information stored in the selected memory cell. For example, depending on the value of information stored in the selected memory cell of memory cell group $201_0$, the value of the detected current (e.g., the value of current I1) between data lines 221 and 221' can be zero or greater than zero. Similarly, depending on the value of information stored in the selected memory cell of memory cell group $201_1$, the value of the detected current (e.g., the value of current I2) between data lines 222 and 222' can be zero or greater than zero. Memory device 200 can include circuitry (not shown) to translate the value of detected current into the value (e.g., "0", "1", or a combination of multi-bit values) of information stored in the selected memory cell.

During a write operation of memory device 200, only one memory cell of the same memory cell group can be selected one at a time to store information in the selected memory cell. For example, memory cell 210, 212, and 214 of memory cell groups $201_0$ can be selected one at a time during a write operation to store information in the selected memory cell (e.g., one of memory cell 210, 212, and 214 in this example). In another example, memory cells 212, 213, and 215 of memory cell groups $201_1$ can be selected one at a time during a write operation to store information in the selected memory cell (e.g., one of memory cell 211, 213, and 215 in this example).

During a write operation, memory cells of different memory cell groups (e.g., memory cell groups $201_0$ and $201_1$) that share the same access line (e.g., access line 241, 242, or 243) can be concurrently selected (or alternatively can be sequentially selected). For example, memory cells 210 and 211 can be concurrently selected during a write operation to store (e.g., concurrently store) information in memory cells 210 and 211. Memory cells 212 and 213 can be concurrently selected during a write operation to store (e.g., concurrently store) information in memory cells 212 and 213. Memory cells 214 and 215 can be concurrently selected during a write operation to store (e.g., concurrently store) information in memory cells 214 and 215.

Information to be stored in a selected memory cell of memory cell group $201_0$ during a write operation can be provided through a write path that includes data line 221W and transistor T2 of the selected memory cell (e.g., memory cell 210, 212, or 214). Information to be stored in a selected memory cell of memory cell group $201_1$ during a write operation can be provided through a write path that includes data line 222W and transistor T2 of the selected memory cell (e.g., memory cell 212, 213, or 215). As described above, the value (e.g., binary value) of information stored in a particular memory cell among memory cells 210 through 215 can be based on the amount of charge in charge storage structure 202 of that particular memory cell.

In a write operation, the amount of charge in charge storage structure 202 of a selected memory cell can be changed (to reflect the value of information stored in the selected memory cell) by applying a voltage on a write path that includes transistor T2 of that particular memory cell and the data line (e.g., data line 221W or 222W) coupled to that particular memory cell. For example, a voltage having one value (e.g., 0V) can be applied on data line 221W (e.g., provide 0V to signal BL1) if information to be stored in a selected memory cell among memory cells 210, 212, and 214 has one value (e.g., "0"). In another example, a voltage having another value (e.g., a positive voltage) can be applied on data line 221 (e.g., provide a positive voltage to signal BL1) if information to be stored in a selected memory cell among memory cells 210, 212, and 214 has another value (e.g., "1"). Thus, information can be stored (e.g., directly stored) in charge storage structure 202 of a particular memory cell by providing the information to be stored (e.g., in the form of a voltage) on a write path (that includes transistor T2) of that particular memory cell.

Figure 3:
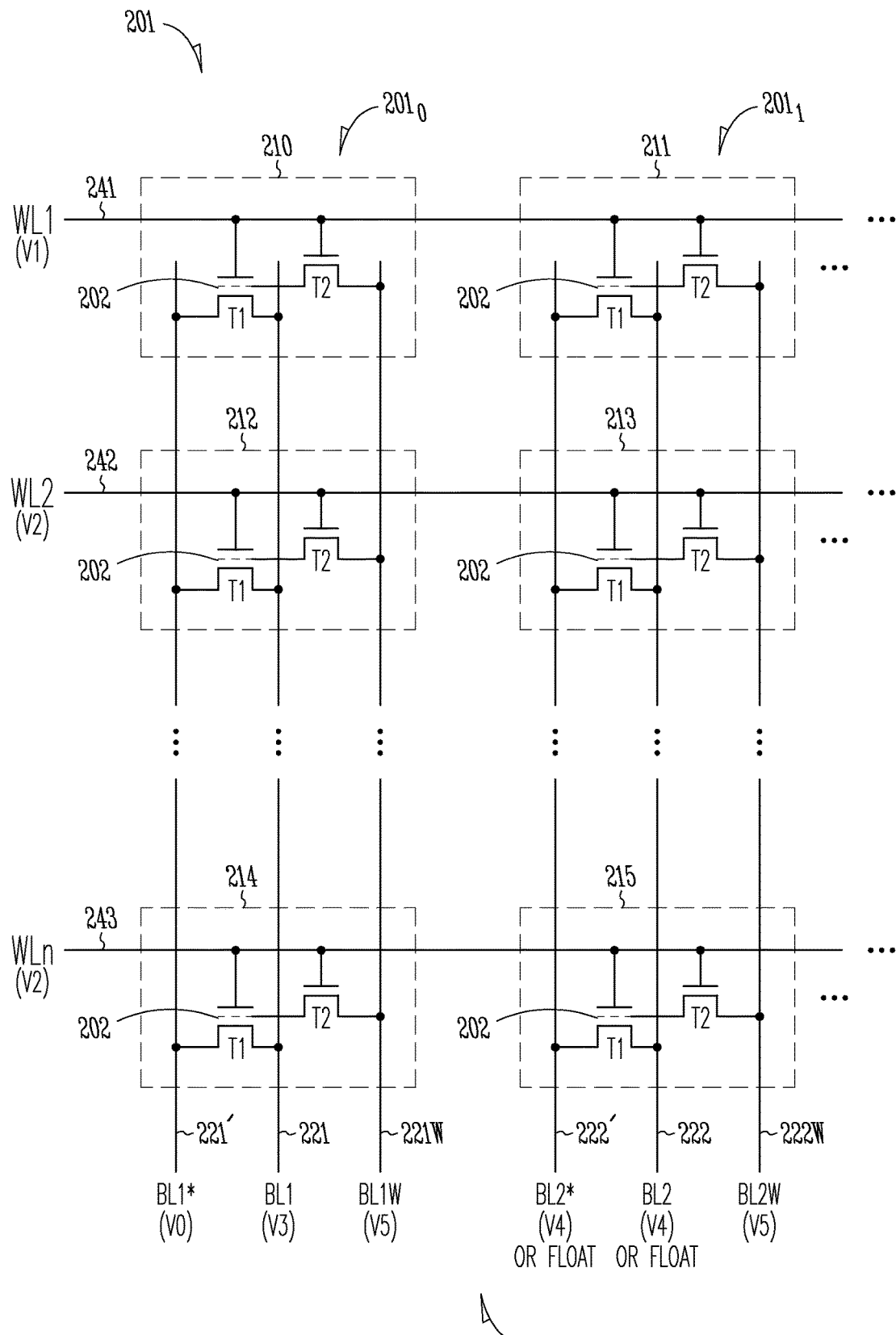
FIG. 3 shows the memory device of FIG. 2 including example voltages used during a read operation of the memory device, according to some embodiments described herein.

FIG. 3 shows memory device 200 of FIG. 2 including example voltages V0, V1, V2, and V3 used during a read operation of memory device 200, according to some embodiments described herein. The example of FIG. 3 assumes that memory cell 210 is a selected memory cell (e.g., target memory cell) during a read operation to read (e.g., to sense) information stored (e.g., previously stored) in memory cell 210. Memory cells 221 through 215 are assumed to be unselected memory cells. This means that memory cells 221 through 215 are not accessed and information stored in memory cells 221 through 215 are not read while information is read from memory cell 210 in the example of FIG. 3.

In FIG. 3, voltages V0, V1. V2, V3, V4, and V5 can represent different voltages applied to respective access lines 241, 242, and 243, and data lines 221, 221', 221W, 222, 222', and 222W during a read operation of memory device 200. As an example, voltages V0, V1, V2, V3, V4, and V5 can have values of 0V (e.g., ground), 0.5V, 0V, 0.5V, 0V, and 2V, respectively. These values are example values. Different values may be used.

As shown in FIG. 3, each of data lines 222 and 222' can be either applied with voltage V4 or placed in a "FLOAT" condition. Placing a particular conductive line (e.g., data line 222 or 222') in a FLOAT condition during a particular operation can include allowing the potential on that particular conductive line to vary or to "float" (e.g., by not coupling that particular conductive line to a fixed potential (e.g., ground or other voltages). In the example read operation of FIG. 3, each of data lines 222 and 222' in FIG. 3 can be placed in a FLOAT condition by, for example, decoupling each of data lines 222 and 222' from ground or from a fixed positive voltage source. This allows the potential on each of data lines 222 and 222' to vary (e.g., to "float") during the operation of reading information from memory cell 210 (selected memory cell in this example).

In the read operation shown in FIG. 3, voltage V1 can have a value (voltage value) to turn on transistor T1 of memory cell 210 (a selected memory cell in this example) and turn off (or keep off) transistor T2 of memory cell 210. This allows information to be read from memory cell 210. Voltage V0 and V2 and can have values, such that transistors T1 and T2 of each of memory cells 221 through 215 (unselected memory cells in this example) are turned off (e.g., kept off). Voltage V3 can have a value, such that a current (e.g., read current) may be formed on a read path that include data lines 221 and 221' and transistor T1 of memory cell 210. This allows a detection of current on the read path coupled to memory cell 210. A detection circuitry (not shown) of memory device 200 can operate to translate the value of detected current (during reading of information from a selected memory cell) into the value (e.g., "0", "1", or a combination of multi-bit values) of information read from the selected memory cell. In the example of FIG. 3, the value of detected current on data lines 221 and 221' can be translated into the value of information read from memory cell 210.

In the read operation shown in FIG. 3, the voltages applied to respective access lines 241, 242, and 243 can cause transistors T1 and T2 of each of memory cells 221 through 215, except transistor T1 of memory cell 210, to turn off (or to remain turned off). Transistor T1 of memory cell 210 may or may not turn on, depending on the value of the threshold voltage Vt1 of transistor T1 of memory cell 210. For example, if transistor T1 of each of memory cells (e.g., 210 through 215) of memory device 200 is configured (e.g., structured) such that the threshold voltage of transistor T1 is less than zero (e.g., Vt1<0V) regardless of the value (e.g., the state) of information stored in a respective memory cell 210, then transistor T1 of memory cell 210 in this example can turn on and conduct a current between data lines 221 and 221' (through transistor T1 of memory cell 210). Memory device 200 can determine the value of information stored in memory cell 210 based on the value of the current between data lines 221 and 221'. As described above, memory device 200 can include detection circuitry to measure the value of current between data lines 221 and 221' (or between data lines 222 and 222) during a read operation.

Figure 4:
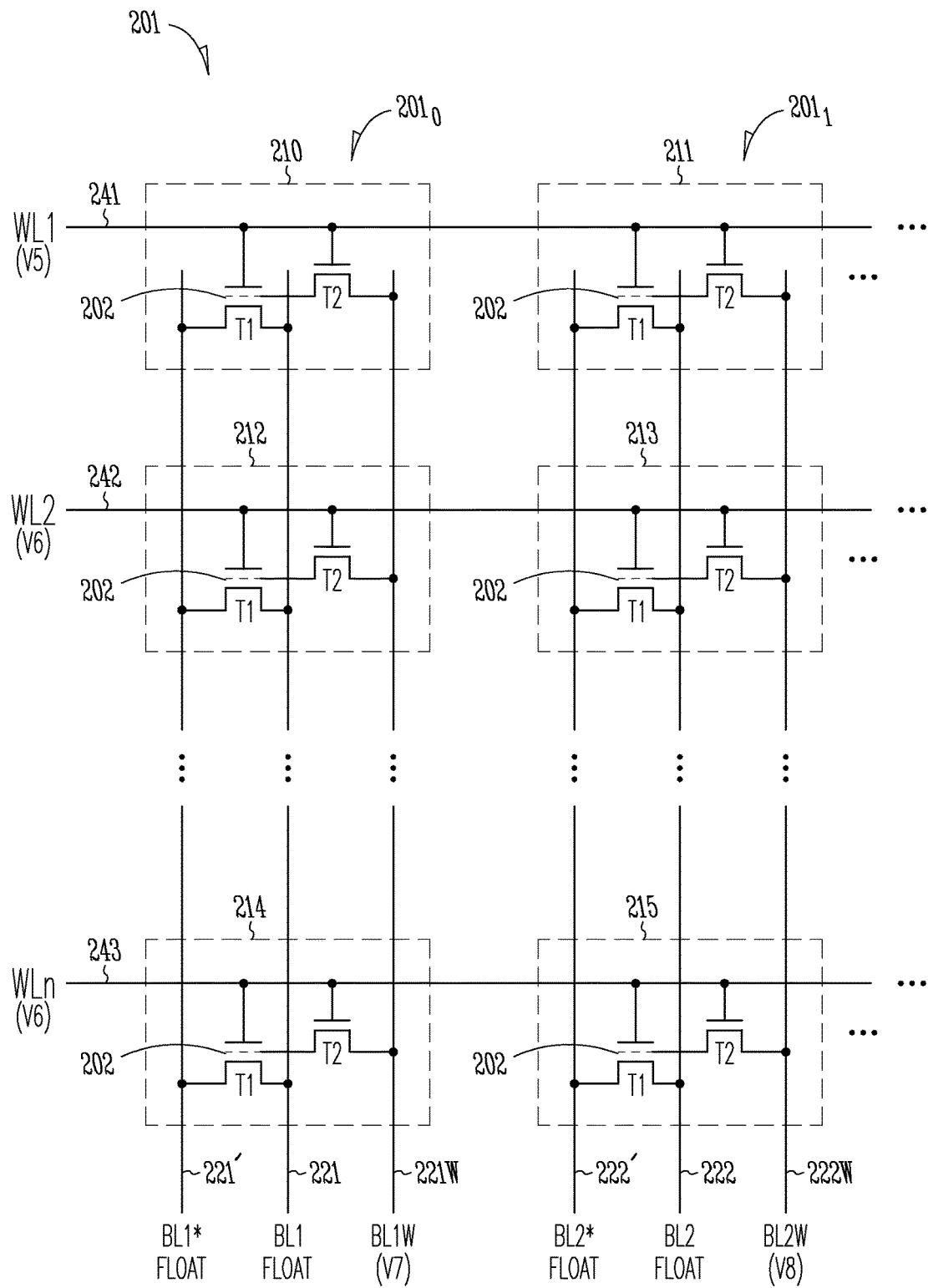
FIG. 4 shows the memory device of FIG. 2 including example voltages used during a write operation of the memory device, according to some embodiments described herein.

FIG. 4 shows memory device 200 of FIG. 2 including example voltages V5, V6, V7, and V8 used during a write operation of memory device 200, according to some embodiments described herein. The example of FIG. 4 assumes that memory cells 210 and 211 are selected memory cell (e.g., target memory cells) during a write operation to store information in memory cells 210 and 211. Memory cells 212 through 215 are assumed to be unselected memory cells. This means that memory cells 212 through 215 are not accessed and information stored is not to be stored in memory cells 212 through 215 while information is stored in memory cells 210 and 211 in the example of FIG. 4.

In FIG. 4, voltages V5, V6, V7, and V8 can represent different voltages applied to respective access lines 241, 242, and 243, and data lines 221W and 222W during a write operation of memory device 200. As an example, voltages V5 and V6 can have values of 2.5V and 0V, respectively. The value of each of voltages V7 and V8 can be less than, equal to, or greater than the value of voltage V5, depending the value (e.g., "0" or "1") of information to be stored in memory cells 210 and 211. The specific values of voltages used in this description are only example values. Different values may be used.

The values of voltages V7 and V8 can be the same or different, depending the value (e.g., "0" or "1") of information to be stored in memory cells 210 and 211. For example, the values of voltages V7 and V8 can be the same (e.g., V7=V8) if the memory cells 210 and 211 are to store information having the same value. As an example, V7=V8=0V, and V5=2.5V if information to be stored in each memory cell 210 and 211 is "0", and V7=V8=1V to 3V, and V5=2.5V if information to be stored in each memory cell 210 and 211 is "1").

In another example, the values of voltages V7 and V8 can be different (e.g., V7≠V8) if the memory cells 210 and 211 are to store information having different values. As an example, V7=0V, V8=1V to 3V, and V5=2.5V if "0" to be stored in memory cell 210 and "1" is to be store in memory cell 211). As another example, V7=1V to 3V, V8=0V, and V5=2.5V if "1" to be stored in memory cell 210 and "0" is to be store in memory cell 211).

The range of voltage of 1V to 3V are used here as an example. A different range of voltage can be used. Further, instead of 0V, a positive voltage (e.g., V7>0V or V8>0V) may be applied to that particular data line to particular write data line (e.g., data line 221W or 222W) for storing information having a value of "0" to the memory cell (e.g., memory cell 210 or 211) coupled to that particular write data line.

In a write operation of memory device 200 of FIG. 4, voltage V6 can have a value, such that transistors T1 and T2 of each of memory cells 212 through 215 (unselected memory cells in this example) are turned off (e.g., kept off). Voltages V5 can have a value to turn on transistor T2 of each of memory cells 210 and 211 (selected memory cells in this example) and form a write path between charge storage structure 202 of memory cell 210 and data line 221W, and a write path between charge storage structure 202 of memory cell 211 and data line 222W. A current (e.g., write current) may be formed between charge storage structure 202 of memory cell 210 and data line 221W. This current can affect (e.g., change) the amount of charge on charge storage structure 202 of memory device 210 to reflect the value of information to be stored in memory cell 210. A current (e.g., another write current) may be formed between charge storage structure 202 of memory cell 211 and data line 222W. This current can affect (e.g., change) the amount of charge on charge storage structure 202 of memory device 211 to reflect the value of information to be stored in memory cell 211.

In the example write operation of FIG. 4, the value of voltage V7 may cause charge storage structure 202 of memory cell 210 to discharge or to be charged, such that the resulting charge (e.g., charge remaining after the discharge or charge action) on charge storage structure 202 of memory cell 210 can reflect the value of information stored in memory cell 210. Similarly, the value of voltage V8 in this example may cause charge storage structure 202 of memory cell 211 to discharge or to be charged, such that the resulting charge (e.g., charge remaining after the discharge or charge action) on charge storage structure 202 of memory cell 211 can reflect the value of information stored in memory cell 211.

The example write operation of FIG. 4 assumes that memory cells 210 and 211 are selected (e.g., concurrently selected) to store (e.g., concurrently store) information. In another write operation, either memory cell 210 or memory cell 211 can be selected to store information. For example, in another write operation, memory cell 210 can be selected and memory cells 211 through 215 can be unselected memory cells. In such a write operation, voltage V8 can be applied with a voltage (e.g., a write inhibit voltage (e.g., V8=V5)) such that memory cell 211 is inhibited from storing information when information is stored in memory cell 210 (selected memory cell). Similarly, if memory cell 211 is selected to store information and memory cell 210 and 212 through 215 are unselected memory, then voltage V7 can be applied with a voltage (e.g., a write inhibit voltage (e.g., V7=V5)) such that memory cell 210 is inhibited from storing information when information is stored in memory cell 211 (selected memory cell).

Memory device 200 described above with reference to FIG. 2 through FIG. 4 can have a structure (e.g., a 2-T memory structure) of the memory device 600 described below with reference to FIG. 6 through FIG. 30. Alternatively, memory device 200 can have a structure (e.g., a 2-T memory structure) of the memory device 3100 described below with reference to FIG. 31 through FIG. 35.

Figure 5:
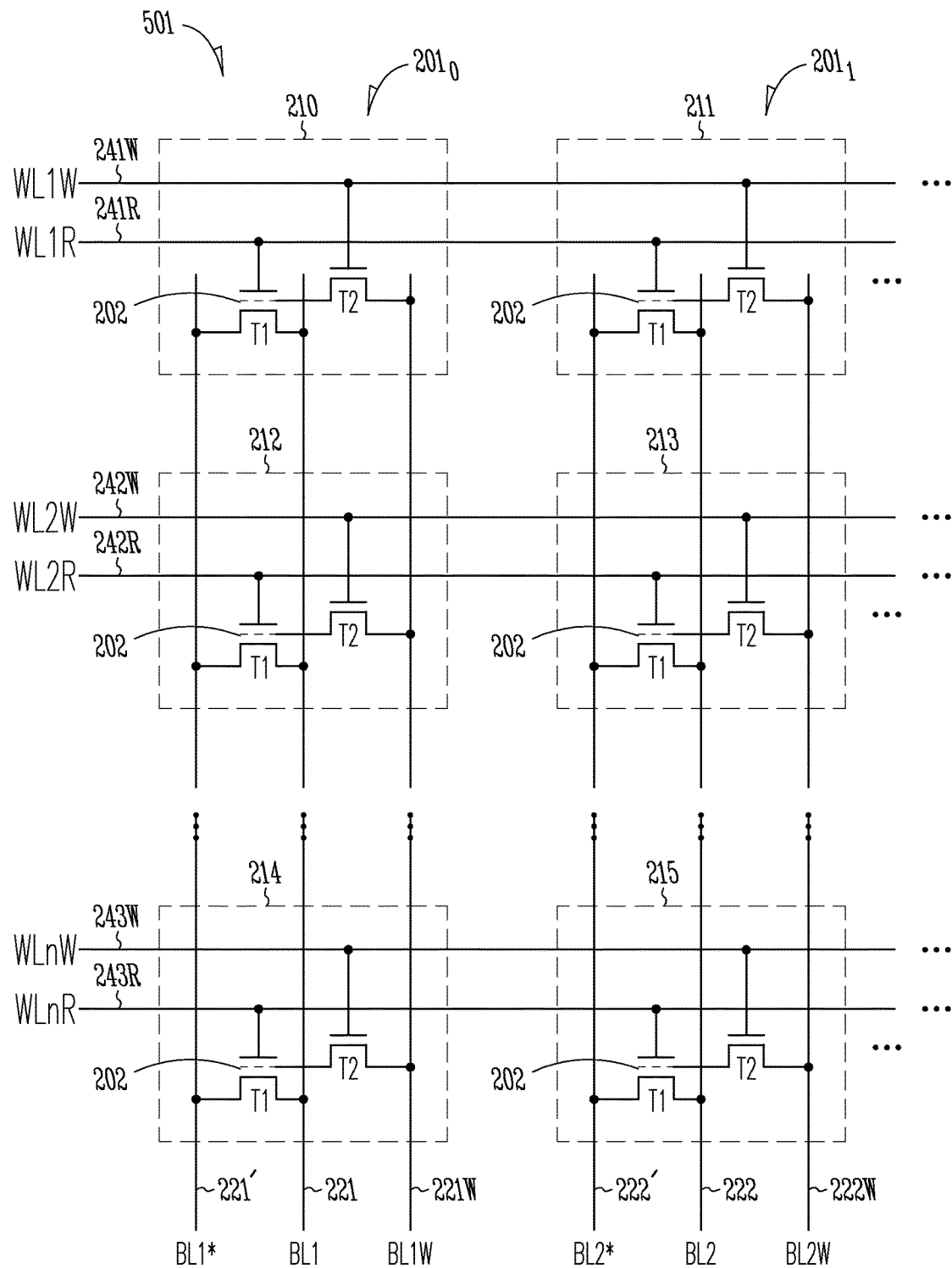
FIG. 5 shows a schematic diagram of a portion of a memory device, which can be a variation of the memory device of FIG. 2, according to some embodiments described herein.

FIG. 5 shows a schematic diagram of a portion of a memory device 500 including a memory array 501', according to some embodiments described herein. Memory device 500 can be a variation of memory device 200 described above with reference to FIG. 2 through FIG. 4. Thus, for simplicity, similar or identical element between memory devices 200 and 500 are given the same reference labels and their descriptions are not repeated.

Differences between memory devices 200 and 500 include multiple access lines in memory device 500 that memory device 500 can use to separately control (e.g., turn on or turn off) transistors T1 and T2 of each of the memory cells in memory device 500. As shown in FIG. 5, memory device 500 can include access lines 241R and 241W (that can receive respective signals WL1R and WL1W) to control transistors T1 and T2, respectively, of each of memory cells 210 and 211; access lines 242R and 242W (that can receive respective signals WL2R and WL2W) to control transistors T1 and T2, respectively, of each of memory cells 212 and 213; and access lines 243R and 243W (that can receive respective signals WLnR and WLnW) to control transistors T1 and T2, respectively, of each of memory cells 214 and 215.

Access lines 241R, 242R, and 243R can be selectively activated during a read operation of memory device 500, depending on which of memory cells 210 through 215 is selected during a particular read operation. Access lines 241W, 242W, and 243W can be deactivated during a read operation of memory device 500. During a read operation of memory device 500, access lines 241R, 242R, and 243R can be provided with voltages similar to (or identical to) the voltages provided to access lines 241, 242, and 243, respectively, of FIG. 3.

Access lines 241W, 242W, and 243W can be selectively activated (or alternatively concurrently activated) during a write operation of memory device 500, depending on which of memory cells 210 through 215 is selected during a particular write operation. Access lines 241R, 242R, and 243R can be deactivated during a write operation of memory device 500. During a write operation of memory device 500, access lines 241W, 242W, and 243W can be provided with voltages similar to (or identical to) the voltages provided to access lines 241, 242, and 243, respectively, of FIG. 4.

Memory device 500 can have a structure (e.g., a 2-T memory structure) of the memory device 600 described below with reference to FIG. 6 through FIG. 30. Alternatively, memory device 500 can have a structure (e.g., a 2-T memory structure) of the memory device 3100 described below with reference to FIG. 31 through FIG. 35.

FIG. 6 through FIG. 30 show different views of elements during processes of forming memory device 600, according to some embodiments of the invention. Some or all of the processes used to form memory device 600 can be used to form memory device 200 described above with reference to FIG. 2 through FIG. 5.

Figure 6:
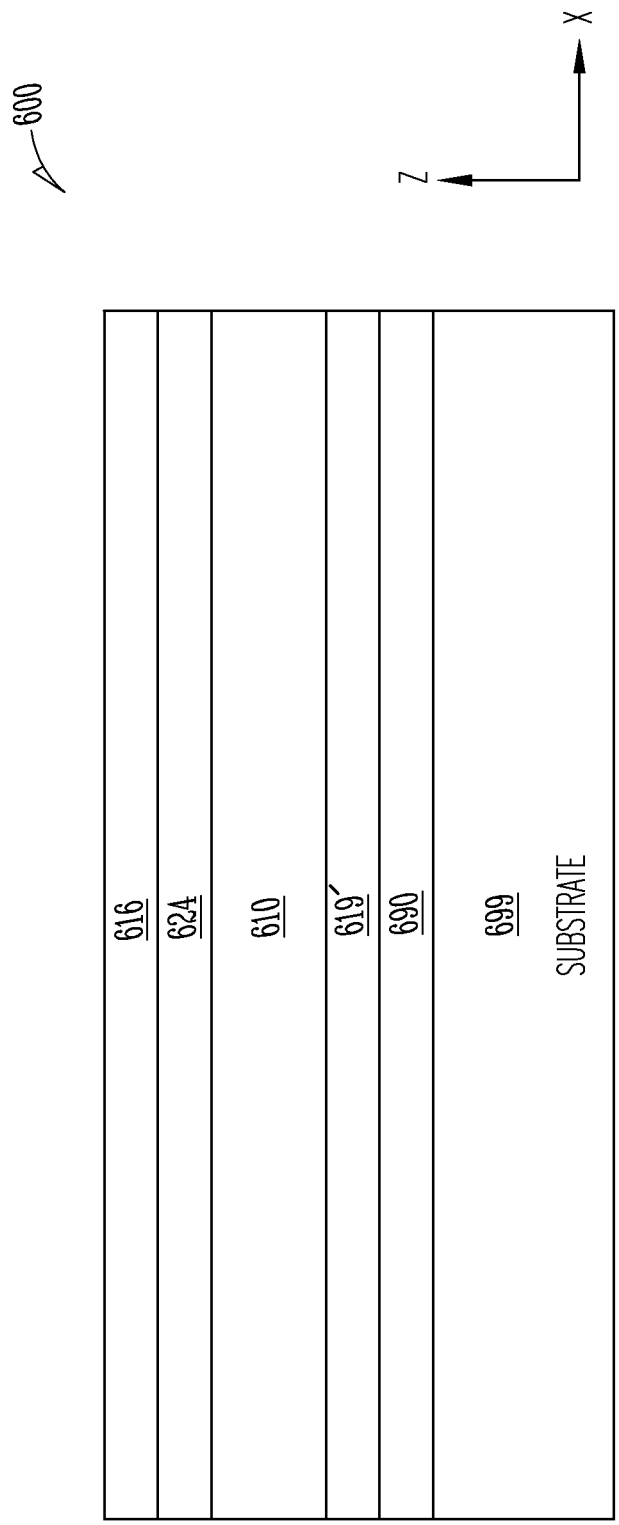
FIG. 6 through FIG. 30 show different views of elements during processes of forming a memory device, according to some embodiments of the invention.

FIG. 6 shows memory device 600 after a dielectric material 690, a conductive material 619', a material 610, a conductive material 624, and a dielectric material 616 are formed in respective levels (e.g., layers) in the Z-direction over a substrate 699. The Z-direction (e.g., vertical direction) is a direction perpendicular to (e.g., outward from) substrate 699. The Z-direction is also perpendicular to the X-direction (e.g., a direction parallel to a surface of substrate 699).

Dielectric material 690, conductive material 624, material 610, conductive material 619', and dielectric material 616 can be formed in a sequential fashion one material after another over substrate 699. For example, the processes used in FIG. 6 can include forming (e.g., depositing) dielectric material 690 over substrate, forming (e.g., depositing) conductive material 619' over dielectric material 690, forming (e.g., depositing) material 610 over conductive material 619', forming (e.g., depositing) conductive material 624 over dielectric material 610, and forming (e.g., depositing) dielectric material 616 over conductive material 624.

Substrate 699 can be a semiconductor substrate (e.g., silicon-based substrate) or other types of substrates. Dielectric materials 690 can include an oxide material (e.g., silicon dioxide $SiO_2$). Conductive materials 619' and 624 can include metal, conductively doped polysilicon, or other conductive materials. Material 610 can include metal or a semiconductor material (e.g., silicon, polysilicon (doped or undoped polysilicon), germanium. SiGe, or other semiconductor materials). Dielectric materials 616 can include an oxide material (e.g., silicon dioxide $SiO_2$). Dielectric materials 616 can include an oxide material (e.g., silicon dioxide $SiO_2$).

Figure 7:
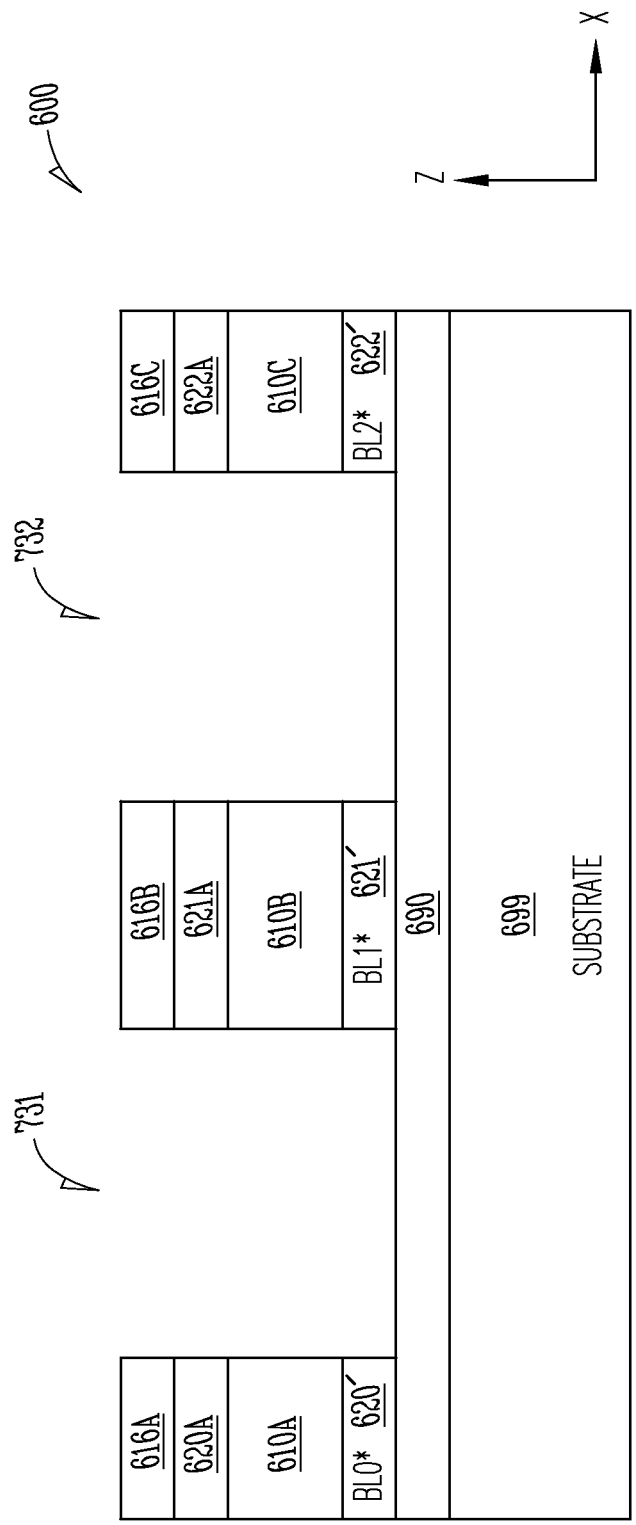

FIG. 7 shows memory device 600 after openings (e.g., trenches) 731 and 732, and data lines (e.g., read data lines) 620', 621', and 622' are formed. Forming openings 731 and 732 can include removing (e.g., by patterning) part of each of dielectric material 616, conductive material 624, material 610, and conductive material 619' at the locations of openings 731 and 732 and leaving remaining portions of these materials as shown in FIG. 7. For example, portions 610A, 610B, and 610C are remaining portions of material 610 of FIG. 6. Portions 620A, 621A, and 622A in FIG. 7 are remaining portions of conducive material 624 of FIG. 6. Portions 616A, 616B, and 616C are remaining portions of dielectric material 616 of FIG. 6.

Forming data lines 620', 621', and 622' (FIG. 7) can include removing part of conductive material 619' (FIG. 6) at the locations of openings 731 and 732 and leaving remaining portions of conductive material 619' that form respective data lines 620', 621', and 622'. Each of data lines 620', 621', and 622' is a conductive line (e.g., conductive region) and has a length in a direction (e.g., Y-direction, not labeled in FIG. 7) perpendicular to the X-direction and the Z-direction.

As shown in FIG. 7, data lines 620', 621', and 622' are electrically separated (in the X-direction) from each other. Data lines 621' and 622' can represent the structures of data lines 221' and 222', respectively, of memory device 200 shown in FIG. 2. Data line 620' is another data line of memory device 700 that can present the structure of a data line (not shown in FIG. 2) of memory device 200 of FIG. 2.

FIG. 7 also shows signals (e.g., bit line signals) BL0*, BL1*, and BL2* that can represent signals applied to data lines 620', 621', and 622', respectively. Memory device 600 can have a read operation similar to or identical to the read operation of memory device 200. Signals BL1* and BL2* in FIG. 7 can represent signals BL1* and BL2*, respectively, of memory device 200 in FIG. 2. Signal BL0* in FIG. 7 can also represent a signal (e.g., bit line signal, not shown in FIG. 2) in memory device 200 in FIG. 2.

Figure 8:
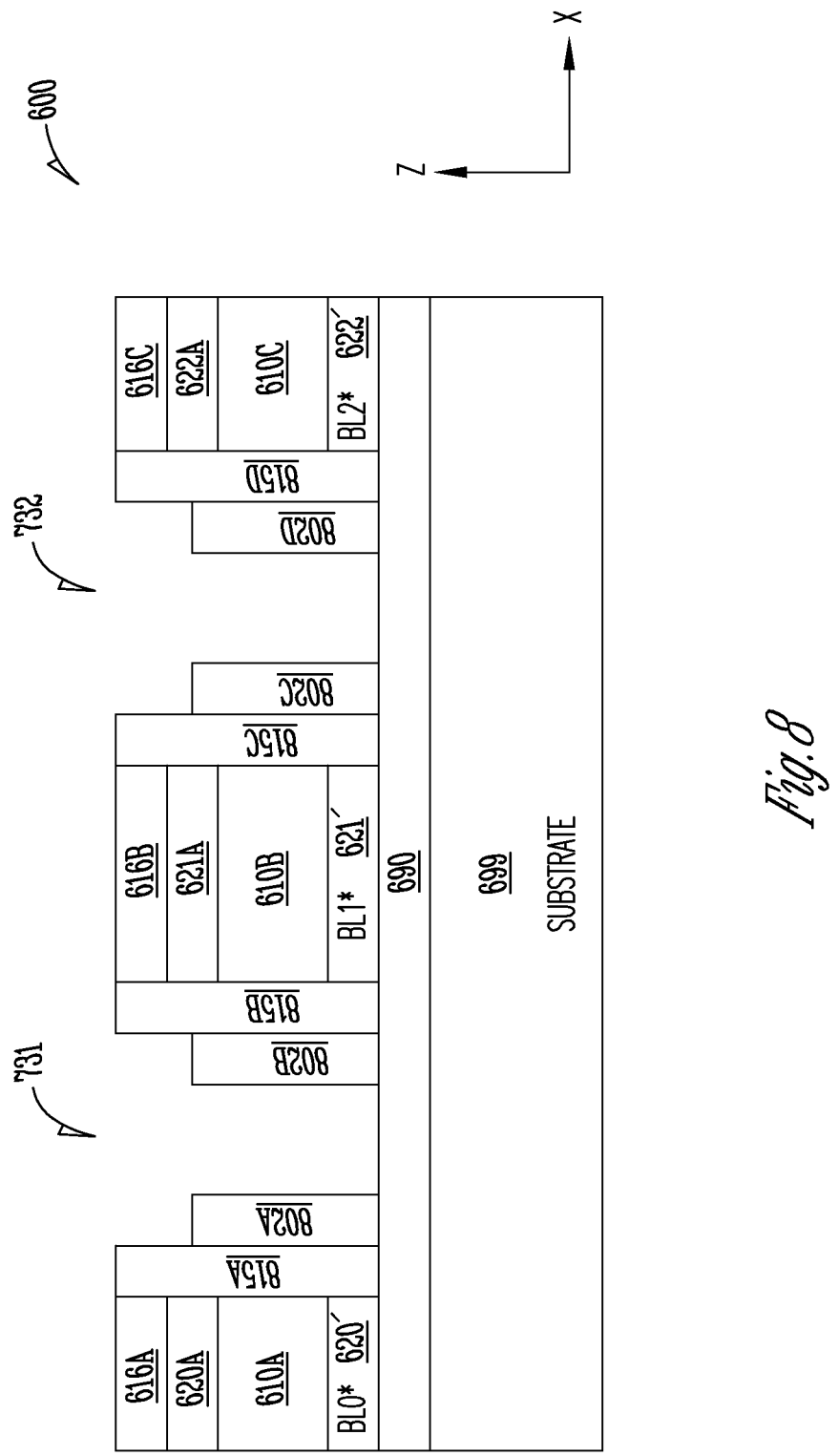

FIG. 8 shows memory device 600 after dielectric materials 815A, 815B. 815C, and 815D (815A-D) and materials 802A, 802B, 802C, and 802D are form in respective openings 731 and 732. Forming dielectric materials 815A-D can include forming (e.g., depositing) an initial dielectric material (e.g., silicon dioxide) in openings 731 and 732 then removing (e.g., by etching) a portion of the initial dielectric material and leaving portions of the initial dielectric material that form dielectric materials 815A-D having structures shown in FIG. 8.

Materials 802A-D can be formed after dielectric materials 815A-D are formed. For example, forming materials 802A-D can include forming (e.g., depositing) an initial material (e.g., polysilicon, metal, or a material (or materials) that can trap charge) in openings 731 and 732 then removing (e.g., by etching) a portion of the initial material and leaving portions of the initial material that form materials 802A-D having structures shown in FIG. 8.

Figure 9:
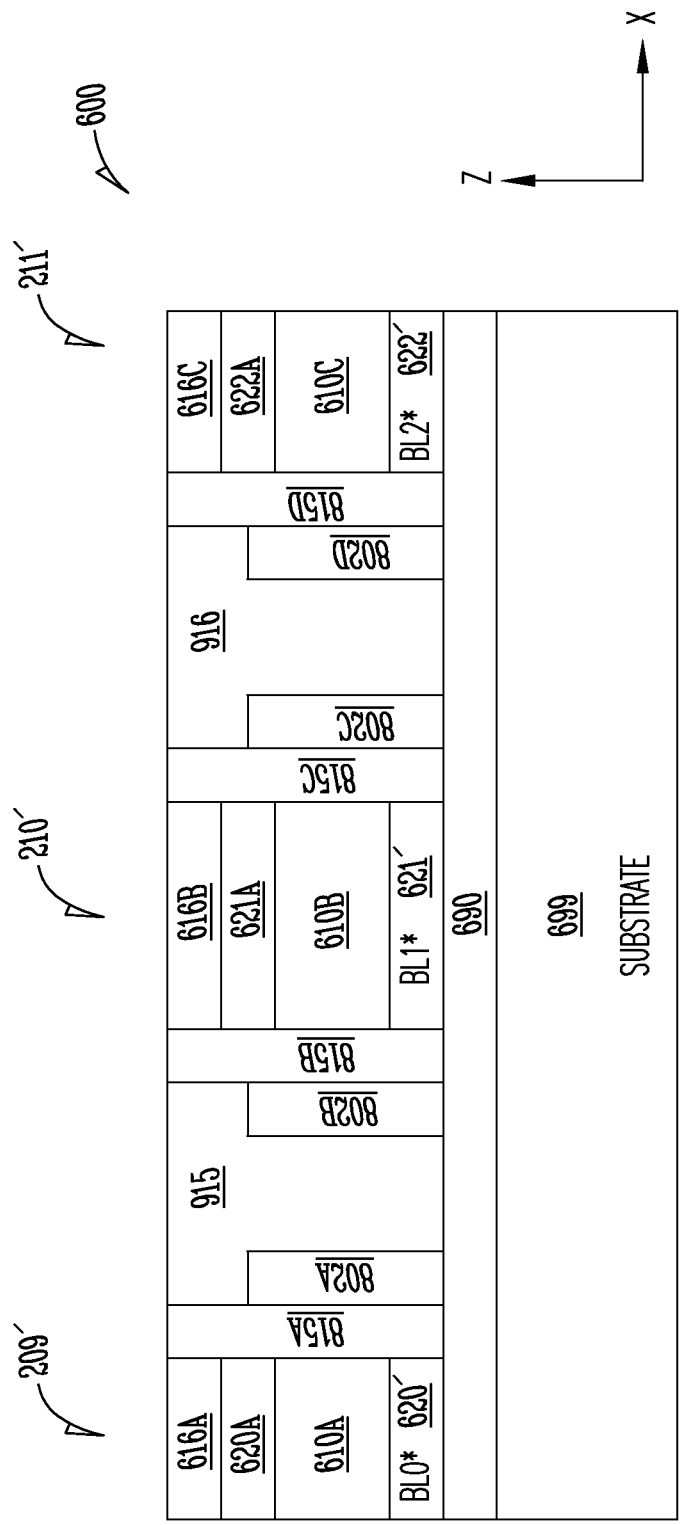

FIG. 9 shows memory device 600 after dielectric materials 915 and 916 are formed (e.g., filled) in respective openings 731 and 732. The structure show in FIG. 9 can be subsequently processed to form part of respective memory cells of memory device 600. For example, materials 802A-D can be subsequently structured to form charge storage structures (e.g., memory elements) of respective memory cells 209', 210', and 211' of memory device 600. Memory cells 210' and 211' can represent memory cells 210 and 211, respectively, of FIG. 2. Memory cell 209' can represent an additional memory cell (not shown in FIG. 2) of memory device 200 of FIG. 2 in which such an additional memory cell can share access line 241 with memory cells 211 and 212 of memory device 200.

Each of materials 610A. 620B, and 610C can be subsequently processed (e.g., structured) to form a channel region (e.g., read channel region) of a transistor (e.g., transistor T1, shown in FIG. 12) of a respective memory cell 209', 210', or 211' of memory device 900.

Each of memory cell 209', 201', and 211' can have charge storage structure that include two portions formed from two respective portions of materials 802A-D. Materials 802B and 802C can be subsequently processed (e.g., structured) to form two respective portions (one from material 802B and the other one from material 802C) of charge storage structure of memory cell 210'. Material 802A can form part of (e.g., one-half) of a charge storage structure of memory cell 209'. Material 802D can form part of (e.g., one-half) a charge storage structure of memory cell 211'. Each of memory cell 209' and 211' can have charge storage structure that include two portions (similar to two portions formed from materials 802B and 802C for the charge storage structure of memory cell 210'). However, for simplicity, the other portion (e.g., a portion to the left of material 610A) of the charge storage structure of memory cell 209' is not shown in FIG. 9, and the other portion (e.g., a portion to the right of material 610C) of the charge storage structure of memory cell 211' is not shown in FIG. 9.

Figure 10:
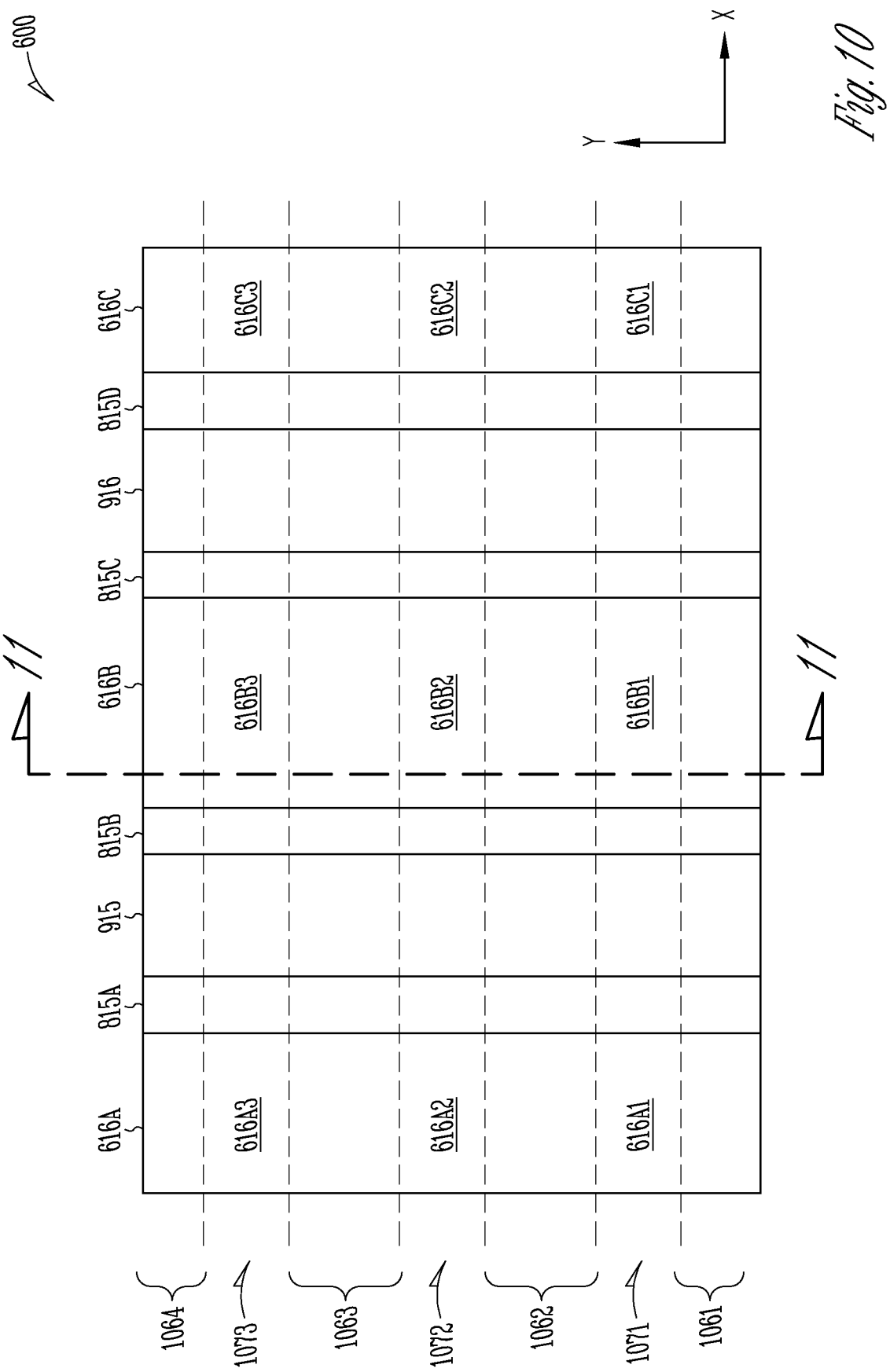

FIG. 10 shows a top view with respect to the X-Y directions of memory device 600 of FIG. 9. For simplicity, the description of the elements shown in FIG. 10 (which are described with reference to FIG. 9) is not repeated. As shown in FIG. 10, the elements of memory device 600 can include strips (e.g., lines) of materials having lengths extending in the Y-direction. Subsequent processes of forming memory device 600 can include removing (e.g., cutting (e.g., etching) in the Z-direction) the materials at locations 1061, 1062, 1063, and 1064 (1061-1064) down to (stopping at) data lines 620', 621', and 622' (FIG. 9). This way, data lines 620', 621', and 622' (which have lengths extending in the Y-direction) will remain extending continuously in the Y-direction.

In FIG. 10, after part of the materials at locations 1061-1064 are removed, portions 616A1, 616A2, and 616A3 (at locations 1071, 1072, and 1073, respectively) will be a remaining part of portion 616A; portions 616B1, 616B2, and 616B3 (at locations 1071, 1072, and 1073, respectively) will be a remaining part of portion 616B; and portions 616C1, 616C2, and 616C3 (at locations 1071, 1072, and 1073, respectively) will be a remaining part of portion 616C. Another view of memory device 600 along line 11-11 is shown in FIG. 11.

Figure 11:
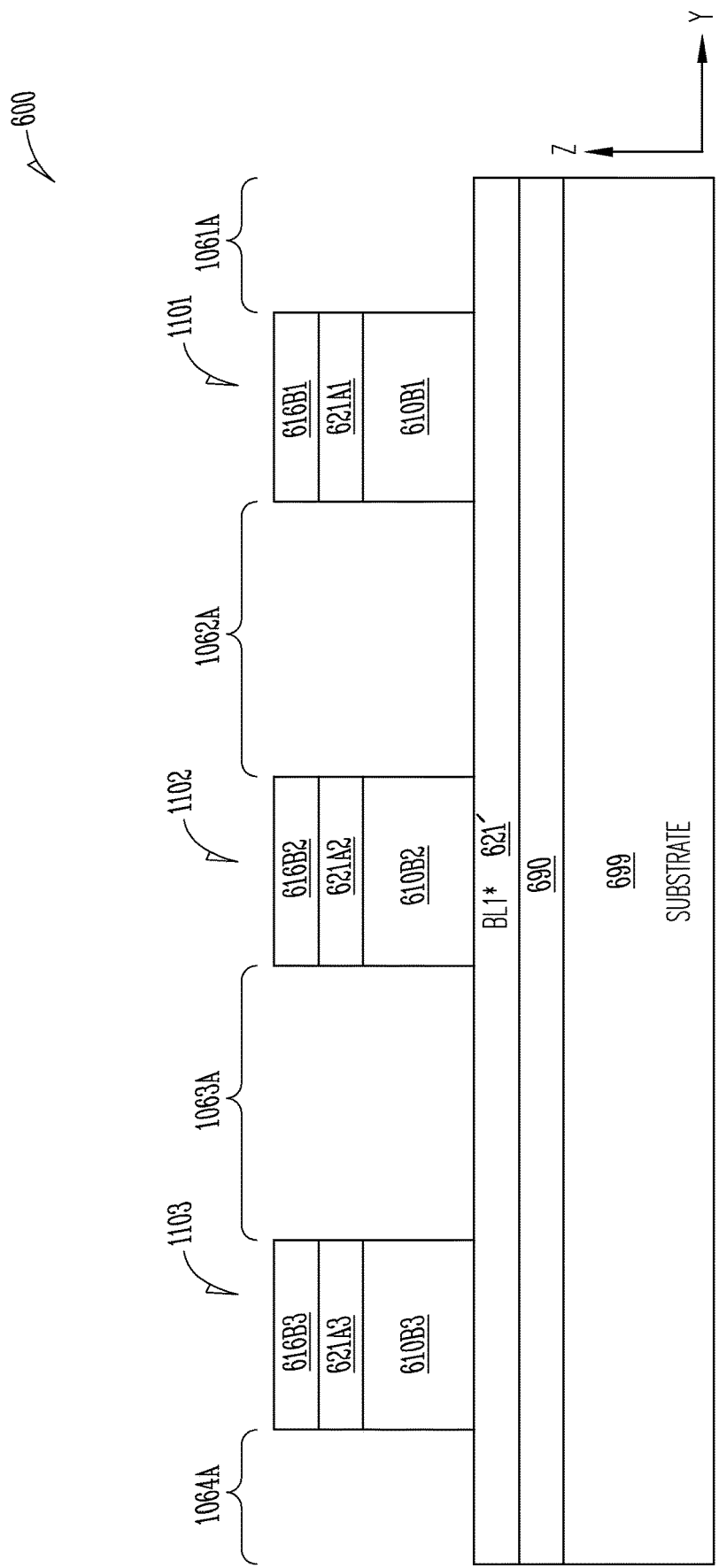

FIG. 11 shows a side view along line 11-11 of FIG. 10 with respect to the Y-Z directions after openings (e.g., trenches) 1061A, 1062A, 1063A, and 1064A (1061A-1064A) are formed at locations 1061, 1062, 1063, and 1064 (FIG. 10), respectively. As shown in FIG. 11, the structure (e.g., materials) at locations 1061-1064 were removed, stopping at (e.g., down to) data line 621', such that material of data line 621' is not removed. Openings 1061A-1064A can be formed by removing part of each of materials at locations 1061-1064 (as mentioned above). In FIG. 11, portions 610B1, 610B2, and 610B3 in the Y-direction are remaining part of portion 610B (FIG. 9): portions 621A1, 6212A2, and 621A3 in the Y-direction are remaining part of portion 621A (FIG. 9); and portions 616B1, 616B2, and 616B3 in the Y-direction are remaining part of portion 616B (FIG. 9 and FIG. 10). The materials of memory device 600 in FIG. 11 can include structures (e.g., protrusions (e.g., islands)) 1101, 1102, and 1103 extending outward from substrate 699. Each of structures 1101, 1102, and 1103 can be part of a memory cell in subsequent processes of forming memory device 600.

Figure 12:
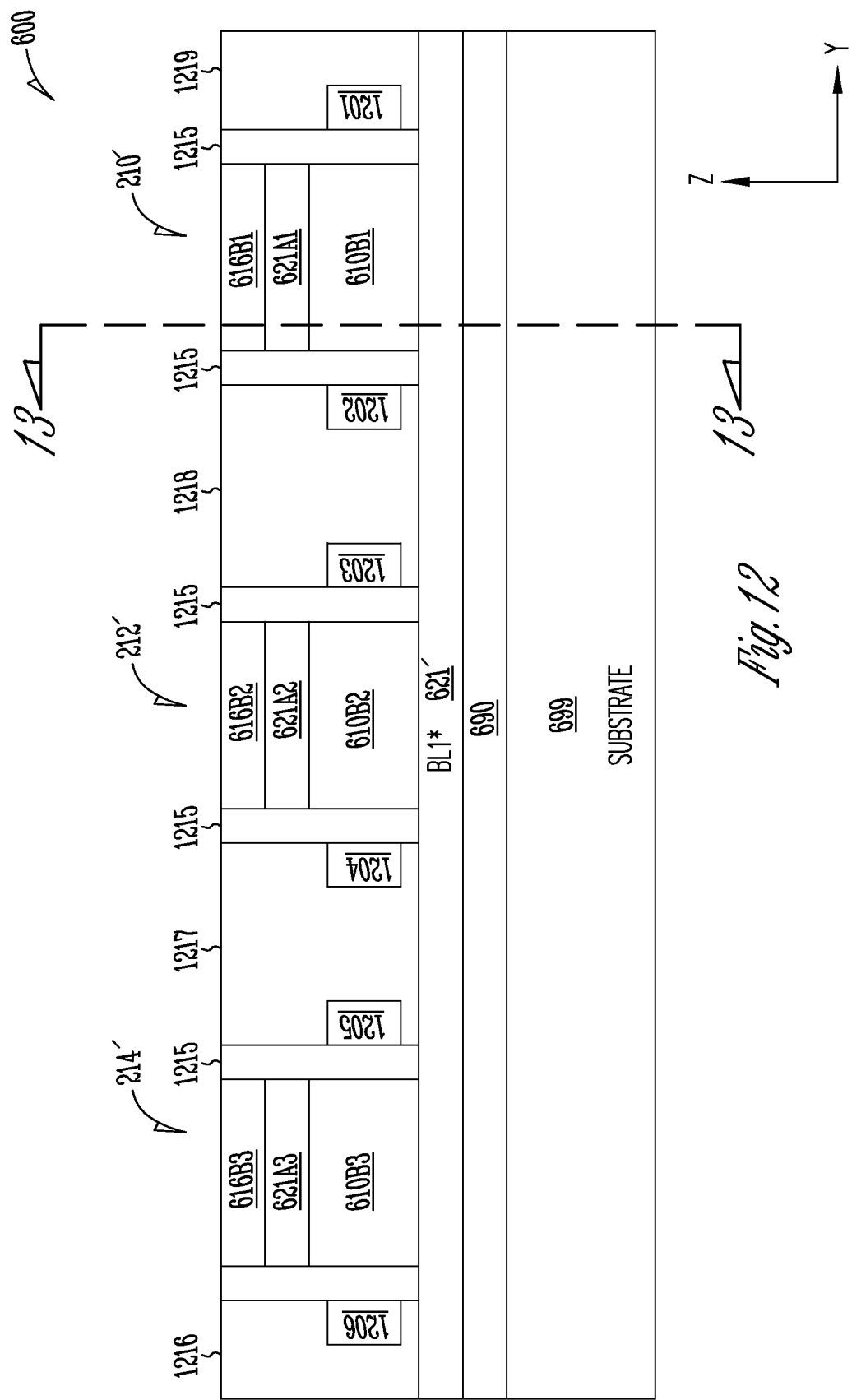

FIG. 12 shows memory device 600 of FIG. 11 after dielectric materials (e.g., gate oxides) 1215, conductive lines (e.g., conductive regions) 1201, 1202, 1203, 1204, 1205, and 1206 (1201-1206), and dielectric materials 1216, 1217, 1218, and 1219 (1216-1219) are formed in respective openings 1061A-1064A. Each of dielectric materials 1215 and 1216-1219 can include silicon dioxide or other dielectric materials. Each of conductive lines 1201-1206 can include metal, conductively doped polysilicon, or other conductive materials.

Conductive lines 1201-1206 can form part of access lines (e.g., word lines) to access memory cells 210', 212' and 214' of memory device 600. Memory cells 210', 212', and 214' can represent memory cells 210, 212, and 214, respectively, of memory device 200 of FIG. 2.

In FIG. 12, conductive lines 1201 and 1202 can form part of an access line (e.g., word line) to access memory cell 210' and other memory cells (not shown in FIG. 12) of memory device 600. Such other memory cells can be located in the same row with memory cell 210' in the X-direction (e.g., memory cells 209' and 211', shown in FIG. 13).

In FIG. 12, conductive lines 1203 and 1204 in FIG. 12 can form part of an access line (e.g., word line) to access memory cell 212' and other memory cells (not shown) of memory device 600. Conductive lines 1205 and 1206 in FIG. 12 can form part of an access line (e.g., word line) to access memory cell 214' and other memory cells (not shown) of memory device 600.

Thus, as shown in FIG. 12, conductive line 1201 can have a portion adjacent a side (e.g., right side in the Y-direction) of the channel region (e.g., portion 610B1) of memory cell 210'. Conductive line 1202 can have a portion adjacent another side (e.g., left side (opposite from the right side) in the Y-direction) of the channel region (e.g., portion 610B1) of memory cell 210'.

Similarly, conductive lines 1203 and 1204 can have respective portions (e.g., respective conductive regions) adjacent respective sides (opposite sides) in the Y-direction of a channel region (e.g., read channel region) of memory cell 212'. Conductive lines 1205 and 1206 can have respective portions (e.g., respective conductive regions) adjacent respective sides (opposite sides) in the Y-direction of a channel region (e.g., read channel region) of memory cell 214'. Another view of memory device 600 along line 13-13 is shown in FIG. 13.

Figure 13:
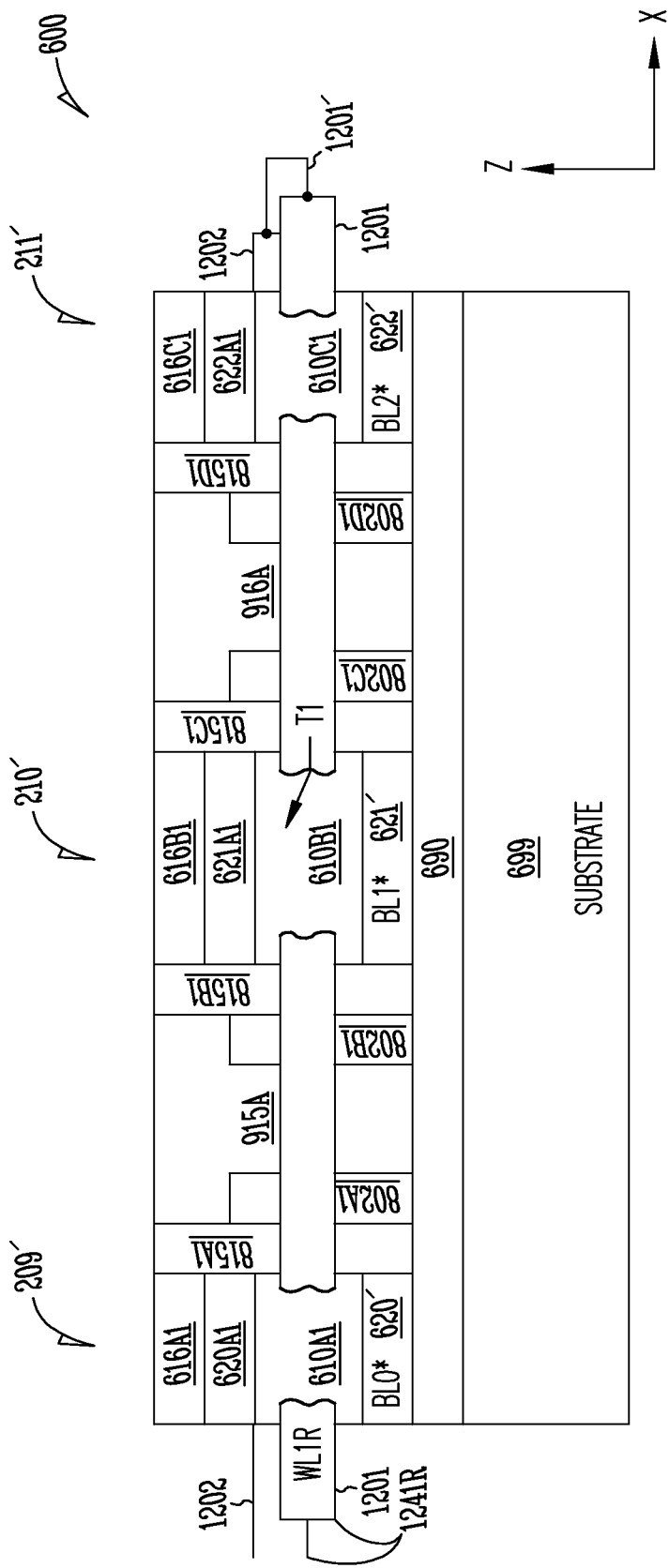

FIG. 13 shows a side view along line 13-13 of FIG. 12 with respect to the X-Z directions. In FIG. 13, conductive lines 1201 and 1202 are partially shown to avoid obstructing some parts of the other the elements of memory device 600. As shown in FIG. 13, each of conductive line can have a length in the X-direction, a width in the Z-direction, and a thickness (e.g., less than the width) in the Y-direction (shown in FIG. 12).

In FIG. 13, portions (dielectric portions) 616A1, 616B1, and 616C1 are the remaining part of portions 616A, 616B, and 616C, respectively, of FIG. 10 after part of each of portions 616A, 616B, and 616C was removed (e.g., cut) in the processes of FIG. 11 (and before conductive lines 1201-1206 are formed in the processes of FIG. 12).

Portions (conductive portions) 620A1, 621A1, and 622A1 are the remaining part of portions 620A, 621A, and 622A respectively, of FIG. 10 after part of each of portions 620A, 621A, and 622A was removed (e.g., cut) in the processes of FIG. 11 (and before conductive lines 1201-1206 are formed in the processes of FIG. 12).

Portions (dielectric portions) 915A and 916A are the remaining part of dielectric materials 915 and 916, respectively, of FIG. 10 after part of each of dielectric materials 915 and 916 was removed (e.g., cut) in the processes of FIG. 11 (and before conductive lines 1201-1206 are formed in the processes of FIG. 12).

Portions 815A1, 815B1, 815C1, and 815D1 are remaining part of materials 815A, 815B. 815C, and 815D, respectively, of FIG. 10 after part of each of materials 815A, 815B, 815C, and 815D was removed (e.g., cut) in the processes of FIG. 11 (and before conductive lines 1201-1206 are formed in the processes of FIG. 12).

Portions 610A1, 610B1, and 610C1 are the remaining part of portions 610A, 610B, and 610C, respectively, of FIG. 10 after part of each of portions 610A. 610B, and 610C was removed (e.g., cut) in the processes of FIG. 11 (and before conductive lines 1201-1206 are formed in the processes of FIG. 12). In FIG. 13, portion 610B1 can form a channel region (e.g., read channel region) of a transistor T1 of memory cells 210'. Transistor T1 of FIG. 13 can represent transistor T1 of memory cell 210 of memory device 200 of FIG. 2. In FIG. 13, portion 610A1 (FIG. 13) can form a channel region (e.g., read channel region) of a transistor T1 of memory cells 209'. Portion 610C1 can form a channel region (e.g., read channel region) of a transistor T1 of memory cells 211'. Each of portions 610A, 610B, and 610C can include a piece of material (e.g., metal or polysilicon) that is part of material 610 formed in the process in FIG. 6.

In FIG. 13, portions 802A1, 802B1, 802C1, and 802D1 are remaining part of materials 802A. 802B, 802C, and 802D respectively, of FIG. 10 (hidden under dielectric materials 915 and 916) after part of each of materials 802A, 802B, 802C, and 802D was removed (e.g., cut) in the processes of FIG. 11 (and before conductive lines 1201-1206 are formed in the processes of FIG. 12).

In FIG. 13, portions 802B1 and 802C1 in FIG. 13 can form the charge storage structure (e.g., memory element) of memory cell 210'. The charge storage structure (e.g., portions 802B1 and 802C2) of memory cell 210' can represent charge structure 202 of memory cell 210 of memory device 200 of FIG. 2. As shown in FIG. 13, the charge storage structure of memory cell 210' can have a portion (e.g., portion 802B1) adjacent a side (e.g., left side in the X-direction) of the channel region (e.g., portion 610B1) of memory cell 210', and another portion (e.g., portion 802C1) adjacent another side (e.g., right side (opposite from the left side) in the X-direction) of the channel region (e.g., portion 610B1) of memory cell 210'.

Portions 802A1 can form part of (e.g., one-half) the charge storage structure (e.g., memory element) of memory cell 209'. The charge storage structure of memory cell 209' can have a portion (e.g., portion 802B1) adjacent a side (e.g., right side in the X-direction) of the channel region (e.g., portion 610A1) of memory cell 209'.

Portions 802D1 can form part of (e.g., one-half) the charge storage structure (e.g., memory element) of memory cell 211'. The charge storage structure of memory cell 211' can have a portion (e.g., portion 802D1) adjacent a side (e.g., left side in the X-direction) of the channel region (e.g., portion 610C1) of memory cell 211'.

In FIG. 13, conductive lines 1201 and 1202 can be part of an access line (e.g., word line) 1241R (which can receive a signal (e.g., word line signal) WL1R to access memory cell 209', 210' and 211' of memory device 600 during an operation of memory device 600. For example, a signal (e.g., WL1R) on conductive lines 1201 and 1202 can be used to control (e.g., turn on or turn off) transistor T1 of memory cell 210'.

Figure 27:
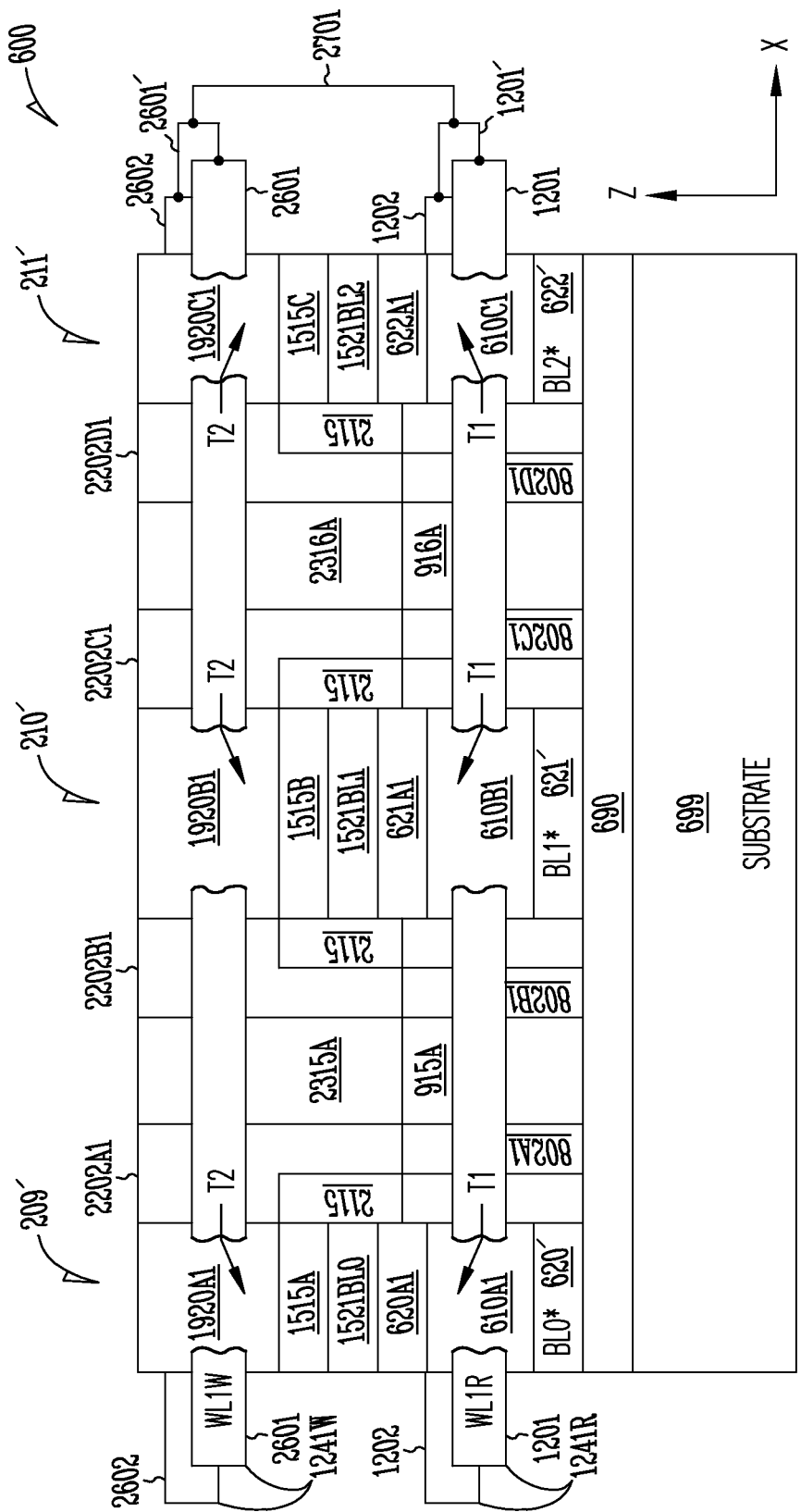

Thus, as shown in FIG. 27, access line 1241R of memory device 600 in FIG. 27 can include conductive lines 1201 and 1202 having respective portions located adjacent respective sides of a channel region (e.g., read channel region) of a respective memory cell (e.g., 209, 210', or 211').

For example, conductive line 1201 can have portion adjacent a side (e.g., front side in the Y-direction) of channel region (e.g., portion 610A1) of memory cell 209'. Conductive line 1202 can have a portion adjacent another side (e.g., backside (opposite from the front side) in the Y-direction) of the channel region (e.g., portion 610A1) of memory cell 209'.

Conductive line 1201 can have portion adjacent a side (e.g., front side in the Y-direction) of channel regions (e.g., portion 610B1) of memory cell 210'. Conductive line 1202 can have a portion adjacent another side (e.g., backside (opposite from the front side) in the Y-direction) of the channel region (e.g., portion 610B1) of memory cell 210'.

Conductive line 1201 can have portion adjacent a side (e.g., front side in the Y-direction) of channel regions (e.g., portion 610C1) of memory cell 211'. Conductive line 1202 can have a portion adjacent another side (e.g., backside (opposite from the front side) in the Y-direction) of the channel region (e.g., portion 610C1) of memory cell 211'.

The processes of forming memory device 600 in FIG. 13 can include forming a conductive connection 1201' (which can include a conductive material (e.g., metal)) to electrically couple conductive lines 1201 and 1202 to each other. Similarly, the processes of forming memory device 600 can include forming a conductive connection (not shown) to electrically couple conductive lines 1203 and 1204 (FIG. 12) to each other, and forming a conductive connection (not shown) to electrically couple conductive lines 1205 and 1206 (FIG. 12) to each other.

Figure 14:
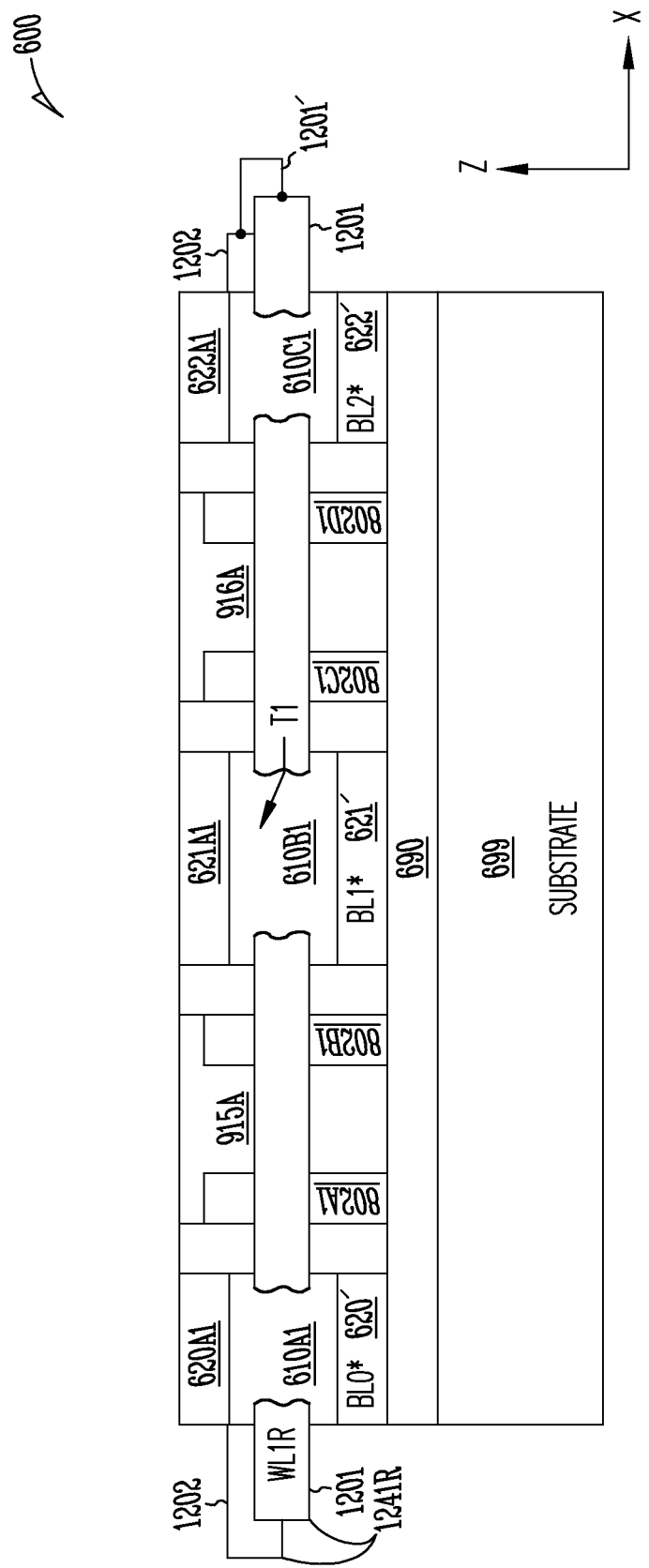

FIG. 14 shows memory device 600 after portions 616A1, 616B1, and 616C1 are removed and after part of each of portions 915A and 916A is removed. The processes in FIG. 14 can include a flattening process (e.g., chemical mechanical polishing (CMP) process) to remove portions 616A1, 616B1, and 616C1 and remove part of (e.g., top part) of each of portions 915A and 916A.

Figure 15:
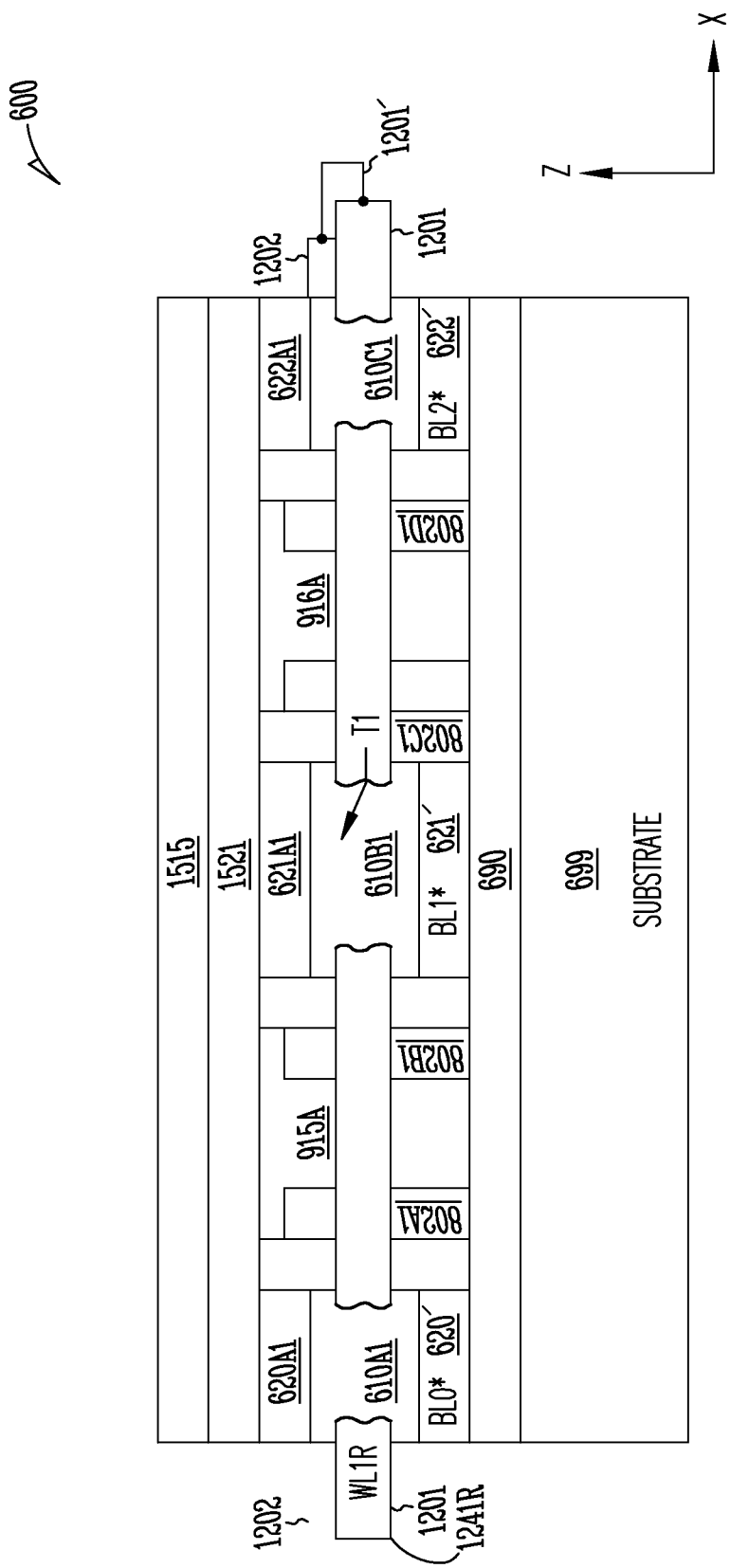

FIG. 15 shows memory device 600 after a conductive material 1521 and a dielectric material 1515 are formed. Material 1515 can include an oxide material (e.g., silicon dioxide $SiO_2$). Conductive material 1521 can include metal, conductively doped polysilicon, or other conductive materials, that can be same material as the material of portions 621A1, 621A2, and 621A3.

Figure 16:
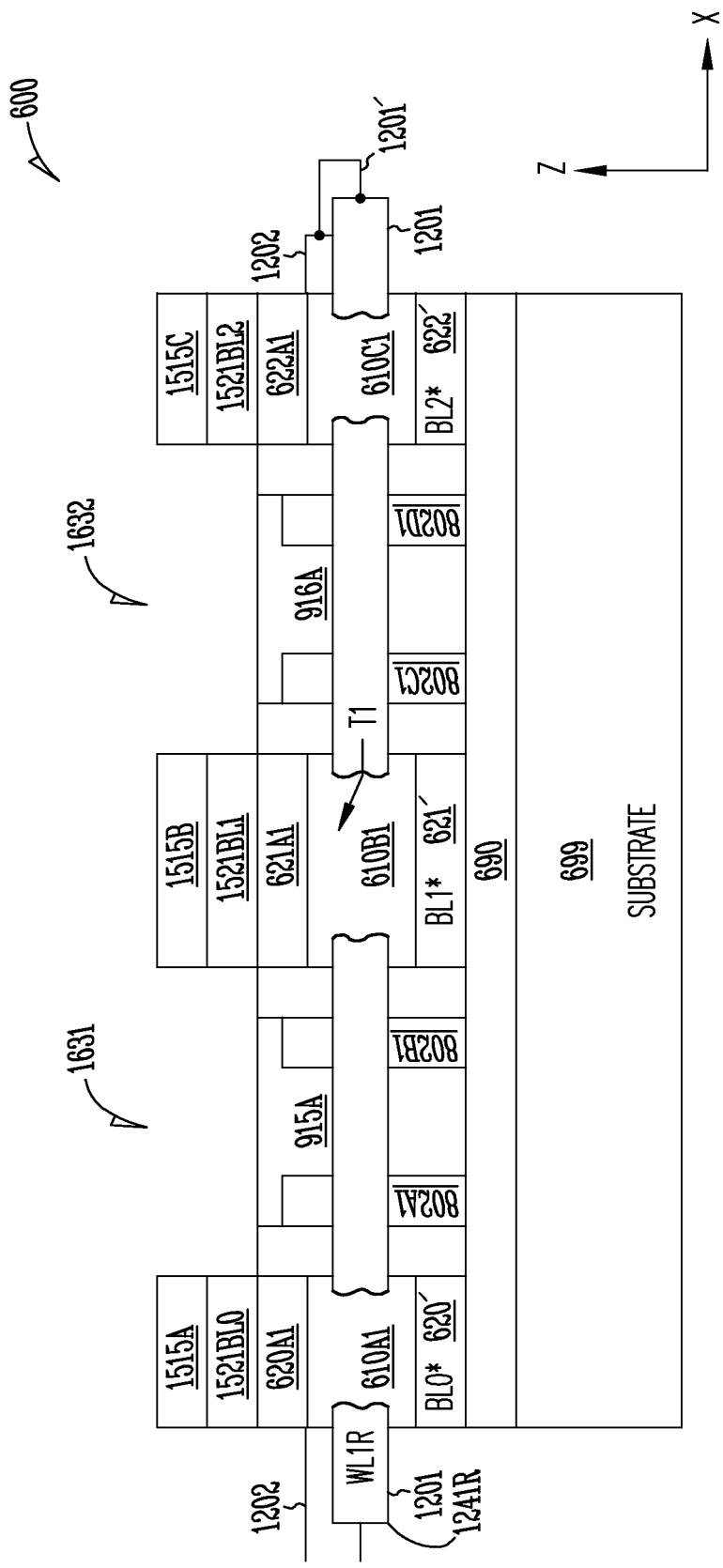

FIG. 16 shows memory device 600 after openings (e.g., trenches) 1631 and 1632 are formed by removing part of conductive material 1521 and part of dielectric material 1515 at the locations of openings 1631 and 1632. The remaining part of dielectric material 1515 include portions 1515A, 151B, and 1515C. The remaining part of conductive material 1521 form data lines 1521BL0, 1521BL1, and 1521BL2 that can represent data lines 221 and 222, respectively, of memory device of 200 of FIG. 2.

FIG. 16 shows memory device 600 after a dielectric material 1715 and 1716 are formed in openings 1631 and 1632, respectively. Materials 1715 and 1716 can include an oxide material (e.g., silicon dioxide $SiO_2$). Another view of memory device 600 along line 18-18 is shown in FIG. 18.

Figure 17:
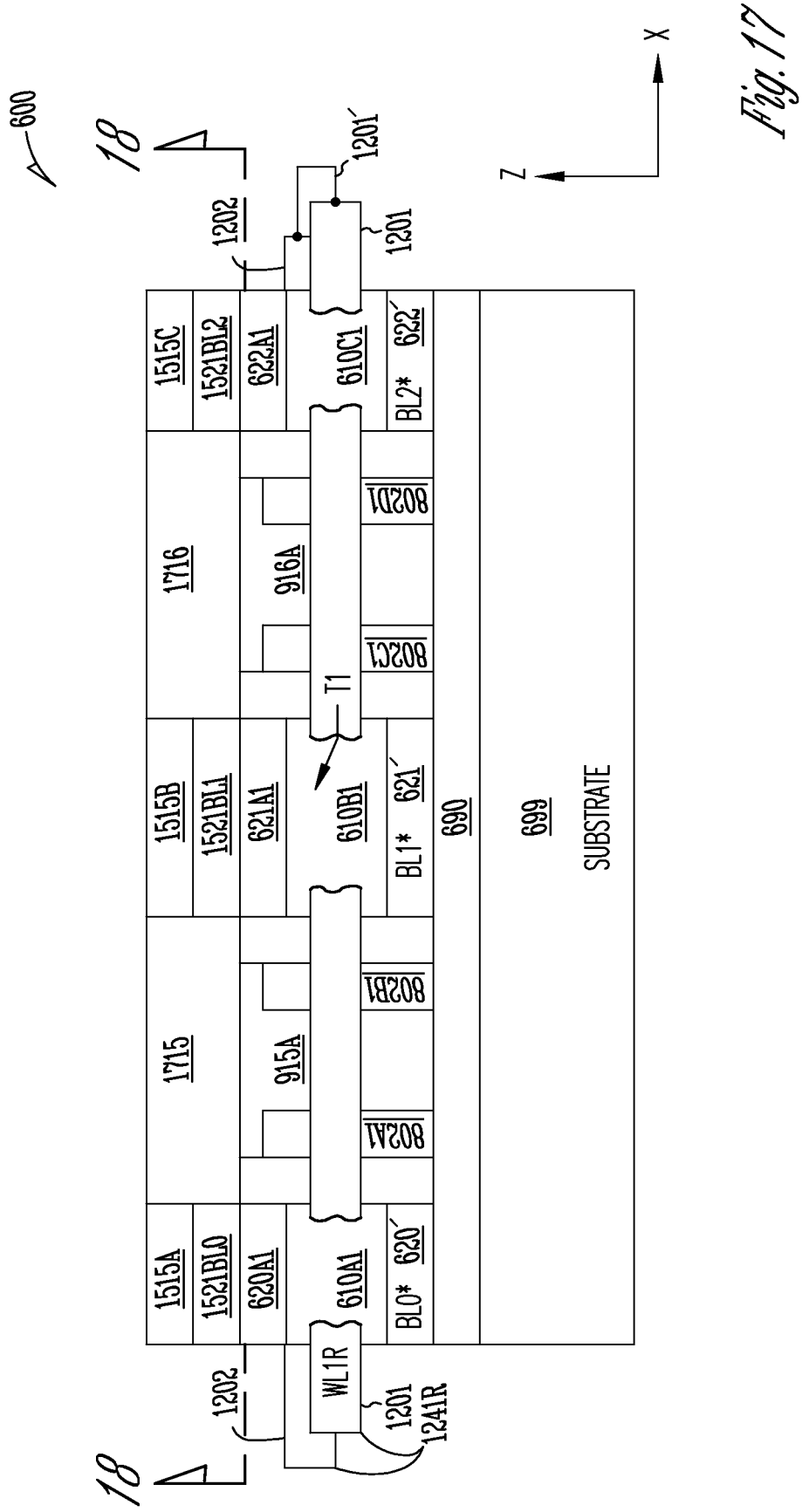
Figure 18:
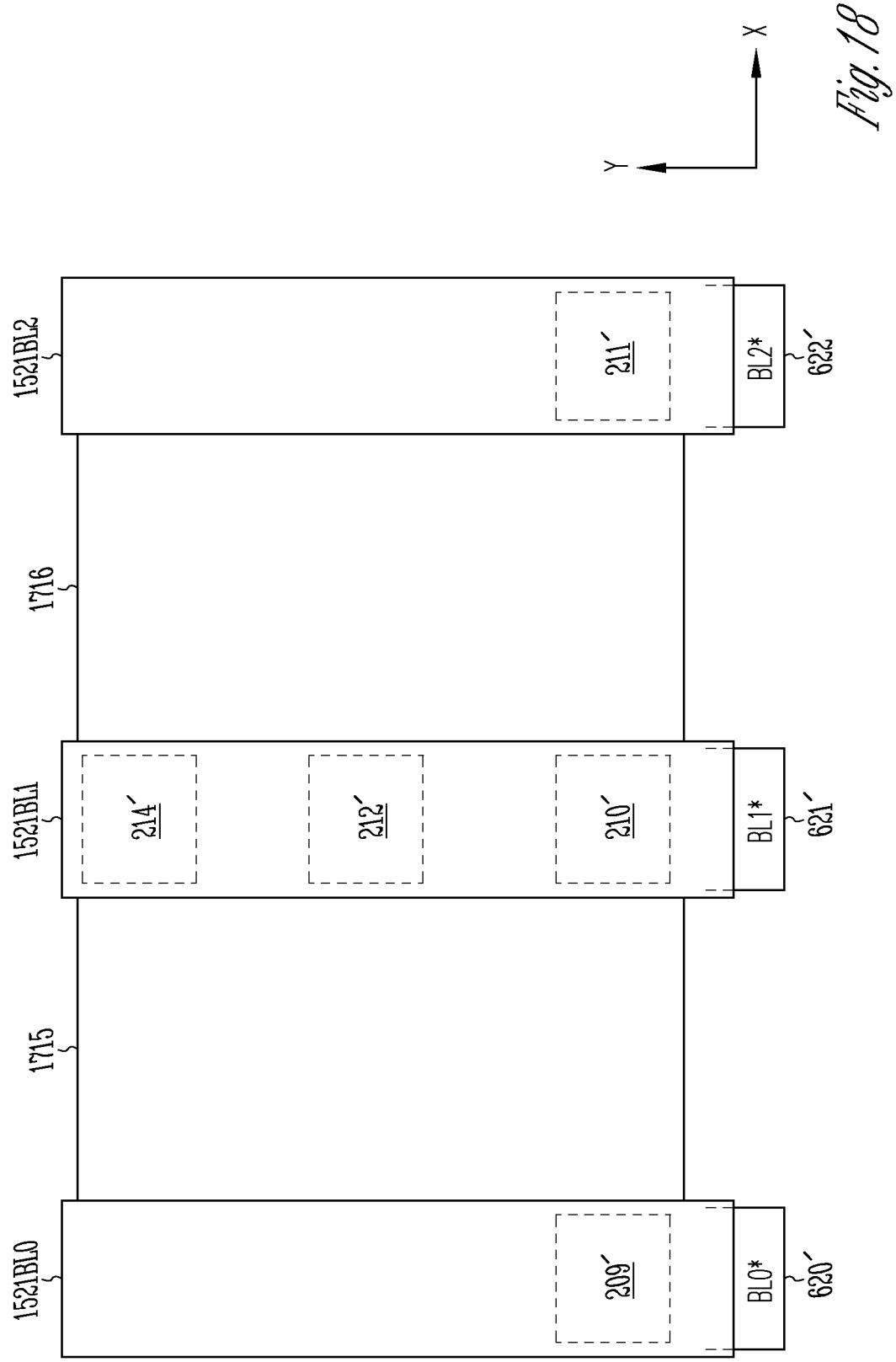

FIG. 18 shows a top view along line 18-18 with respect to the X-Y directions of memory device 600 of FIG. 17. As shown in FIG. 18, each of data lines 1521BL0, 1521BL1, and 1521BL2 can be structured as a conductive line that has a length in the Y-direction, which is the same as the direction of the length of each of data lines 620', 621', and 622' (which are underneath (in the Z-direction) respective data lines 1521BL0, 1521BL1, and 1521BL2). FIG. 18 also shows relative locations of memory cells 209', 210, 211', 212', and 214' located underneath (in the Z-direction) respective data lines 1521BL0, 1521BL1, and 1521BL2 and between data lines 1521BL0, 1521BL1, and 1521BL2 and data lines 620', 621', and 622' of memory device 600.

Figure 19:
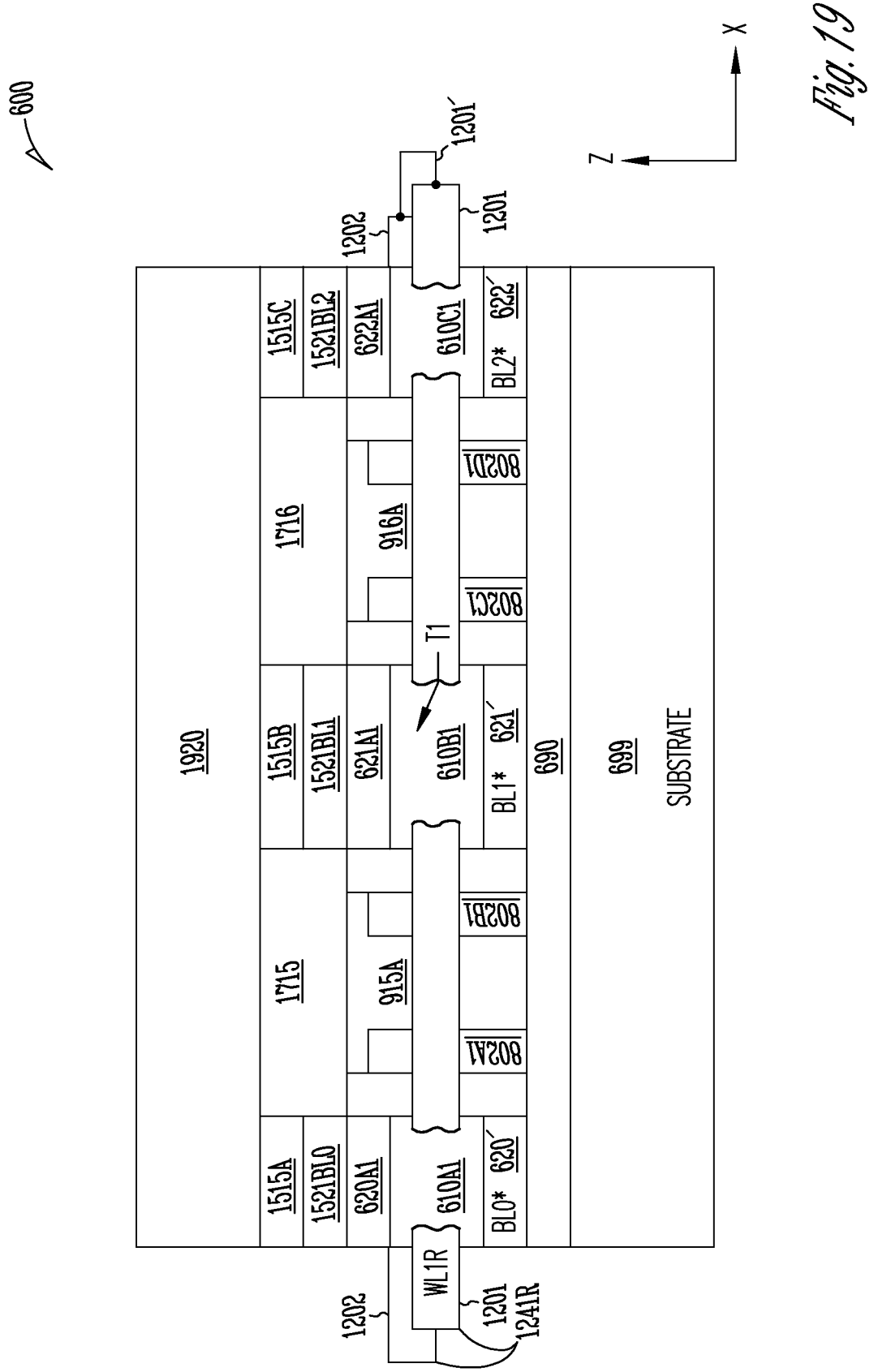

FIG. 19 shows memory device 600 after a material (or materials) 1920 is formed (e.g., deposited) over portions 1515A, 1515B, 1515C, and over dielectric materials 1715 and 1716. Material 1920 can include semiconducting material. The semiconducting material can include an oxide material. Examples of the oxide material include semiconducting oxide materials, transparent conductive oxide materials, and other oxide materials.

As an example, material 1920 can include at least one of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide ($TiO_x$), zinc oxide nitride ($Zn_xO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), and indium gallium silicon oxide (InGaSiO), and gallium phosphide (GaP).

The materials listed above are examples of materials 520 and 521. However, other materials (e.g., a relatively high band-gap material) different from the above-listed materials can be used.

Using the material listed above in memory device 200 provides improvement and benefits for memory device 200 over some other materials. For example, during a read operation to read information from a selected memory cell (e.g., memory cell 210 or 211), charge from charge storage structure 202 of the selected memory cell may leak (e.g., leak to transistor T2) of the selected memory cell. Using the material listed above for the channel region (e.g., material 520 or 521) of transistor T2 can reduce or prevent such a leakage. This improves accuracy of information read from the selected memory cell and improves the retention of information stored in the memory cells of the memory device (e.g., memory device 200) described herein.

Figure 20:
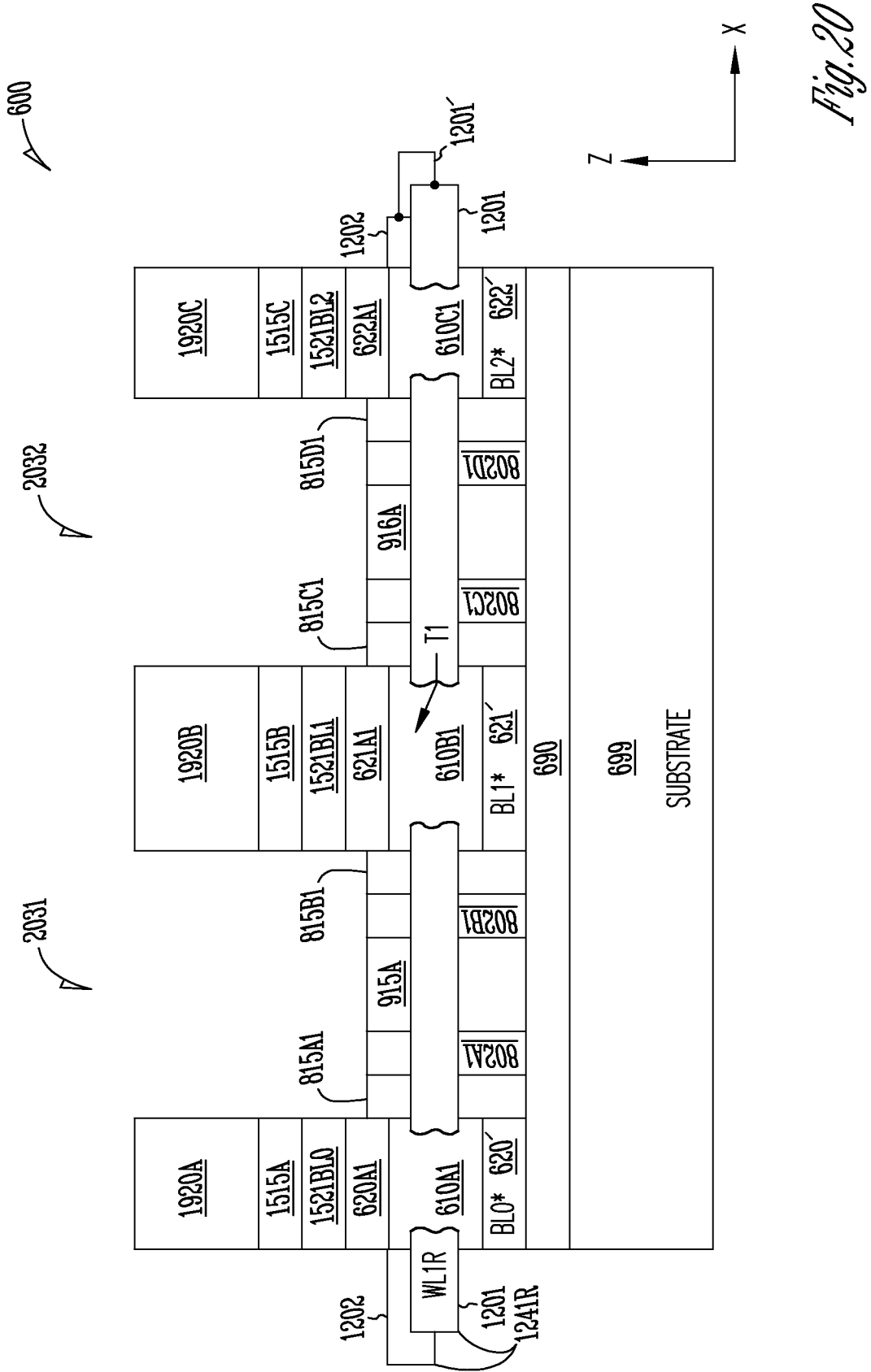

FIG. 20 shows memory device 600 after openings (e.g., trenches) 2031 and 2032 are formed by removing part of material 1920 (FIG. 19), materials 1715 and 1716, part of each of portions 915A and 915B, and part of each of dielectric materials 815A1, 815B1, 815C1, and 815D1. Portions 1920B1, 1920B2, and 1920B3 are remaining part of material 1920 after part of material 1902 (at the locations of openings 2031 and 2031) was removed. The processes in FIG. 20 also include exposing portions 802A1, 802B1, 802C2, and 802D1 at respective openings 2031 and 2032.

Figure 21:
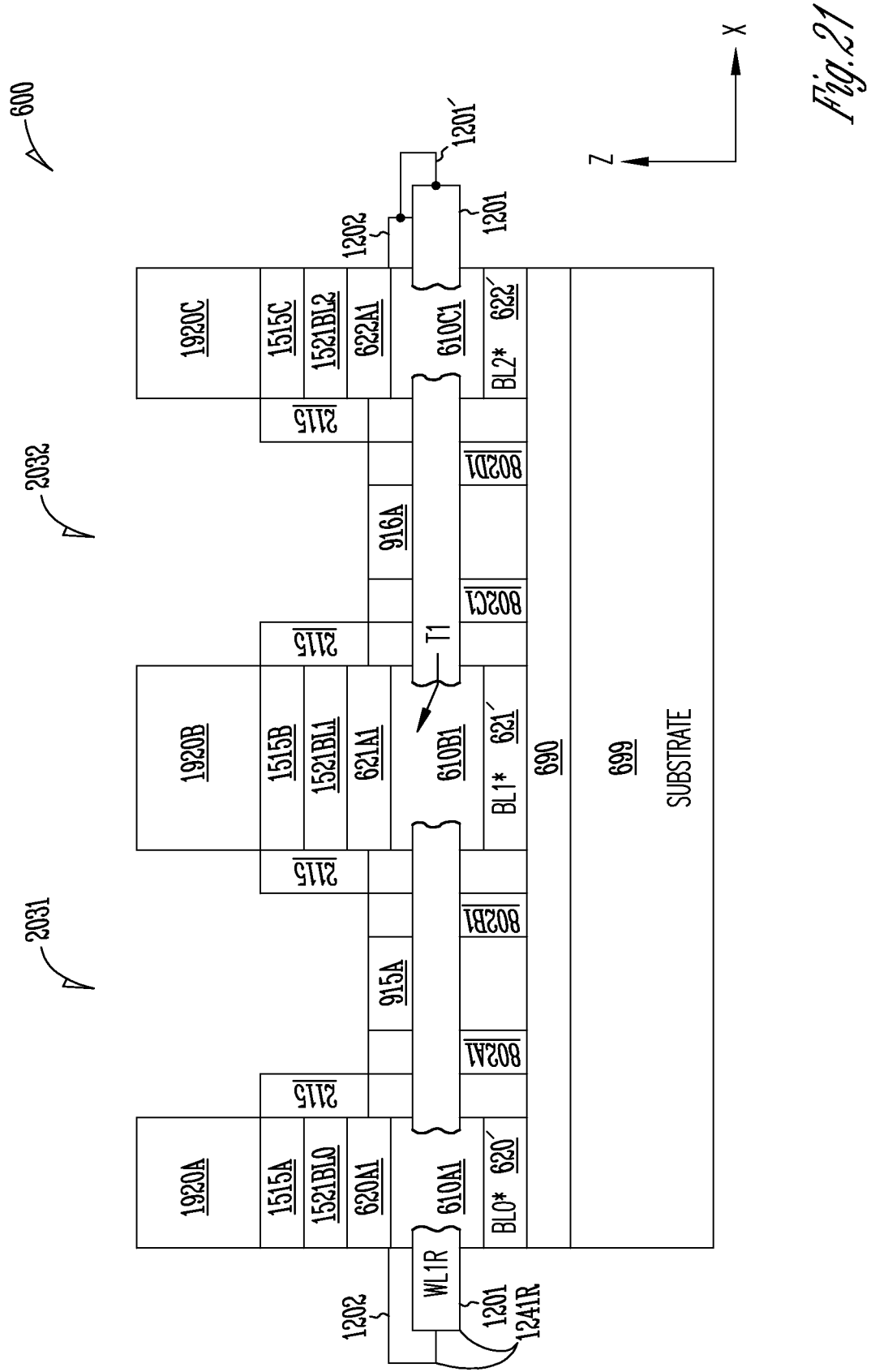

FIG. 21 shows memory device 600 after dielectric materials 2115 are formed. Dielectric materials 2115 can include an oxide material (e.g., silicon dioxide $SiO_2$).

Figure 22:
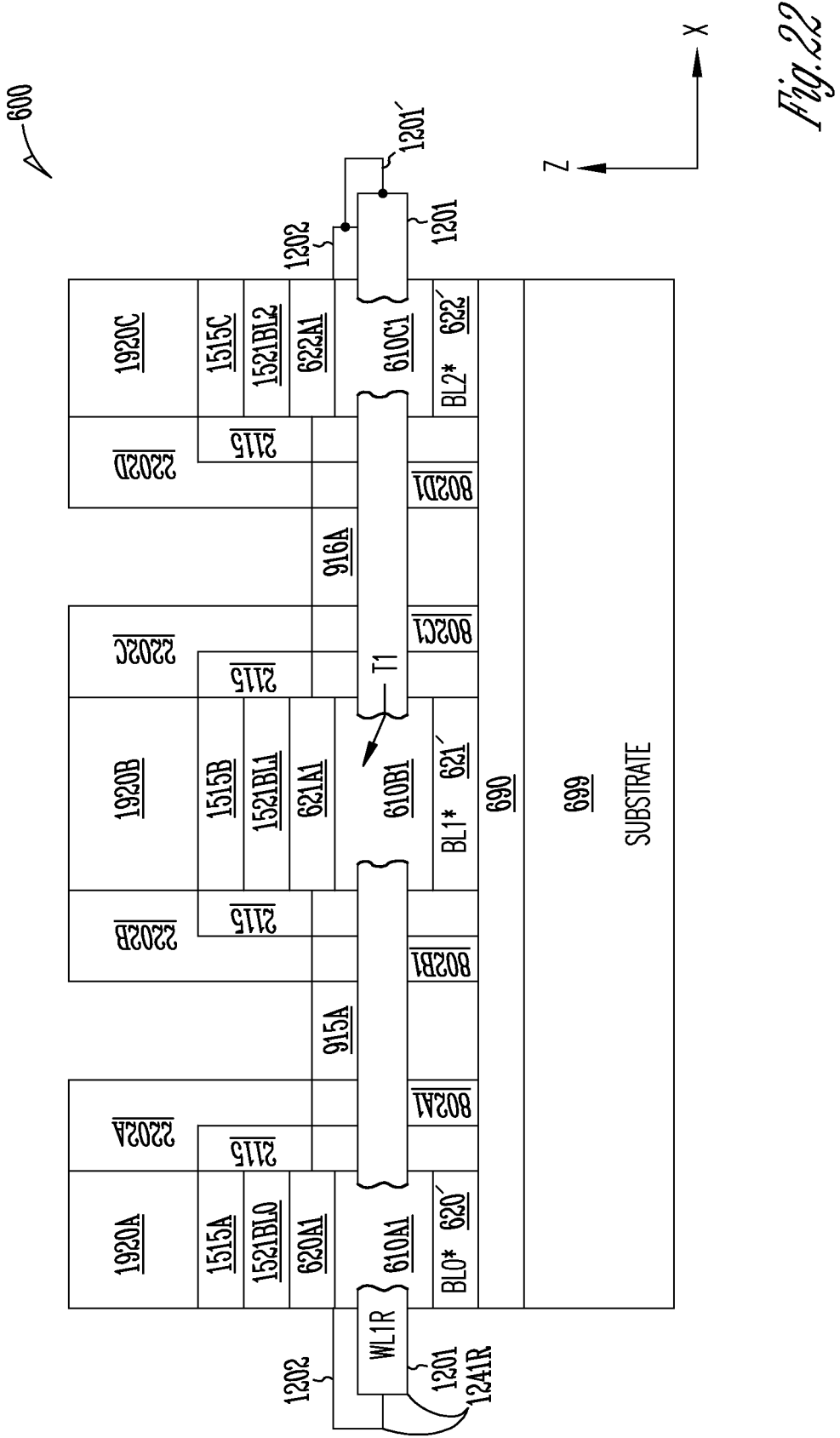

FIG. 22 shows memory device 600 after conductive materials 2202A, 2202B. 2202C, and 2202D are formed. Conductive materials 2202A, 2202B, 2202C, and 2202D can include metal or other conductive materials. As shown in 21, conductive materials 2202B and 2202C can contact portions 1920B. Conductive materials 2202B and 2202C can also contact portions 802B1 and 802C1, respectively. Thus, materials 2202B and 2202C can electrically couple portion 1920B to portions 802B1 and 802C1. Similarly, conductive material 2202A can contact portion 1902A and portion 802A1 and electrically couples portion 1920A to portions 802A1. Conductive material 2202D can contact portion 1902D and portion 802D1 and electrically couples portion 1920D to portion 801D1.

Figure 23:
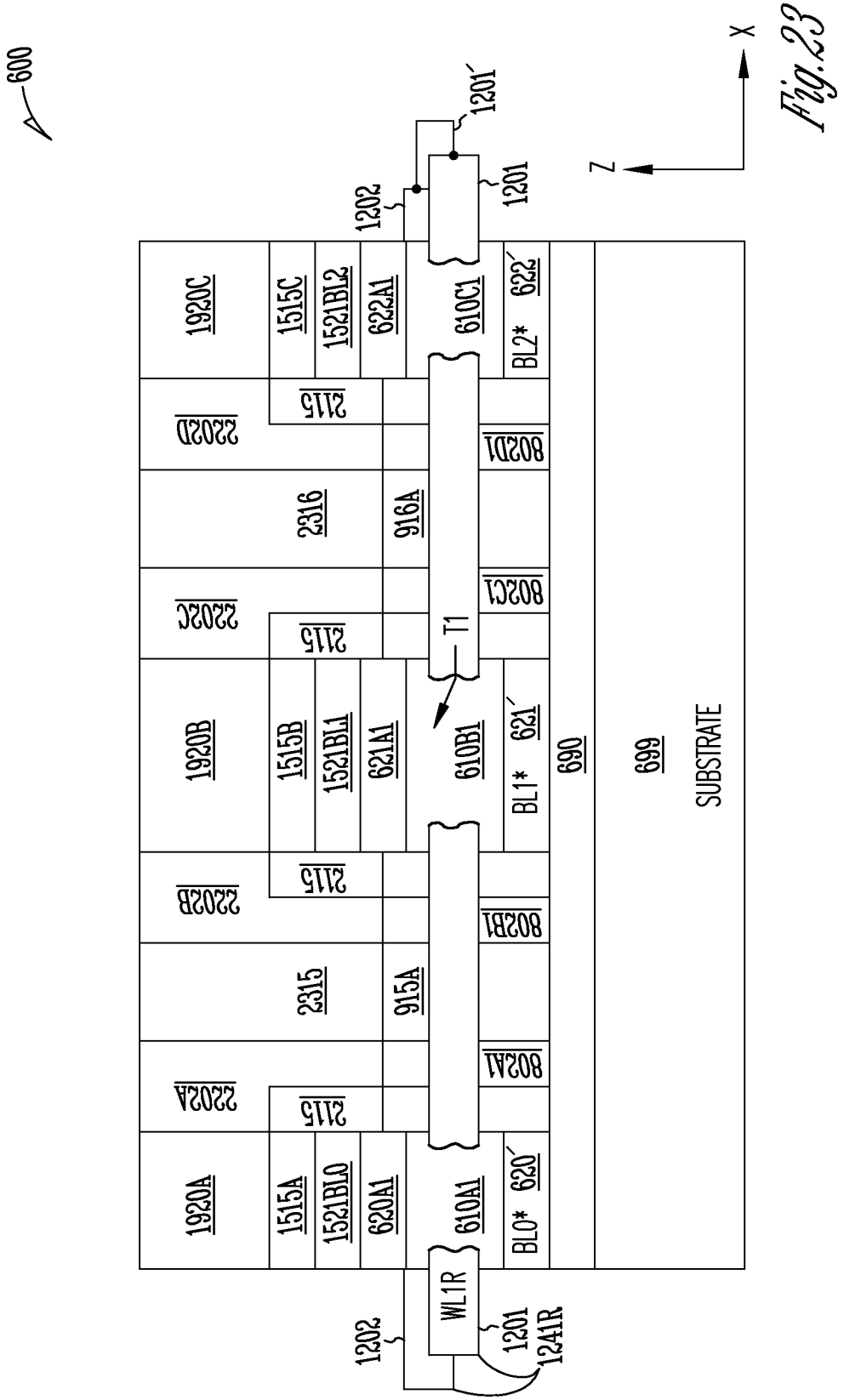

FIG. 23 shows memory device 600 after dielectric materials 2315 and 2316 are formed. Materials 2315 and 2316 can include an oxide material (e.g., silicon dioxide $SiO_2$).

Figure 24:
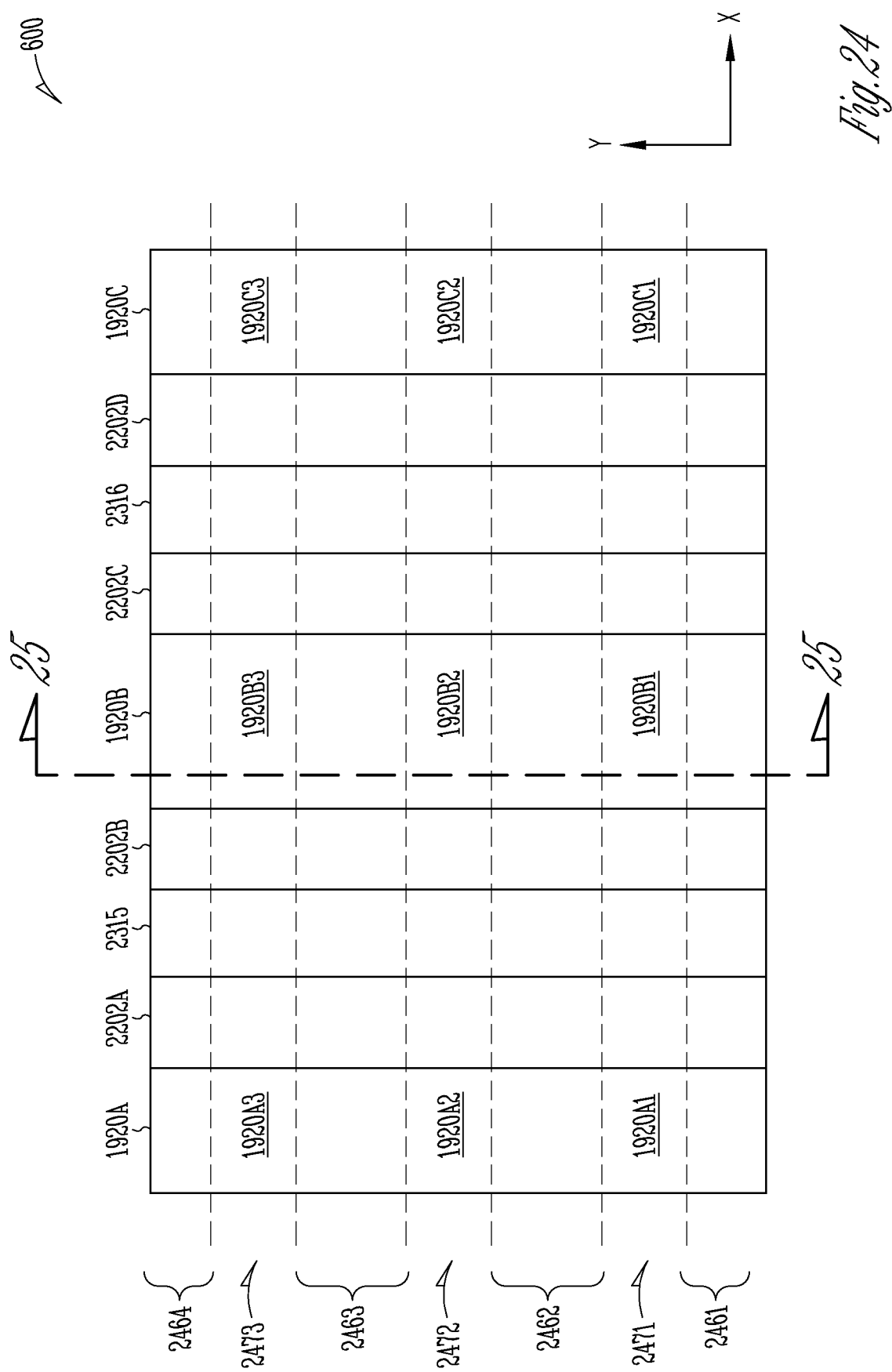

FIG. 24 shows a top view respect to the X-Y directions of memory device 600 of FIG. 23. For simplicity, the description of the elements shown in FIG. 24 (which are described with reference to FIG. 23) is not repeated. As shown in FIG. 24, the elements of memory device 600 can include strips (e.g., lines) of materials having lengths extending in the Y-direction. Subsequent processes of forming memory device 600 can include removing (e.g., cutting (e.g., etching)) in the Z-direction) the materials at locations 2461, 2462, 2463, and 2464 (2461-2464) down to the level of dielectric materials 1515A, 1515B, and 1515C and stop at or above the level of data lines 1521BL0, 1521BL1, and 1521BL2 (FIG. 23). This way, data lines 1521BL0, 1521BL1, and 1521BL2 (which have lengths extending in the Y-direction) will remain extending continuously in the Y-direction.

In FIG. 24, after part of the materials at locations 2461-2464 are removed, portions 1920A1, 1920A2, and 1920A3 will be remaining portions of materials 1920A; portions 1920B1, 1920B2, and 1920B3 will be remaining portions of materials 1920B; and portions 1920C1, 1920C2, and 1920C3 will be remaining portions of materials 1920C. Another view of memory device 600 along line 25-25 is shown in FIG. 25.

Figure 25:
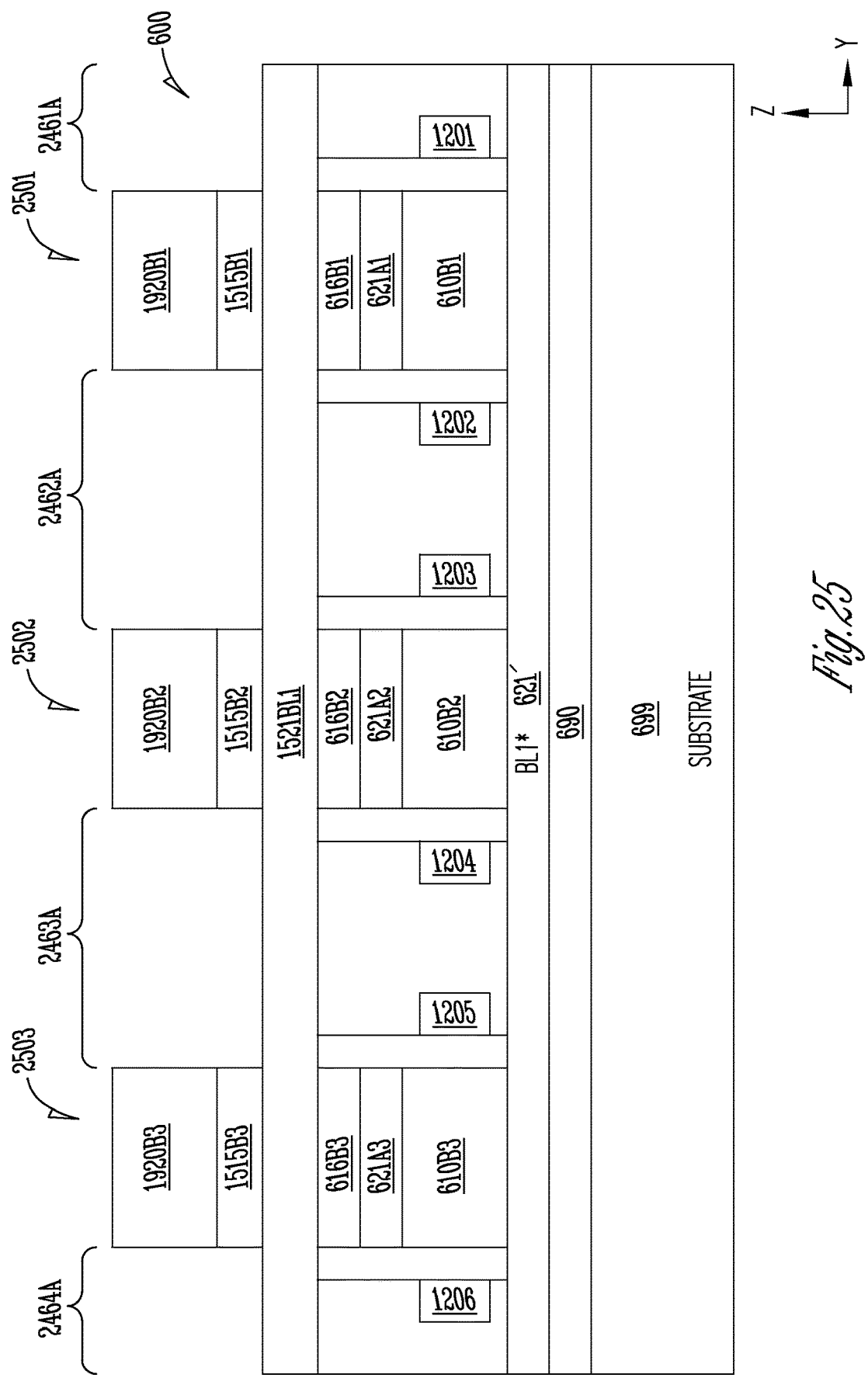

FIG. 25 shows a side view along line 25-25 of FIG. 24 with respect to the Y-Z directions after openings (e.g., trenches) 2461A, 2462A, 2463A, and 2464A (2461A-2464A) are formed at locations 2461, 2462, 2463, and 2464 (FIG. 24), respectively. As shown in FIG. 25, the structure (e.g., materials) at locations 2461-1064 were removed, stopping at (down to) data line 1521BL1, such that material of data line 1521BL1 is not removed. Openings 2461A-2464A can be formed by removing part of each of materials at locations 2461-2464 (as mentioned above). In FIG. 25, portions 1515B1, 1515B2, and 1515B3 in the Y-direction are remaining part of portion 1515B (FIG. 23), and portions 1920B1, 1920B2, and 1920B3 in the Y-direction are remaining part of portion 1920B (FIG. 24). The materials of memory device 600 in FIG. 25 can include structures (e.g., protrusions (e.g., islands)) 2501, 2502, and 2503 extending outward from substrate 699. Each of structures 2501, 2502, and 2503 can be part of a memory cell in subsequent processes of forming memory device 600.

Figure 26:
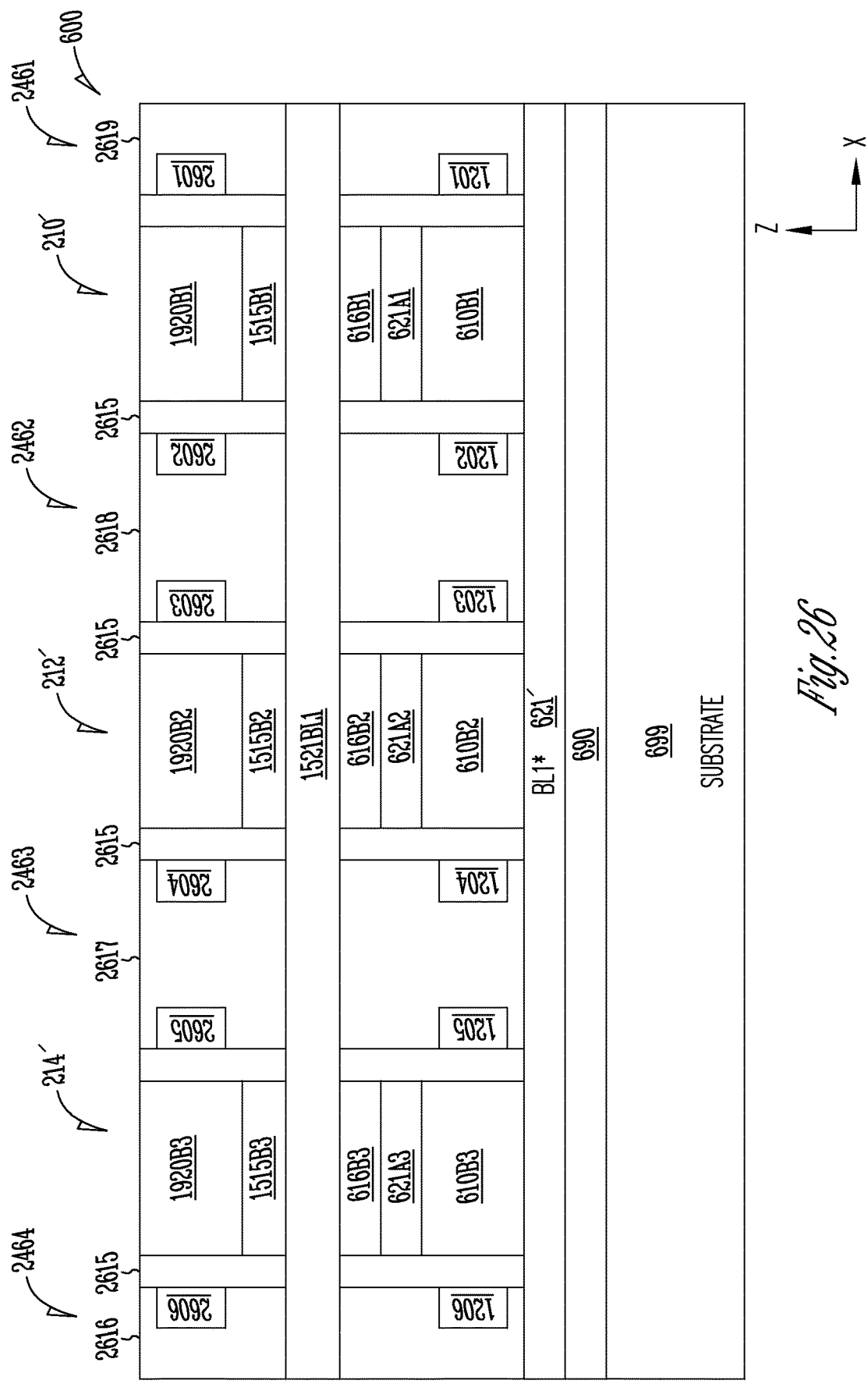

FIG. 26 shows memory device 600 after dielectric materials (e.g., gate oxides) 2615, conductive lines (e.g., conductive regions) 2601, 2602, 2603, 2604, 2605, and 2606 (2601-2606), and dielectric materials 2616, 2617, 2618, and 2619 (2616-2619) are formed in respective openings 2461A-2464A. Each of dielectric materials 2615 and 2616-2619 can include silicon dioxide or other dielectric materials. Each of conductive lines 2601-2606 can include metal, conductively doped polysilicon, or other conductive materials. Conductive lines 2601-1206 can form access lines (e.g., word lines) to access memory cells (e.g., memory cells 210', 212' and 214' of memory device 600). As mentioned above, memory cells 210', 212', and 214' of memory device 600 can memory cells 210, 212, and 214, respectively, of memory device 200 of FIG. 2.

In FIG. 26, conductive lines 2601 and 2602 can form part of an access line (e.g., word line) to access memory cell 210' and other memory cells of memory device 600. Such other memory cells can be located in the same row with memory cell 210' in the X-direction (e.g., memory cells 209' and 211', shown in FIG. 27). Conductive lines 2603 and 2604 in FIG. 26 can form part of an access line (e.g., word line) to access memory cell 212' and other memory cells of memory device 600. Conductive lines 2605 and 2606 in FIG. 26 can form part of an access line (e.g., word line) 2741 to access memory cell 214' and other memory cells of memory device 600.

Thus, as shown in FIG. 26, conductive line 2601 can have a portion adjacent a side (e.g., right side in the Y-direction) of the channel region (e.g., portion 1920B1) of memory cell 210'. Conductive line 2602 can have a portion adjacent another side (e.g., left side (opposite from the right side) in the Y-direction) of the channel region (e.g., portion 1920B1) of memory cell 210'.

Similarly, conductive lines 2603 and 2604 can have respective portions (e.g., respective conductive regions) adjacent respective sides (opposite sides) in the Y-direction of a channel region (e.g., read channel region) of memory cell 212'. Conductive lines 2605 and 2606 can have respective portions (e.g., respective conductive regions) adjacent respective sides (opposite sides) in the Y-direction of a channel region (e.g., read channel region) of memory cell 214'. Another view of memory device 600 along line 27-27 is shown in FIG. 27.

FIG. 27 shows a side view along line 27-27 of FIG. 26 with respect to the X-Z directions. In FIG. 27, conductive lines 2601 and 2602 are partially shown to avoid obstructing some parts of the other the elements of memory device 600. As shown in FIG. 27, each of conductive lines 2601 and 2602 can have a length in the X-direction, a width in the Z-direction, and a thickness (e.g., less than the width) in the Y-direction (shown in FIG. 26).

In FIG. 27, portions (conductive portions) 2202A1, 2202B1, 2202C1, and 2202D 1, are the remaining part of conductive materials 2202A, 2202B, 2202C, and 2202D, respectively, of FIG. 24 after part of each of conductive materials 2202A, 2202B. 2202C, and 2202D was removed (e.g., cut) in the processes of FIG. 25 (and before conductive lines 2601-2606 are formed in the processes of FIG. 26). As shown in 27, portions 2202B1 and 2202C1 can contact portions 1920B1 and contact portions 802B1 and 802C1, respectively, such that portions 2202B1 and 2202C1 form a conductive coupling that electrically couple portions 1920B1 to portions 802B1 and 802C1. Conductive material 2202A1 can contact portions 1920A1 and 802A1 and forms a conductive coupling that electrically couple portion 1920A1 to portion 802A1. Conductive material 2202D1 can contact portions 1920D1 and 802D1 and forms a conductive coupling that electrically couple portion 1920D1 to portion 802D1.

Portions (dielectric portions) 2315A and 2316A are the remaining part of dielectric materials 2315 and 2316, respectively, of FIG. 24 after part of each of dielectric materials 2315 and 2316 was removed (e.g., cut) in the processes of FIG. 25 (and before conductive lines 2601-2606 are formed in the processes of FIG. 26).

Portions 1920A1, 1920B1, and 1920C1 are the remaining part of portions 1920A, 1920B, and 1920C, respectively, of FIG. 24 after part of each of portions 1920A, 1920B, and 1920C was removed (e.g., cut) in the processes of FIG. 25 (and before conductive lines 2601-2606 are formed in the processes of FIG. 26).

In FIG. 27, portion 1920B1 can form a channel region (e.g., write channel region) of a transistor T2 of memory cells 210'. Transistor T2 of FIG. 27 can represent transistor T2 of memory cell 210 of memory device 200 of FIG. 2. Portion 1920A1 (FIG. 13) can form a channel region (e.g., write channel region) of a transistor T2 of memory cells 209'. Portion 1920C1 can form a channel region (e.g., write channel region) of a transistor T2 of memory cells 211'. Each of portions 1920A, 1920B, and 1920C can include a piece of material (e.g., semiconductor material) that is part of material 1920 formed in the process in FIG. 19.

In FIG. 27, conductive lines 2601 and 2602 can be part of an access line (e.g., word line) 1241W (which can receive a signal (e.g., word line signal) WL1W to access memory cell 209', 210' and 211' of memory device 600 during an operation of memory device 600. For example, a signal (e.g., WL1W) on conductive lines 2601 and 2602 can be used to control (e.g., turn on or turn off) transistor T2 of memory cell 210'.

The processes of forming memory device 600 in FIG. 27 can include forming a conductive connection 2601' (which can include a conductive material (e.g., metal)) to electrically couple conductive lines 2601 and 2602 to each other. Similarly, the processes of forming memory device 600 can include forming a conductive connection (not shown) to electrically couple conductive lines 2603 and 2604 (FIG. 12) to each other, and forming a conductive connection (not shown) to electrically couple conductive lines 2605 and 2606 (FIG. 12) to each other.

Thus, as shown in FIG. 27, access line 1241W of memory device 600 in FIG. 27 can include conductive lines 2601 and 2602 having respective portions located adjacent respective sides of a channel region (e.g., write channel region) of a respective memory cell (e.g., 209, 210', or 211').

For example, conductive line 2601 can have portion adjacent a side (e.g., front side in the Y-direction) of channel regions (e.g., portion 1920A1) of memory cell 209'. Conductive line 2602 can have a portion adjacent another side (e.g., backside (opposite from the front side) in the Y-direction) of the channel region (e.g., portion 1920A1) of memory cell 209'.

Conductive line 2601 can have portion adjacent a side (e.g., front side in the Y-direction) of channel regions (e.g., portion 1920B1) of memory cell 210'. Conductive line 2602 can have a portion adjacent another side (e.g., backside (opposite from the front side) in the Y-direction) of the channel region (e.g., portion 1920B1) of memory cell 210'.

Conductive line 2601 can have portion adjacent a side (e.g., front side in the Y-direction) of channel regions (e.g., portion 1920C1) of memory cell 211'. Conductive line 2602 can have a portion adjacent another side (e.g., backside (opposite from the front side) in the Y-direction) of the channel region (e.g., portion 1920C1) of memory cell 211'.

The processes of forming memory device 600 in FIG. 27 can also include forming a conductive connection 2701' (which can include a conductive material (e.g., metal)) to electrically couple connections 2601' and 1201' to each other. Thus, conductive lines 1201, 1202, 2601, and 2602 can be electrically coupled to each other, such that transistors T1 and T2 of memory cell 210' can share the same access line (e.g., the combination of access lines 1241R and 1241W), which includes conductive lines 1201, 1202, 2601, and 2602. Therefore, in the structure of memory device shown in FIG. 27, signal WL1R and WL1W can be the same signal because conductive lines 1201, 1202, 2601, and 2602 are electrically coupled to each other (through conductive connections 1201', 2601', and 2701. In an alternative structure of memory device 600, conductive connection 2701' can be omitted (e.g., not formed). In such an alternative structure of memory device 600, signals WL1R and WL1W are different signals and can be activated at different times. For example, in such an alternative structure of memory device 600, signal WL1R can be activated (and signal WL1W is deactivated) during a read operation to control transistor T1 of memory cell 210'. In another example, signal WL1W can be activated (and signal WL1R is deactivated) during a write operation to control transistor T2 of memory cell 210'.

Figure 28:
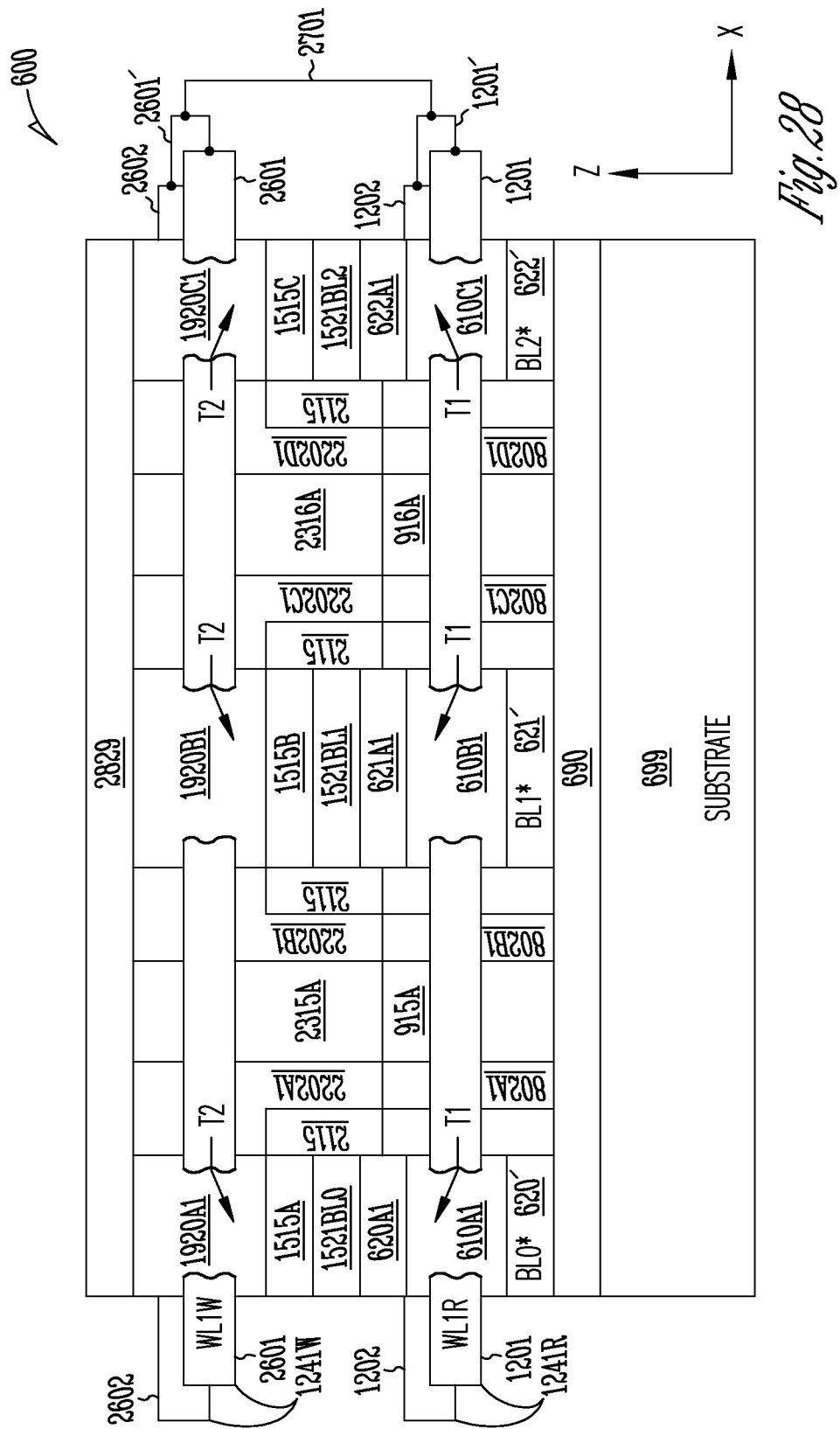

FIG. 28 shows memory device 600 after a conductive material 2829 is formed. Conductive material 2829 can include metal or other conductive materials.

Figure 29:
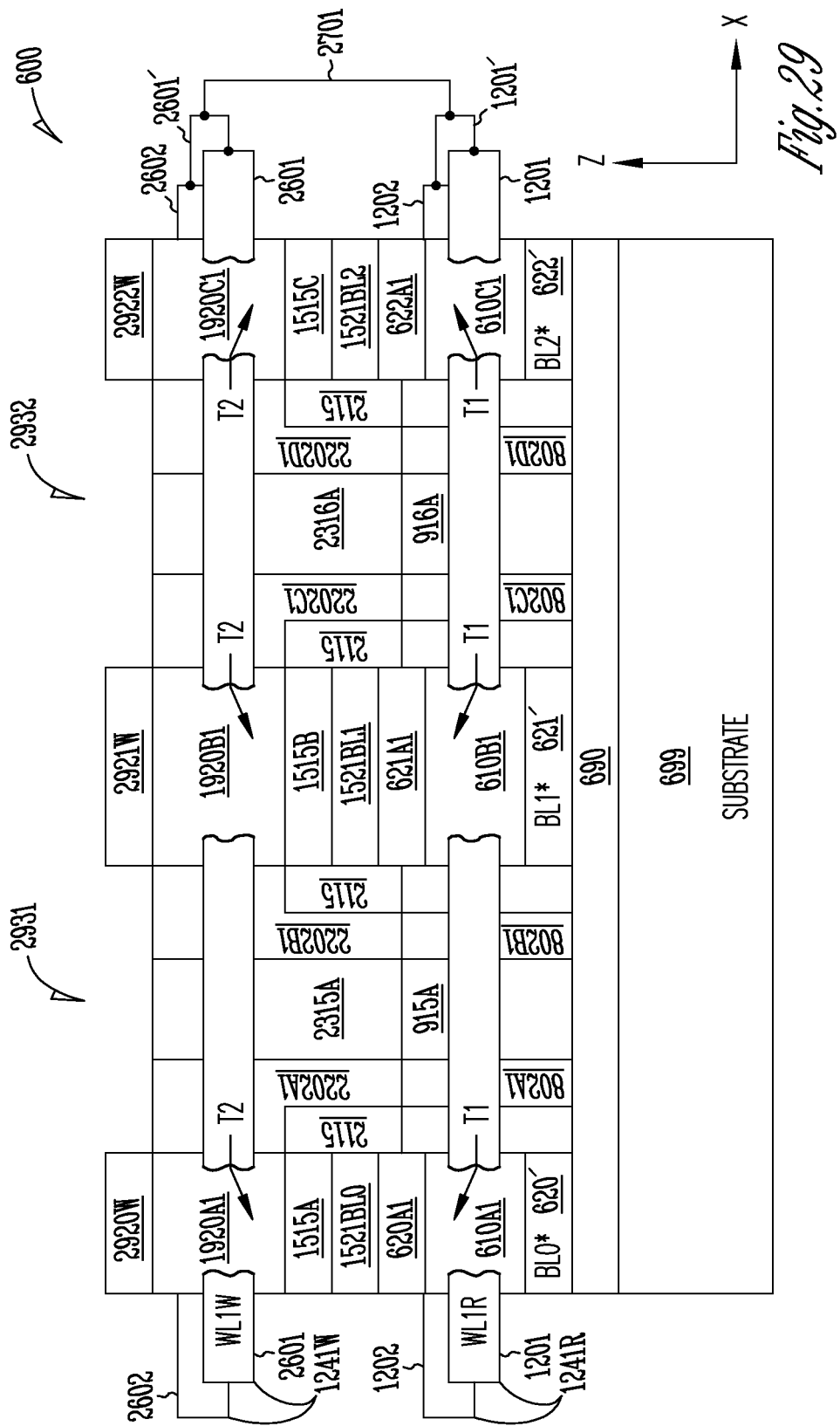
Figure 30:
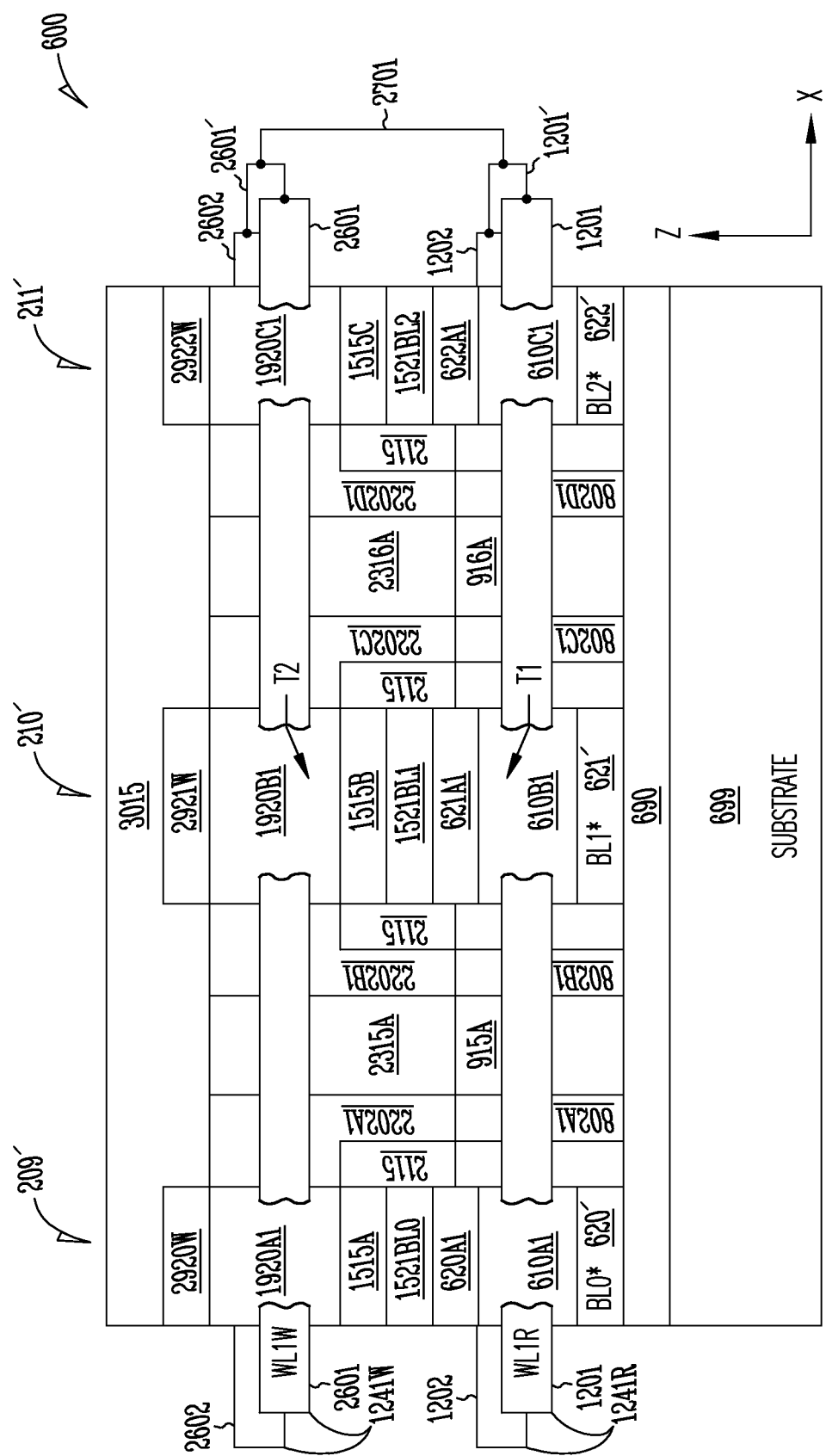

FIG. 29 shows memory device 600 after openings 2931 and 2932 and data lines (e.g., write data lines) 2920W, 2921W, and 2922W are formed. Forming data lines 2920W, 2921W, and 2922W can include removing part of conductive material 2829 at the locations of openings 2931 and 2932. The remaining part of conductive material 2829 form conductive lines (e.g., conductive regions) which are data lines 2920W. 2921W, and 2922W. Each of data lines 2920W, 2921W, and 2922W can have a length the Y-direction. As shown in FIG. 29, data lines 2920W, 2921W, and 2922W can contact (can be electrically coupled to) a respective portion (e.g., write channel region) 1902A1, 1902B1, or 1902C1. Data lines 2921W and 2922W can represent data lines 221W and 222W of memory device 200 of FIG. 2.d FIG. 30 shows memory device 600 after a dielectric material 3015 is formed over other elements of memory device 600. The processes of forming memory device 600 can include other processes that are not described in this description so as to not obscure the embodiments described herein.

As shown in FIG. 30, memory device 600 can include memory cells 209', 210', and 211' that can include transistors (e.g., transistors T1) and respective channel regions (e.g., read channel regions) formed from portions 610A1, 610B1, and 610C1; transistors (e.g., transistors T2) and respective channel regions (e.g., write channel regions) formed from portions 1920A1, 1920B1 and 1920C1; charge storage structures (e.g., memory elements) formed from portions 802A1, 802B1, 802C1, and 802D1 where portions 802B1 and 802C can form the charge storage structure of transistor T1 of memory cell 210'; and conductive couplings 2202A 1, 2202B1, 2202C1, and 2202D1 that electrically couple the channel regions (e.g., portions 1920A 1, 1920B1 and 1920C1) of transistors T2 to respective charge storage structures (e.g., portions 802A1, 802B1, 802C1, and 802D1).

Memory device 600 of FIG. 30 can include data lines (e.g., read data lines) 1521BL0, 1521BL1, and 1521BL2; and data lines (e.g., write data lines) 2920W, 2921W, and 2922W). Memory device 600 can include conductive lines 1201, 1202, 2601, and 2602 that can be electrically coupled to each other to form an access line (e.g., a single access line) to control both transistors (e.g., T1 and T2) of each of memory cells 209'. 210', and 211'. Other elements of memory device 600 are described above with reference to FIG. 6 through FIG. 30.

FIG. 31 through FIG. 35 show different views of elements during processes of forming memory device 3100, according to some embodiments of the invention. Some or all of the processes used to form memory device 600 can be used to form memory device 200 described above with reference to FIG. 2 through FIG. 5.

The processes of forming memory device 3100 can be similar to or identical to some of the processes of forming memory device 600 described above with reference to FIG. 6 through FIG. 30. Thus, for simplicity, the processes of forming similar or identical elements between memory device 600 and 3100 are not repeated.

Figure 31:
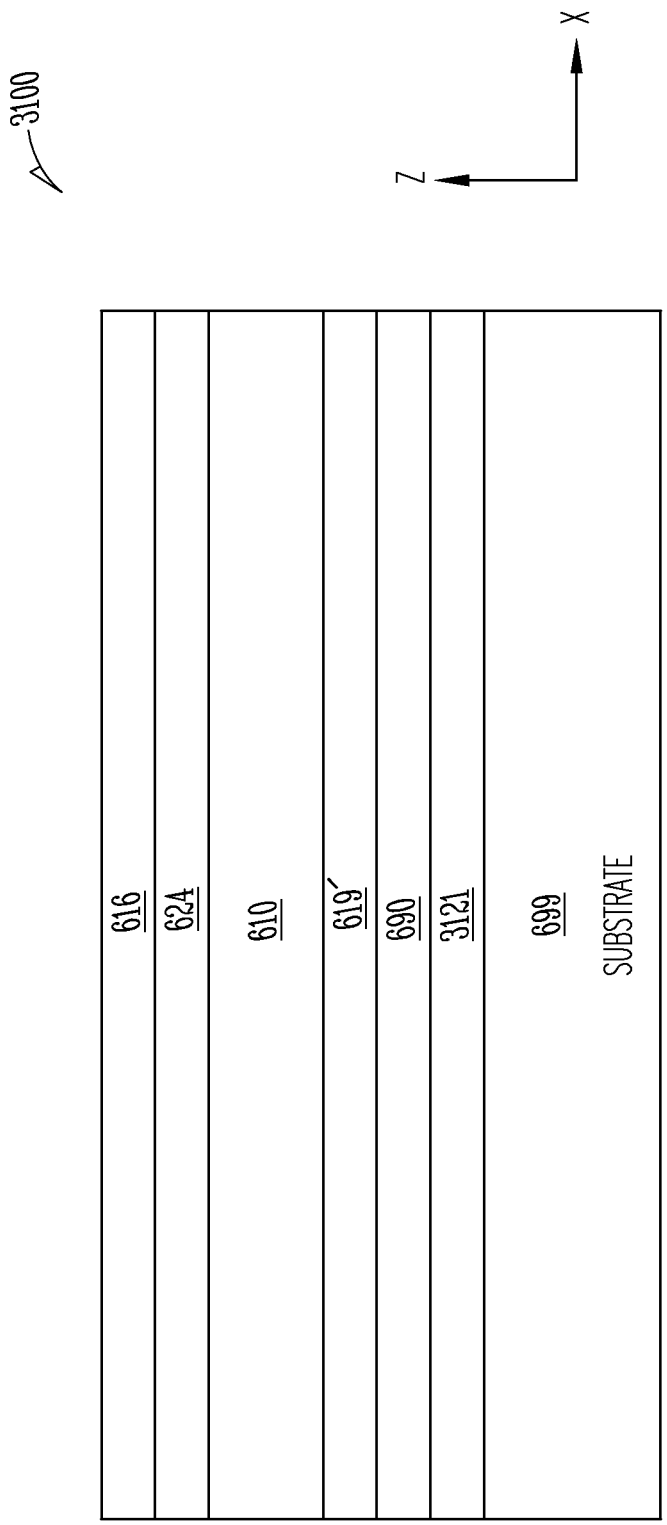
FIG. 31 through FIG. 35 show different views of elements during processes of forming another memory device, according to some embodiments of the invention.

FIG. 31 show memory device 3100 after a conductive material 3121, a dielectric material 690, conductive material 619', material 610, conductive material 624, and dielectric material 616 are formed in respective levels (e.g., layers) in the Z-direction over a substrate 699. Conductive material 3121 can include metal, conductively doped polysilicon, or other conductive materials.

Figure 32:
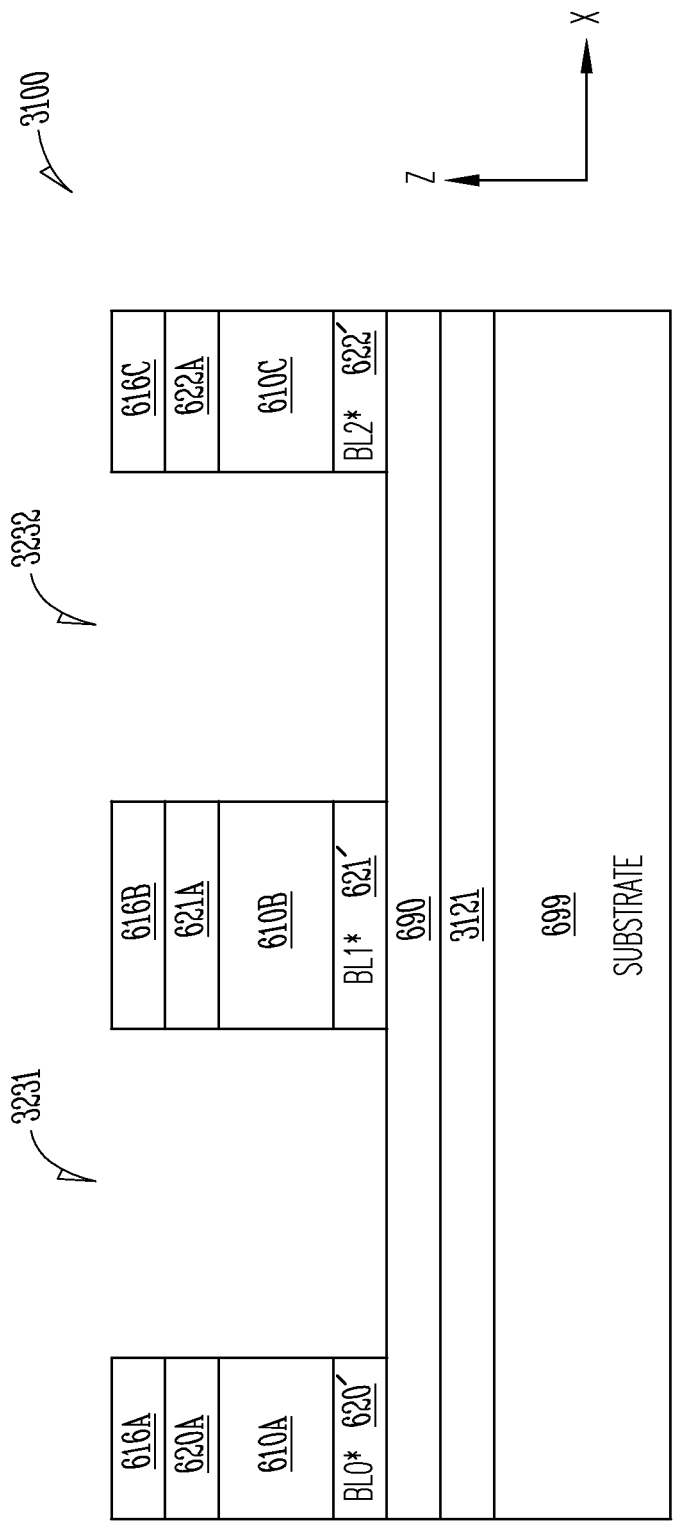

FIG. 32 shows memory device 3100 after openings (e.g., trenches) 3231 and 3232, and data lines (e.g., read data lines) 620', 621', and 622' are formed.

Figure 33:
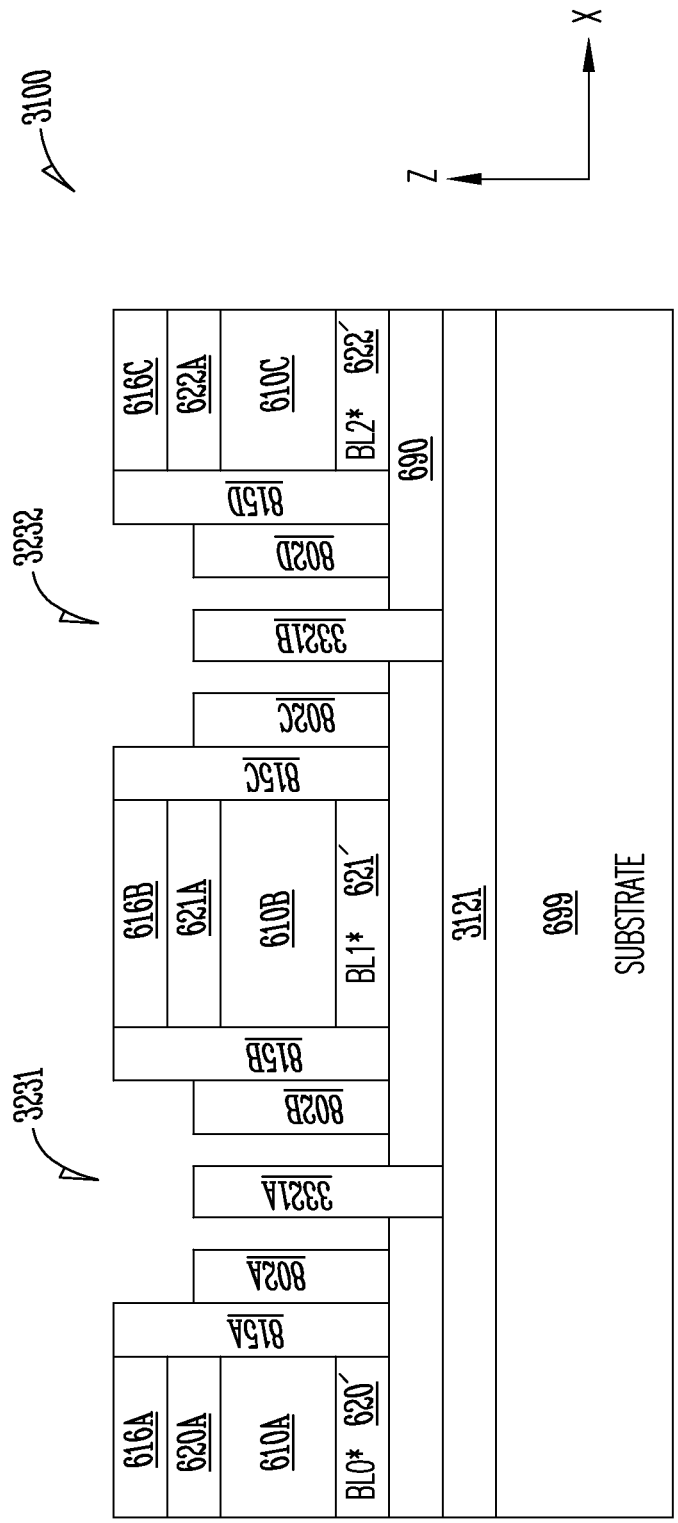

FIG. 33 shows memory device 3100 after dielectric materials 815A, 815B, 815C, and 815D (815A-D), materials 802A, 802B, 802C, and 802D, and conductive materials 3321A and 3321B are form in respective openings 3231 and 3232. As shown in FIG. 33, conductive materials 3321A and 3321B can be formed, such that conductive materials 3321A and 3321B can contact (e.g., can be electrically coupled to) conductive material 3121. Conductive material 3121 can be a conductive region (or alternatively a conductive line) formed over (e.g., formed in or formed on) substrate 699. Thus, conductive materials 3321A and 3321B can contact a conductive region (conductive material 3121) that is formed underneath (below) memory cells 209', 210', and 211' and over at least a portion of substrate 699. Conductive material 3121 can be coupled to ground connection (not shown) of memory device 600.

Figure 34:
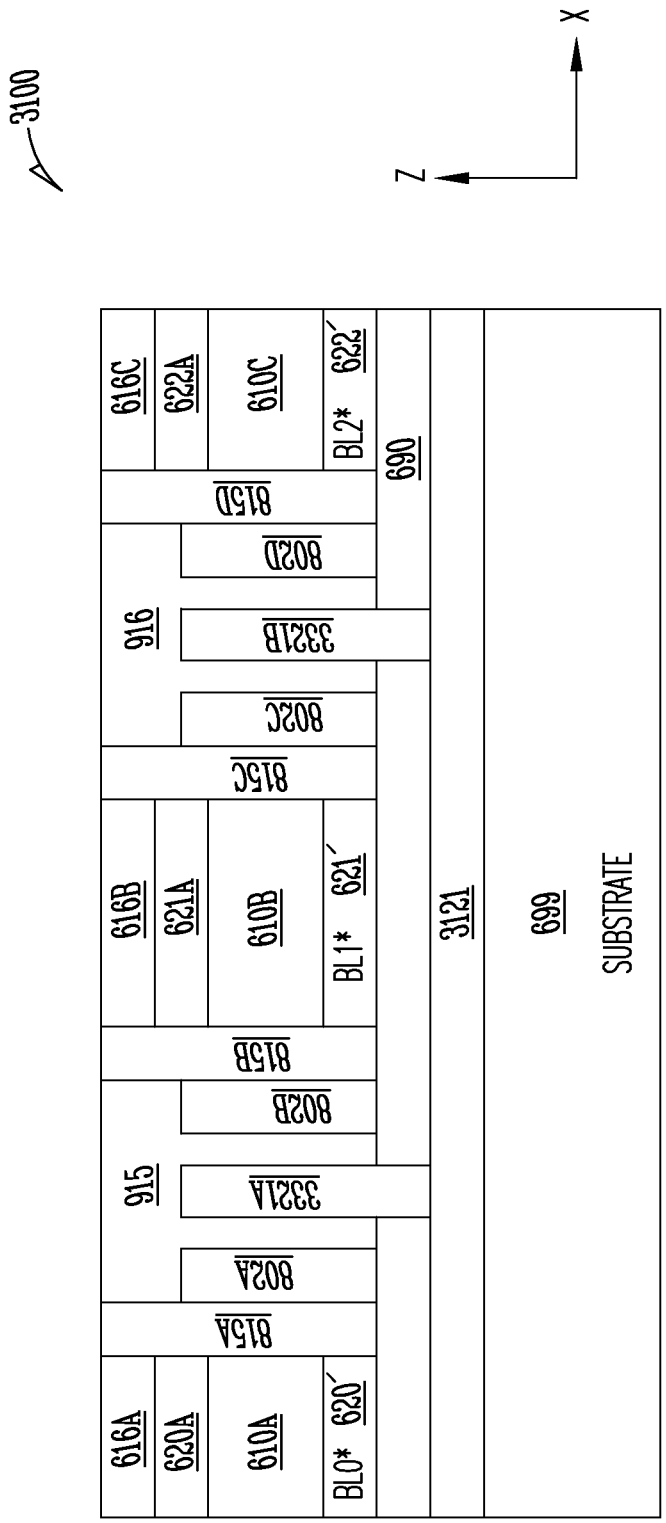

FIG. 34 shows memory device 3100 after dielectric materials 915 and 916 are formed (e.g., filled) in respective openings 3231 and 3232. The structure show in FIG. 34 can be subsequently processed to form part of respective memory cells of memory device 3100. The subsequent processes can be similar to or identical to the processes of forming memory device 600 described above with reference to FIG. 10 through FIG. 30.

Figure 35:
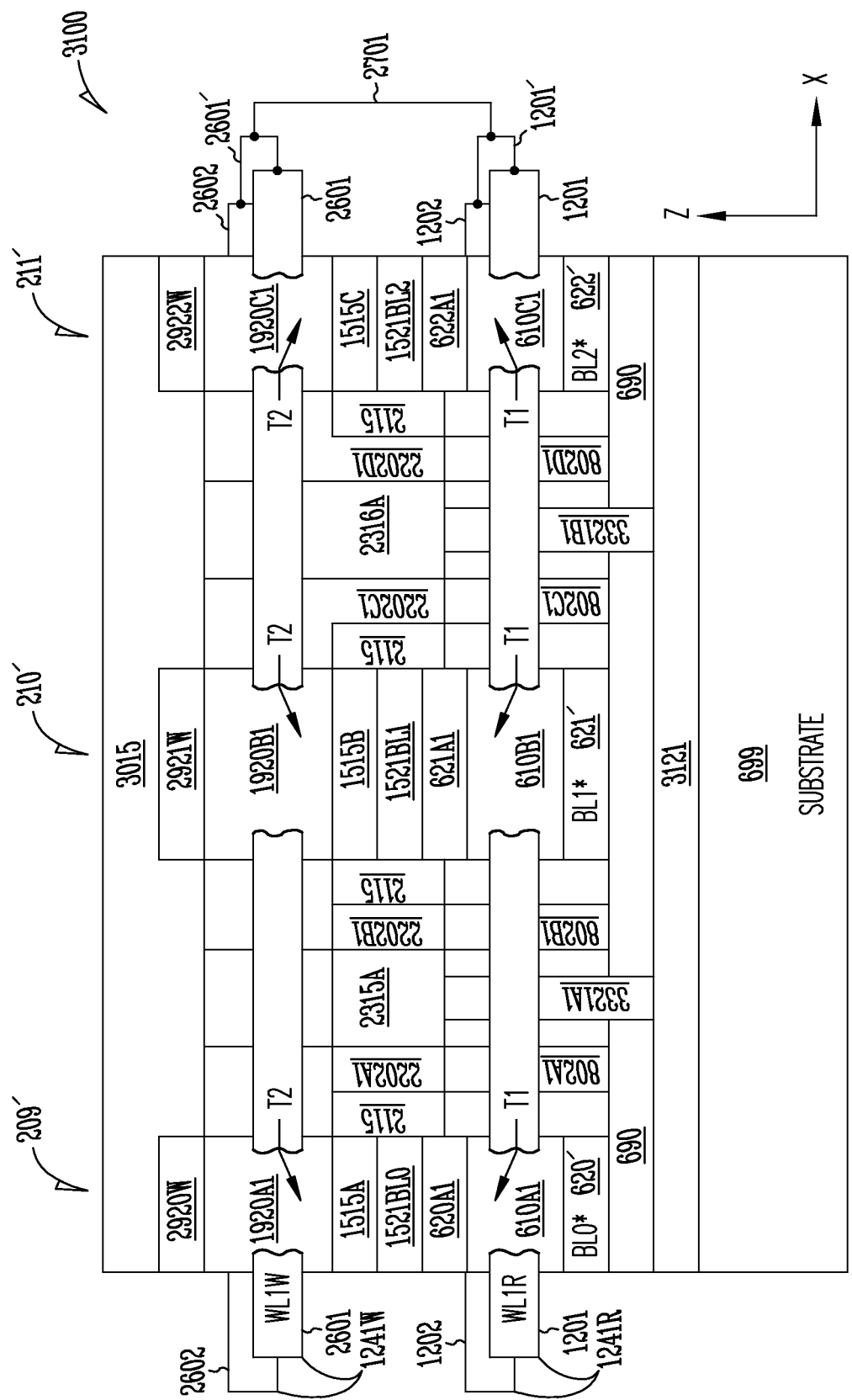

FIG. 35 shows memory device 3100 after other elements are formed. As shown in FIG. 35, the elements of memory device 3100 can be similar to or identical the elements of memory device 600 of FIG. 30. Differences between memory device 600 (FIG. 30) and memory device 3100 (FIG. 35) include the inclusion of conductive structures 3321A1 and 3321B1 that are part of conductive materials 3321A and 3321B, respectively, formed in the processes of FIG. 33. As shown in FIG. 35, conductive structure 3321A can be adjacent portion 802A1 (a portion of the memory element) of memory cell 209' and adjacent portion 802B1 (a portion of the memory element) of memory cell 210'. Conductive structure 3321B can be adjacent portion 802C1 of (another portion of the memory element) of memory cell 210' and adjacent portion 802D1 (a portion of the memory element) of memory cell 211'.

In comparing with memory device 600, the inclusion of conductive structures 3321A1 and 3321B1 in memory device 3100 in FIG. 35 can reduce electrical coupling between charge storage structures of neighbor memory cells (e.g., between the charge storage structures of memory cells 209' and 210', and between the charge storage structures memory cells 210' and 211'). In comparison with memory device 600, the reduced coupling in memory device 3100 can lead to a relatively greater voltage range for read windows for each of the memory cells of memory device 3500.

Figure 36A:
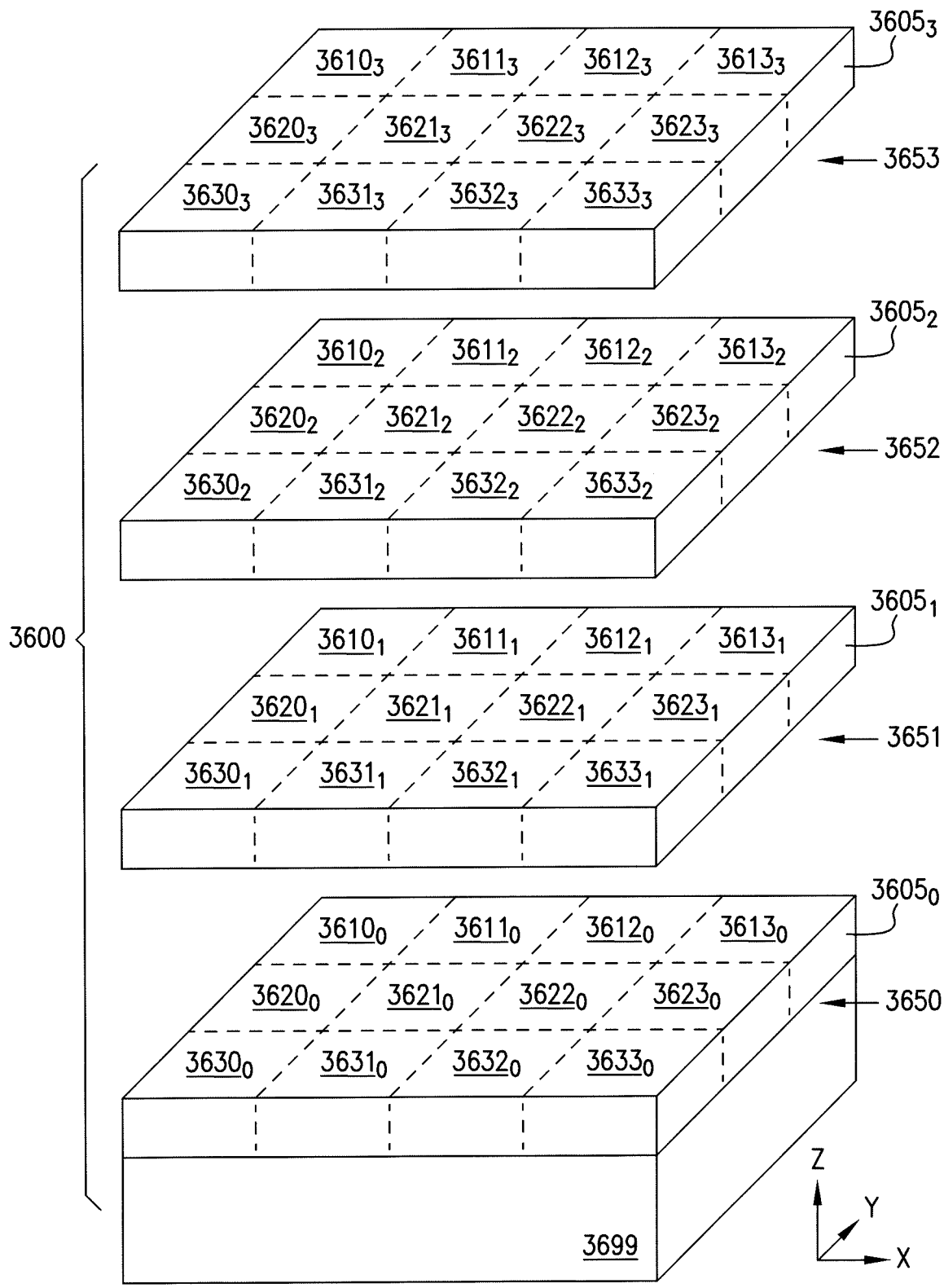
FIG. 36A, FIG. 36B, and FIG. 36C show different views of a structure of a memory device including multiple decks of memory cells, according to some embodiments described herein.
Figure 36B:
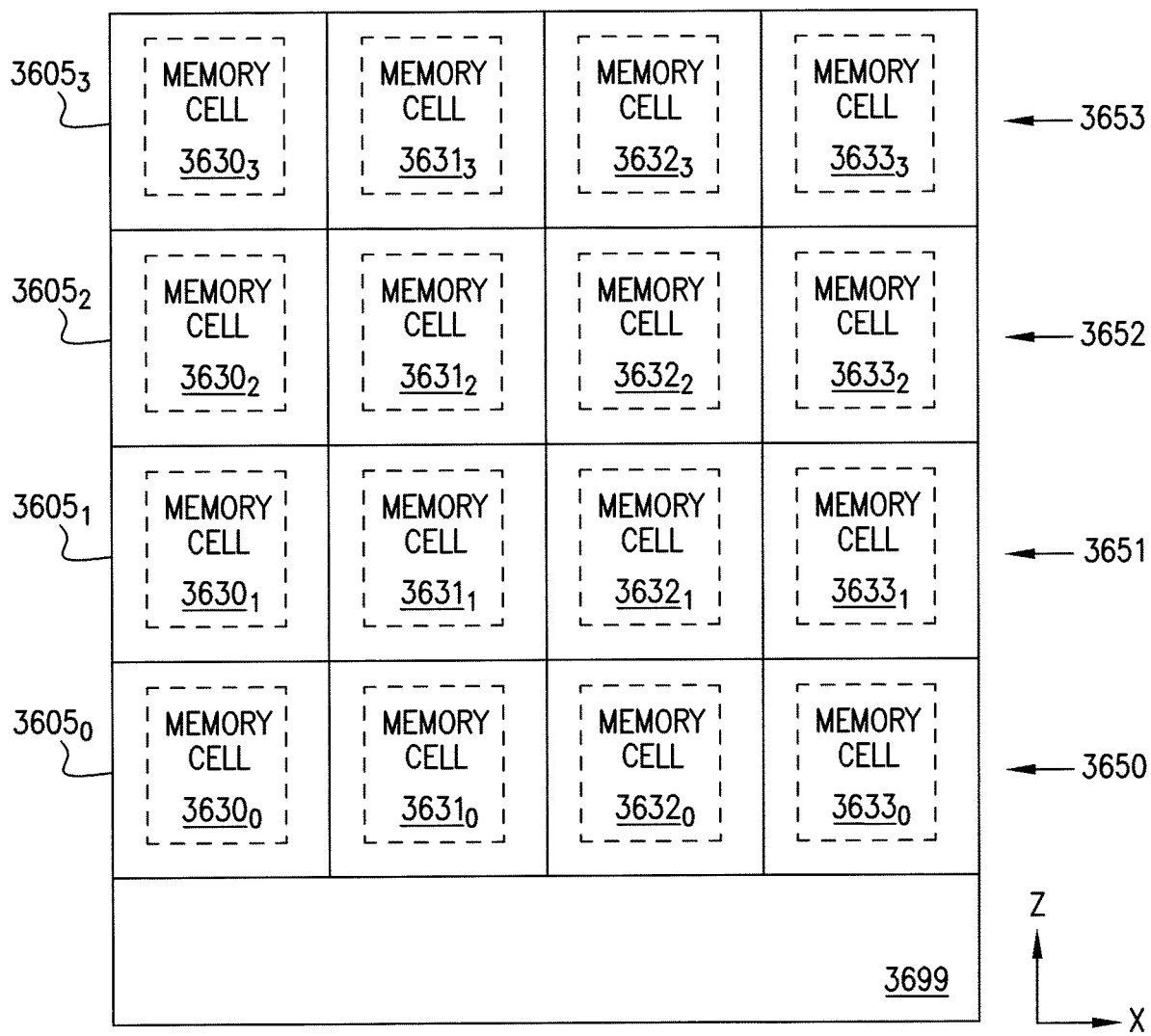
Figure 36C:
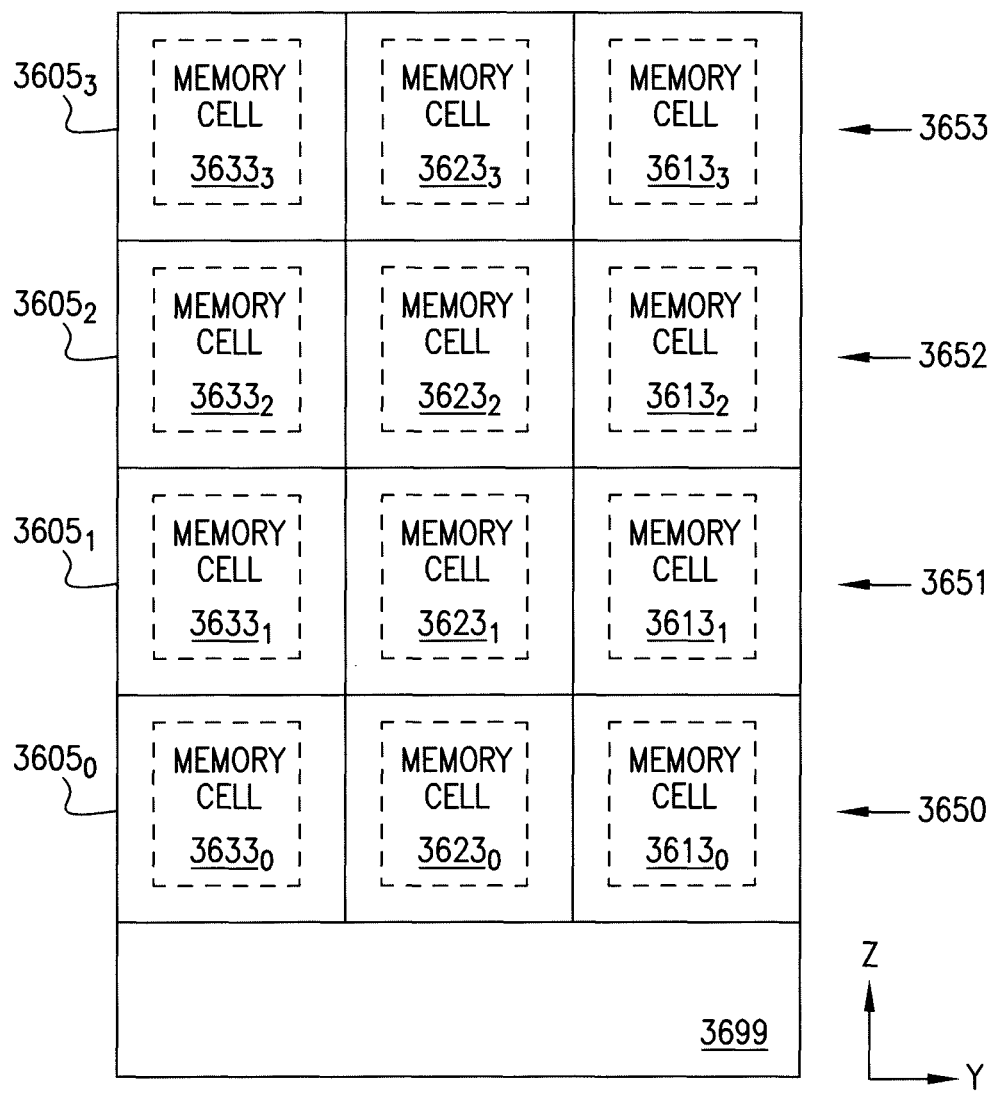

FIG. 36A, FIG. 36B, and FIG. 36C show different views of a structure of a memory device 3600 including multiple decks of memory cells, according to some embodiments described herein. FIG. 36A shows an exploded view (e.g., in the Z-direction) of memory device 3600. FIG. 36B shows a side view (e.g., cross-sectional view) in the X-direction and the Z-direction of memory device 360. FIG. 36C shows a side view (e.g., cross-sectional view) in the Y-direction and the Z-direction of memory device 3600.

As shown in FIG. 36A memory device 3600 can include decks (decks of memory cells) $3605_0$, $3605_1$, $3605_2$, and $3605_3$ that are shown separately from each other in an exploded view to help ease of viewing the deck structure of memory device 3600. In reality, decks $3605_0$, $3605_1$, $3605_2$, and $3605_3$ can be attached to each other in an arrangement where one deck can be formed (e.g., stacked) over another deck over a substrate (e.g., a semiconductor (e.g., silicon) substrate) 3699. For example, as shown in FIG. 36A, decks $3605_0$, $3605_1$, $3605_2$, and $3605_3$ can be formed in the Z-direction perpendicular to substrate 3699 (e.g., formed vertically in the Z-direction with respect to substrate 3699).

As shown in FIG. 36A, each of decks $3605_0$, $3605_1$, $3605_2$, and $3605_3$ can have memory cells arranged in the X-direction and the Y-direction (e.g., arranged in rows in the X-direction and in columns in the Y-direction). For example, deck $3605_0$ can include memory cells $3610_0$, $36110_0$, $3612_0$, and $3613_0$ (e.g., arranged in a row), memory cells $3620_0$, $3621_0$, $3622_0$, and $3623_0$ (e.g., arranged in a row), and memory cells $3630_0$, $3631_0$, $3632_0$, and $3633_0$ (e.g., arranged in a row).

Deck $3605_1$ can include memory cells $3610_1$, $3611_1$, $3612_1$, and $3613_1$ (e.g., arranged in a row), memory cells $3620_1$, $3621_1$, $3622_1$, and $3623_1$ (e.g., arranged in a row), and memory cells $3630_1$, $3631_1$, $3632_1$, and $3633_1$ (e.g., arranged in a row).

Deck $3605_2$ can include memory cells $3610_2$, $3611_2$, $3612_2$, and $3613_2$ (e.g., arranged in a row), memory cells $3620_2$, $3621_2$, $3622_2$, and $3623_2$ (e.g., arranged in a row), and memory cells $3630_2$, $3631_2$, $3632_2$, and $3633_2$ (e.g., arranged in a row).

Deck $3605_3$ can include memory cells $3610_3$, $3611_3$, $3612_3$, and $3613_3$ (e.g., arranged in a row), memory cells $3620_3$, $3621_3$, $3622_3$, and $3623_3$ (e.g., arranged in a row), and memory cells $3630_3$, $3631_3$, $3632_3$, and $3633_3$ (e.g., arranged in a row).

As shown in FIG. 36A, decks $3605_0$, $3605_1$, $3605_2$, and $3605_3$ can be located (e.g., formed vertically in the Z-direction) on levels (e.g., portions) 3650, 3651, 3652, and 3653, respectively, of memory device 3600. The arrangement of decks $3605_0$, $3605_1$, $3605_2$, and $3605_3$ forms a 3-dimensional (3-D) structure of memory cells of memory device 3600 in that different levels of the memory cells of memory device 3600 can be located (e.g., formed) in different levels (e.g., different vertical portions) 3650, 3651, 3652, and 3653 of memory device 3600. Decks $3605_0$, $3605_1$, $3605_2$, and $3605_3$ can be formed one deck at a time. For example, decks $3605_0$, $3605_1$, $3605_2$, and $3605_3$ can be formed sequentially in the order of decks $3605_0$, $3605_1$, $3605_2$, and $3605_3$ (e.g., deck $3605_1$ is formed first and deck $3605_3$ is formed last). In this example, the memory cell of one deck (e.g., deck $3605_1$) can be formed either after formation of the memory cells of another deck (e.g., deck $3605_0$) or before formation of the memory cells of another deck (e.g., deck $3605_2$). Alternatively, decks $3605_0$, $3605_1$, $3605_2$, and $3605_3$ can be formed concurrently (e.g., simultaneously), such that the memory cells of decks $3605_0$, $3605_1$, $3605_2$, and $3605_3$ can be concurrently formed. For example, the memory cells in levels 3650, 3651, 3652, and 3653 of memory device 3600 can be concurrently formed.

The structures of the memory cells of each of decks $3605_0$, $3605_1$, $3605_2$, and $3605_3$ can include the structures of the memory cells described above with reference to FIG. 1 through FIG. 35. For example, the structures of the of the memory cells of decks $3605_0$, $3605_1$, $3605_2$, and $3605_3$ can include the structure of the memory cells of memory devices 600 and 3100.

Memory device 3600 can include data lines (e.g., bit lines) and access lines (e.g., word lines) to access the memory cells of decks $3605_0$, $3605_1$, $3605_2$, and $3605_3$. For simplicity, data lines and access lines of memory cells are omitted from FIG. 36A. However, the data lines and access lines of memory device 3600 can be similar to the data lines and access lines, respectively, of the memory devices described above with reference to FIG. 1 through FIG. 35.

FIG. 36A shows memory device 3600 including four decks (e.g., $3605_0$, $3605_1$, $3605_2$, and $3605_3$) as an example. However, the number of decks can be different from four. FIG. 36A shows each of decks $3605_0$, $3605_1$, $3605_2$, and $3605_3$ including one level (e.g., layer) of memory cells as an example. However, at least one of the decks (e.g., one or more of decks $3605_0$, $3605_1$, $3605_2$, and $3605_3$) can have two (or more) levels of memory cells. FIG. 36A shows an example where each of decks $3605_0$, $3605_1$, $3605_2$, and $3605_3$ includes four memory cells (e.g., in a row) in the X-direction and three memory cells (e.g., in a column) in the Y-direction. However, the number of memory cells in a row, in a column, or both, can vary.

The illustrations of apparatuses (e.g., memory devices 100, 200, 500, 600, 3100, and 3600) and methods (e.g., operations of memory devices 100, 200, and 500 and methods of forming memory devices 600 and 3100) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, 500, 600, 3100, and 3600) or a system (e.g., an electronic item that can include any of memory devices 100, 200, 500, 600, 3100, and 3600).

Any of the components described above with reference to FIG. 1 through FIG. 35 can be implemented in a number of ways, including simulation via software. Thus, apparatuses (e.g., memory devices 100, 200, 500, 600, 3100, and 3600) or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The memory devices (e.g., memory devices 100, 200, 500, 600, 3100, and 3600) described herein may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 35 include apparatuses and methods of forming the apparatuses. One of the apparatuses includes One of the apparatus includes a memory cell having a first transistor and a second transistor located over a substrate. The first transistor includes a channel region. The second transistor includes a channel region located over the channel region of the first transistor and electrically separated from the first channel region. The memory cell includes a memory element located on at least one side of the channel region of the first transistor. The memory element is electrically separated from the channel region of the first transistor, and electrically coupled to the channel of the second transistor. Other embodiments including additional apparatuses and methods are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical electrical process, and other changes. Examples merely typify possible variations. Portions and features of some embodiments may be included in, or substituted for, those of others. Many other embodiments will be apparent to those of skill in the art upon reading and understanding the above description.

What is claimed is:

1. A method comprising:
   forming a first transistor of a memory cell over a substrate, including forming a channel region of the first transistor;
   forming a memory element of the memory cell on at least one side of the channel region of the first transistor, such that the memory element is separated from the channel region of the first transistor by a dielectric material; and
   forming a second transistor of the memory cell, including forming a channel region of the second transistor, such that the channel region of the second transistor is coupled to the memory element.

2. The method of claim 1, wherein forming the memory element includes:
   forming a first portion of the memory element on a first side of the channel region of the first transistor; and
   forming a second portion of the memory element on a second side of the channel region of the first transistor.

3. The method of claim 1, further comprising:
forming a conductive coupling, such that the conductive coupling contacts the channel region of the second transistor and the memory element.

4. The method of claim 3, wherein forming the conductive coupling includes:
forming a first portion of the conductive coupling, such that the first portion of the conductive coupling contacts the channel region of the second transistor and contacts a first portion of the memory element; and
forming a second portion of the conductive coupling, such that the second portion of the conductive coupling contacts the channel region of the second transistor and contacts a second portion of the memory element.

5. The method of claim 1, wherein the memory element includes poly silicon.

6. The method of claim 1, wherein the channel region of the first transistor includes polysilicon.

7. The method of claim 1, wherein the second material includes an oxide material.

8. The method of claim 1, wherein the second material includes at least one of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide (TiOx), zinc oxide nitride ($Zn_xO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), and indium gallium silicon oxide (InGaSiO).

9. The method of claim 1, further comprising:
forming a first data line between the channel region of the first transistor and the substrate; and
forming a second data line over the channel region of the first transistor, such that the channel region of the first transistor contacts the first and second data lines.

10. The method of claim 9, further comprising:
forming a third data line over the channel region of the second transistor and contacting the second material.

11. A method comprising:
forming a memory cell over a substrate, including forming a first transistor of the memory cell over a substrate and forming a second transistor of the memory cell over the first transistor, the first transistor including a first material, and the second transistor including a second material formed over the first material of the first transistor;
forming a first conductive line having a portion adjacent a first side of the first material;
forming a first additional conductive line having a portion adjacent a second side of the first material;
forming a second conductive line having a portion adjacent a first side of the second material; and
forming a second additional conductive line having a portion adjacent a second side of the second material.

12. The method of claim 11, further comprising:
forming a third conductive line over the substrate and between the first transistor and the substrate, wherein the third conductive line has length in a first direction, and each of the first, first additional, second, and second additional conductive lines has a length in a second direction.

13. The method of claim 11, wherein forming the memory cell includes forming a memory element of the memory cell, wherein the first and second sides of the first material are opposite from each other in a first direction, the memory element includes first portion adjacent a third side of the first material, and a second portion adjacent a fourth side of the first material, and the third and fourth sides of the first material are opposite from each other in a second direction.

14. The method of claim 11, wherein the second material includes gallium phosphide (GaP).

15. The method of claim 11, wherein the first material includes one of poly silicon and metal.

16. The method of claim 11, further comprising:
forming a first conductive connection, such that the first conductive connection is coupled to the first conductive line and the first additional conductive line; and
forming a second conductive connection, such that the second conductive connection is coupled to the second conductive line and the second additional conductive line.

17. The method of claim 11, further comprising:
forming a third conductive connection, such that the third conductive connection is coupled to the first, first additional, second, and second additional conductive lines.

18. A method comprising:
forming a conductive region over substrate;
forming a first memory cell over the conductive region, including forming a first transistor of the first memory cell and forming a second transistor of the first cell over the first transistor of the first memory cell;
forming a second memory cell over the conductive region, including forming a first transistor of the second memory cell and forming a second transistor of the second memory cell over the first transistor of second memory cell;
forming a third memory cell over the conductive region, including forming a first transistor of the third memory cell and forming a second transistor of the third memory cell over the first transistor of third memory cell;
forming a first conductive structure between the first and second memory cells, the first conductive structure contacting the conductive region; and
forming a second conductive structure between the second and third memory cells, the second conductive structure contacting the conductive region.

19. The method of claim 18, further comprising:
forming a memory element of each of the first, second, and third memory cells, such that:
the first conductive structure is adjacent a first portion of the memory element of the first memory cell and adjacent a portion of the memory element of the second memory cell; and
the second conductive structure is adjacent a second portion of the memory element of the first memory cell and adjacent a portion of the memory element of the third memory cell.

20. The method of claim 18, further comprising:
forming a first conductive line, such that the first conductive line includes:
a first portion adjacent a side of the first transistor of the first memory cell;
a second portion adjacent a side of the first transistor of the second memory cell; and
a third portion adjacent a side of the first transistor of the third memory;

forming a second conductive line, such that the second conductive line includes:
a first portion adjacent a side of the second transistor of the first memory cell;
a second portion adjacent a side of the second transistor of the second memory cell; and
a third portion adjacent a side of the second transistor of the third memory cell.

21. An apparatus comprising:
a first transistor of a memory cell located over a substrate, the first transistor including a first region;
a second transistor of the memory cell, the second transistor including a second region located over the first region of the first transistor and separated from the first region by a dielectric material;
a memory element of the memory cell located on at least one side of the first region of the first transistor and separated from the first region by a second dielectric material; and
a conductive coupling contacting the second region and the memory element.

22. The apparatus of claim 21, wherein first region includes a piece of semiconductor material.

23. The apparatus of claim 21, wherein the first region includes a piece of metal.

24. The apparatus of claim 21, wherein the memory element includes polysilicon.

25. The apparatus of claim 21, wherein the conductive coupling includes metal.

26. The apparatus of claim 21, wherein the second region includes a piece of oxide material.

27. The apparatus of claim 21, wherein the second region includes a piece of oxide material, and the memory element includes a piece of polysilicon contacting the piece of oxide material.

28. The apparatus of claim 21, wherein the second region includes at least one of zinc tin oxide (ZTO), indium zinc oxide (IZO), zinc oxide (ZnOx), indium gallium zinc oxide (IGZO), indium gallium silicon oxide (IGSO), indium oxide (InOx, In2O3), tin oxide (SnO2), titanium oxide (TiOx), zinc oxide nitride (ZnxOyNz), magnesium zinc oxide (MgxZnyOz), indium zinc oxide (InxZnyOz), indium gallium zinc oxide (InxGayZnzOa), zirconium indium zinc oxide (ZrxInyZnzOa), hafnium indium zinc oxide (HfxInyZnzOa), tin indium zinc oxide (SnxInyZnzOa), aluminum tin indium zinc oxide (AlxSnyInzZnaOd), silicon indium zinc oxide (SixInyZnzOa), zinc tin oxide (ZnxSnyOz), aluminum zinc tin oxide (AlxZnySnzOa), gallium zinc tin oxide (GaxZnySnzOa), zirconium zinc tin oxide (ZrxZnySnzOa), indium gallium silicon oxide (InGaSiO), and gallium phosphide (GaP).

29. The apparatus of claim 21, further comprising:
a first data line contacting the first region of the first transistor;
a second data line contacting the first region of the first transistor; and
a third data line contacting the second region of the first transistor, wherein the first, second, and third conductive regions are separated from each other.

30. The apparatus of claim 29, further comprising:
a first access line adjacent the first region of the first transistor; and
a second access line adjacent the second region of the second transistor.

31. An apparatus comprising:
a conductive region over substrate;
a first memory cell located over the conductive region, the first memory cell including a first transistor and a second transistor located over the first transistor;
a second memory cell located over the conductive region, the second memory cell including a first transistor and a second transistor located over the first transistor of second memory cell;
a third memory cell located over the conductive region, the third memory cell including a first transistor a second transistor located over the first transistor of third memory cell;
a first conductive structure between the first and second memory cells, the first conductive structure contacting the conductive region; and
a second conductive structure between the second and third memory cells, the second conductive structure contacting the conductive region.

32. The apparatus of claim 31, wherein each of the first, second, and third memory cells includes a memory element, and wherein:
the first conductive structure is between the memory element of the first memory cell and the memory element of the second memory cell; and
the second conductive structure is between the memory element of the second memory cell and the memory element of the third memory cell.

33. The apparatus of claim 31, wherein the second transistors of each of the first, second, and third memory cells includes a channel region coupled to the memory element of a respective memory cell of the first, second, and third memory cells.

34. The apparatus of claim 33, wherein the first transistors of each of the first, second, and third memory cells includes a channel region, and the memory element of each of the first, second, and third memory cells includes:
a first portion adjacent a first side of the channel region of a respective memory cell of the first, second, and third memory cells, and
a second portion adjacent a second side of the channel region of a respective memory cell of the first, second, and third memory cells.

35. The apparatus of claim 34, wherein the channel region of the first transistor and the channel region of the second transistor of each of each of the first, second, and third memory cells have different materials.

* * * * *